(12) United States Patent
Yoshimura et al.

(10) Patent No.: US 6,215,585 B1
(45) Date of Patent: Apr. 10, 2001

(54) OPTICAL CIRCUIT SYSTEM AND COMPONENTS OF SAME TECHNICAL FIELD

(75) Inventors: Tetsuzo Yoshimura; Takeshi Ishitsuka; Katsusada Motoyoshi; Satoshi Tatsuura; Wataru Sotoyama; Koji Tsukamoto, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/019,564

(22) Filed: Feb. 6, 1998

Related U.S. Application Data

(62) Division of application No. 08/240,739, filed as application No. PCT/JP93/01301 on Sep. 10, 1993, now Pat. No. 5,757,989.

(30) Foreign Application Priority Data

Sep. 10, 1992 (JP) .................................................. 4-241954
Sep. 18, 1992 (JP) .................................................. 4-249627

(51) Int. Cl.$^7$ ............................. H01S 3/00; G02F 1/295
(52) U.S. Cl. ................................ 359/344; 385/9; 385/14
(58) Field of Search .................................. 354/346, 333, 354/341, 344; 385/9, 14

(56) References Cited

U.S. PATENT DOCUMENTS

| 4,037,172 | 7/1977 | Filipescu et al. | 331/94.5 E |
| 4,114,257 | 9/1978 | Bellavance | 29/572 |
| 4,712,075 | * 12/1987 | Snitzer | 330/413 |

(List continued on next page.)

FOREIGN PATENT DOCUMENTS

| 0 193 193 | 7/1977 | (EP) . |
| 0 180 861 | 5/1986 | (EP) . |
| 0 365 496 | 4/1990 | (EP) . |
| 2 245 984 | 1/1992 | (GB) . |

(List continued on next page.)

OTHER PUBLICATIONS

*Japanese Journal of Applied Physics*, Part 2, No. 8B, Aug. 15, 1992, Sotoyama et al., "Directional–Coupled Optical Switch between Stacked Waveguide Layers Using Electro–Optic Polymer", pp. L1180–L1181.

*Optical and Quantum Electronics*, vol. 24, No. 2, Apr. 1992, XP 000431613, Mackenzie et al., "Optical interconnect based on fibre bus", pp. S491–S504.

*IBM Technical Disclosure Bulletin*, vol. 32, No. 3A, Aug. 1989, "Optical Wiring Using Holographic Beam Deflection", pp. 98–103.

*Patent Abstracts of Japan*, vol. 10, No. 341 (P–517), Nov. 18, 1986 & JP–A–61 144608 (Omron Tateisi Electronics Co), Jul. 2, 1986.

*Patent Abstracts of Japan*, vol. 16, No. 163 (P–1341), Apr. 21, 1992 & JP–A–04 012333 (Nippon Telegr & Teleph Corp), Jan, 16, 1992.

(List continued on next page.)

*Primary Examiner*—Mark Hellner
(74) *Attorney, Agent, or Firm*—Staas & Halsey LLP

(57) ABSTRACT

An optical circuit system which takes out at least a portion of the light of a light power source corresponding to at least one type of output voltage of an IC, board, multichip module, electronic element, or opto-electronic element and produces an optical signal, wherein the light power source is an optical waveguide into which light has been introduced, a waveguide laser, or a waveguide optical amplifier, light reflecting portions are provided at its ends and/or middle, a signal transmission waveguide is formed in contact with the side surface and/or top or bottom surface of the optical waveguide or in proximity to the same at a certain distance, and the optical signal corresponding to at least one type of output voltage of the IC, board, multichip module, electronic element, or opto-electronic element is made to propagate to the signal transmission waveguide, which optical circuit system is rich in flexibility and enables complicated optical interconnections to be handled, and components of the same.

14 Claims, 58 Drawing Sheets

U.S. PATENT DOCUMENTS

| | | | |
|---|---|---|---|
| 4,734,380 | 3/1988 | Tsang | 372/44 |
| 4,828,362 | 5/1989 | Skinner et al. | 350/320 |
| 4,887,255 | 12/1989 | Handa et al. | 385/14 X |
| 4,903,341 | 2/1990 | Rice | 455/619 |
| 4,938,553 | 7/1990 | Maerz et al. | 385/14 X |
| 4,973,121 | 11/1990 | Brophy et al. | 350/96.14 |
| 5,142,660 | 8/1992 | Chang et al. | 385/10 |
| 5,226,055 | 7/1993 | Downey et al. | 385/14 X |
| 5,249,245 | 9/1993 | Lebby et al. | 385/14 X |
| 5,253,099 | 10/1993 | Heildemann | 372/6 X |
| 5,282,080 * | 1/1994 | Scifres et al. | 359/344 |
| 5,321,498 | 6/1994 | Song et al. | 385/14 X |
| 5,373,570 | 12/1994 | Menigaux et al. | 385/14 X |
| 5,436,991 | 7/1995 | Sunagawa et al. | 385/14 X |
| 5,452,118 | 9/1995 | Maruska | 359/191 |
| 5,574,806 | 11/1996 | Kragl et al. | 385/14 |

FOREIGN PATENT DOCUMENTS

| | | |
|---|---|---|
| 52-089053 | 7/1977 | (JP) . |
| 53-050464 | 5/1978 | (JP) . |
| 55-133409 | 9/1980 | (JP) . |
| 55-161201 | 12/1980 | (JP) . |
| 58-061694 | 4/1983 | (JP) . |
| 58-187912 | 11/1983 | (JP) . |
| 60-112023 | 6/1985 | (JP) . |
| 61-018933 | 1/1986 | (JP) . |
| 61-121014 | 6/1986 | (JP) . |
| 61-501669 | 8/1986 | (JP) . |
| 62-170932 | 7/1987 | (JP) . |
| 63-071836 | 4/1988 | (JP) . |
| 1-046734 | 2/1989 | (JP) . |
| 2-221937 | 9/1990 | (JP) . |
| 3-011319 | 1/1991 | (JP) . |
| 4-012333 | 1/1992 | (JP) . |
| 4-162022 | 6/1992 | (JP) . |
| 4-212131 | 8/1992 | (JP) . |
| 4-213716 | 8/1992 | (JP) . |
| 92/14176 | 8/1992 | (WO) . |

OTHER PUBLICATIONS

*Patent Abstracts of Japan*, vol. 10, No. 348 (P–519), Nov. 22, 1986 & JP–A–61 148405 (Omron Tateisi Electronics Co), Jul. 7, 1986.

*Patent Abstracts of Japan*, vol. 13, No. 159 (P–858), Apr. 18, 1989 & JP–A–63 318529 (Matsushita Electric Ind Co Ltd), Dec. 27, 1988.

* cited by examiner

MIRROR OR GRATING

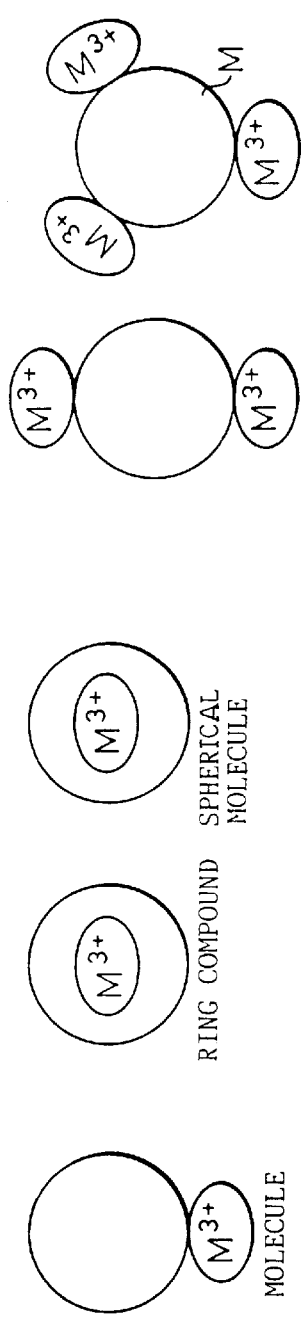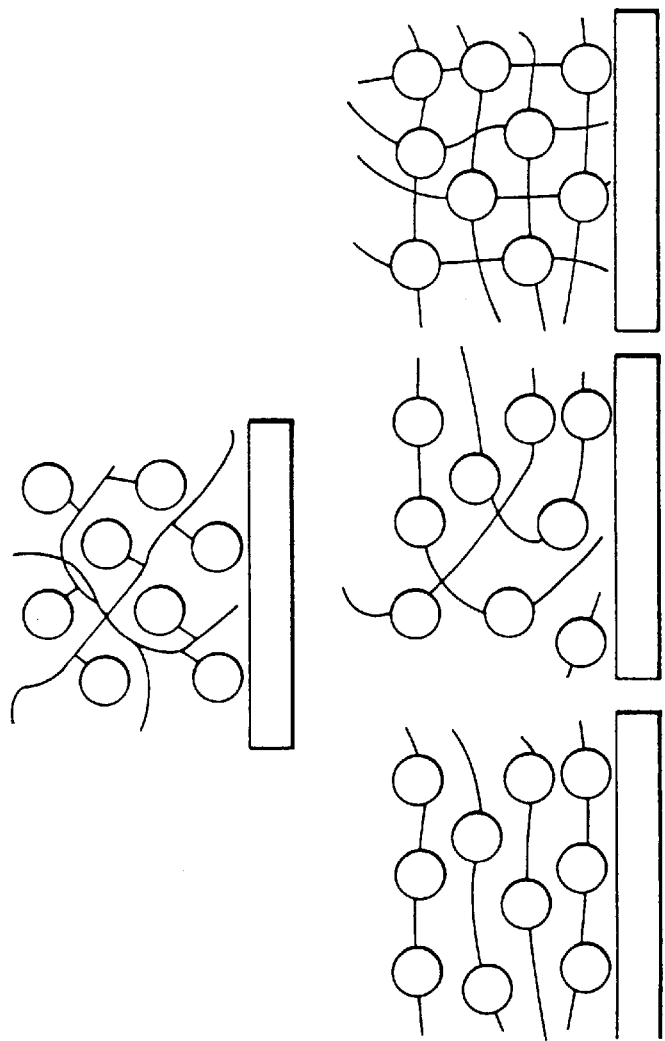
Fig.18(A)
Fig.18(B)
Fig.18(C)

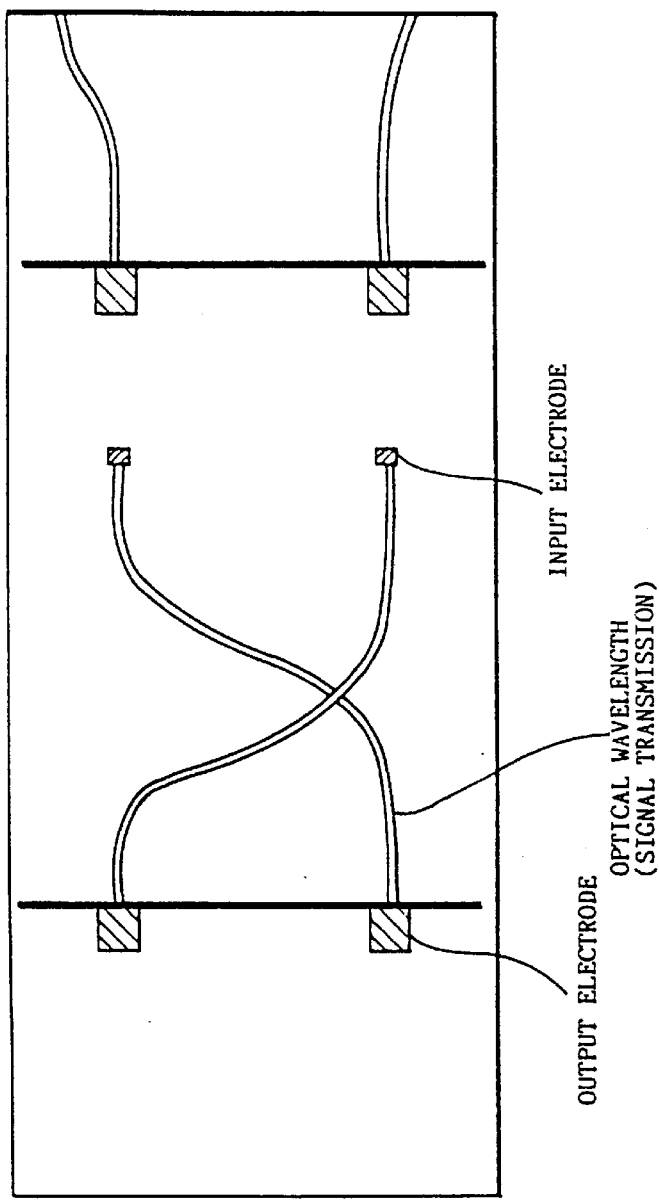
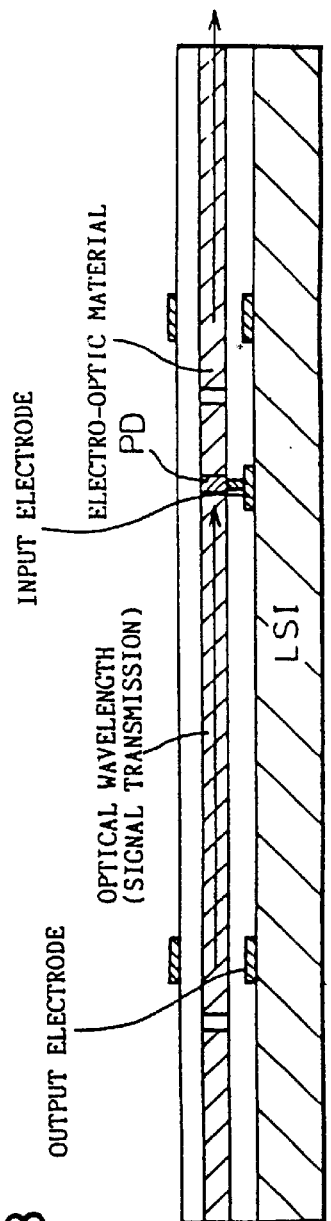

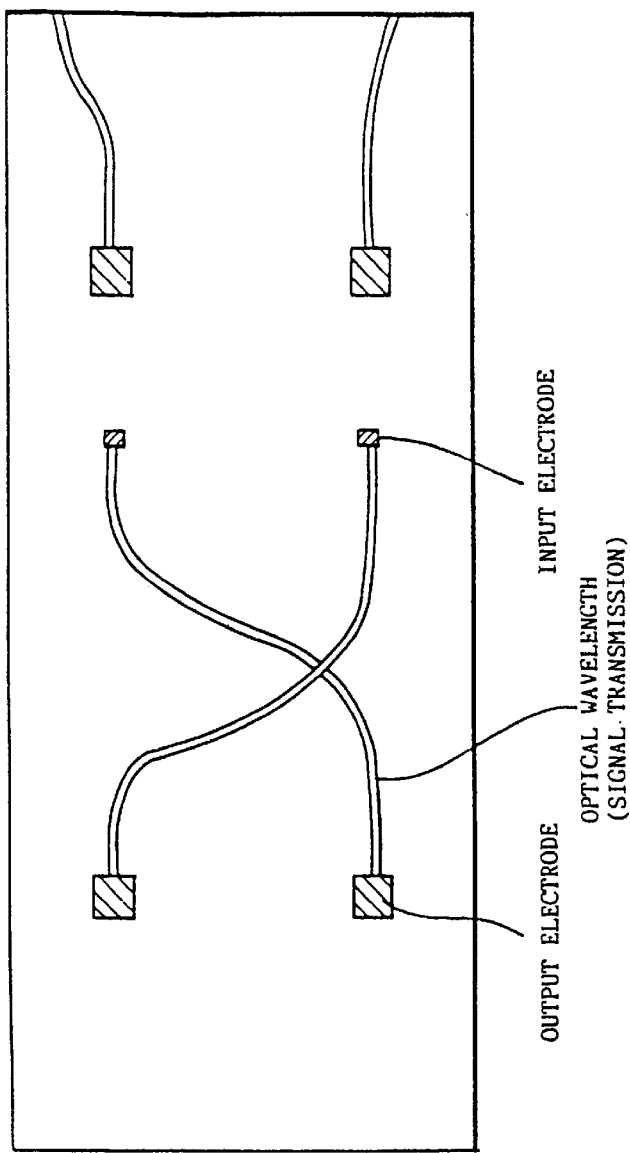
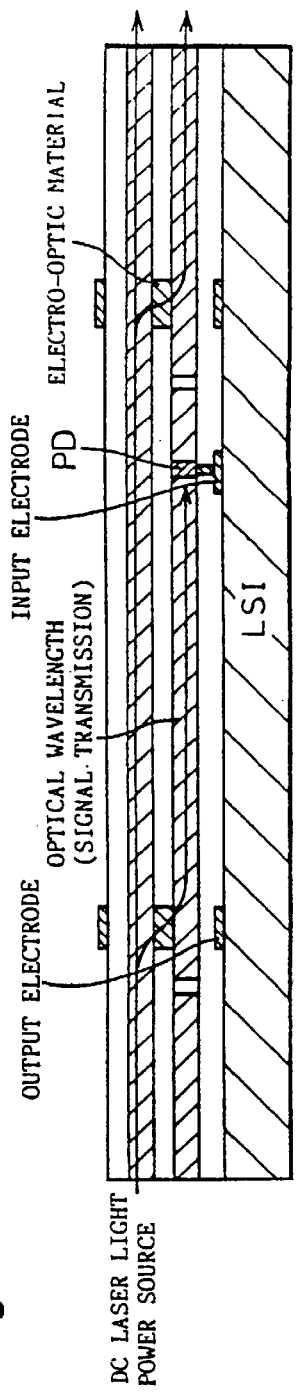
Fig. 23A
Fig. 23B

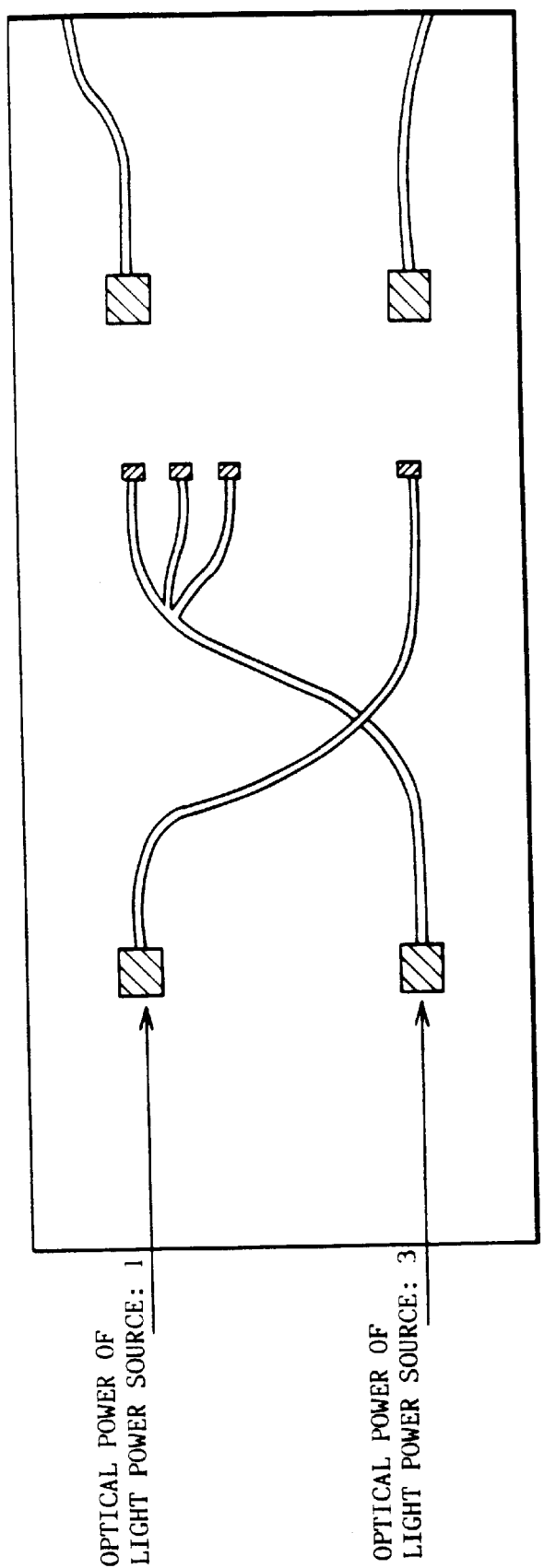

LD

Fig.57(a)           Fig.57(b)
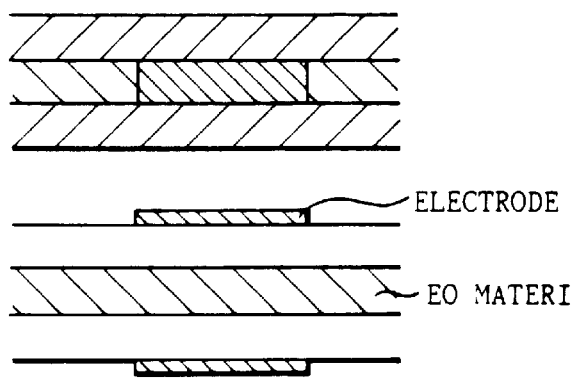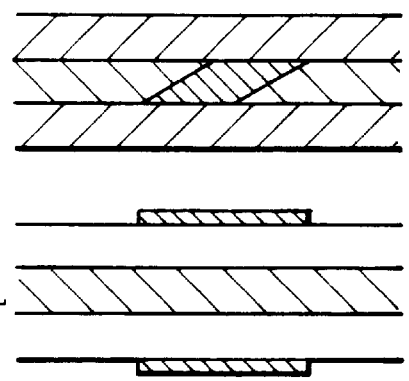
ELECTRODE
EO MATERIAL
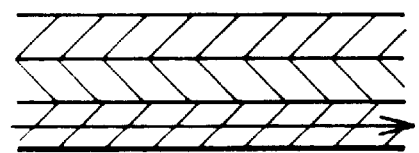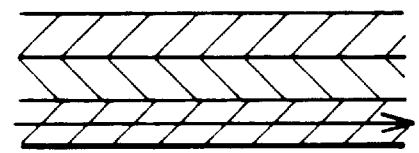
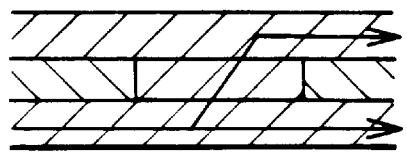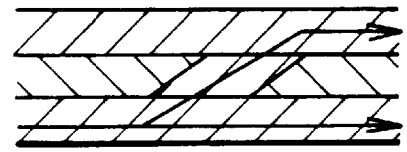

OPTICAL CIRCUIT SYSTEM AND COMPONENTS OF SAME TECHNICAL FIELD

This Application is a Divisional application of U.S. Ser. No. 08/240,739, (filed on Aug. 15, 1994 now U.S. Pat. No. 5,757,989), which is based on and claims priority of PCT/JP93/01301 (filed on Sep. 10, 1993) which is based on and claims priority of JP 4-241954 (filed on Sep. 10, 1992) and JP 4-249627 (filed on Sep. 18, 1992).

BACKGROUND OF THE INVENTION

1. Field of the Invention

The present invention relates to an optical circuit system (for example, an optical circuit, optical LSI, optical circuit substrate, backplane optical circuit) which can produce an optical signal for propagation along an optical circuit composed mainly of an optical waveguide and optical fiber, more particularly which can produce an optical signal with a small fluctuation in intensity by a plurality of electrical elements without the use of separate electro-optic conversion elements and to components of the same (for example, optical tabs, optical switches, optical couplers, waveguide optical amplifiers, waveguide optical lasers, and optical couplers).

The optical circuit system and components according to the present invention are suitable for use in optical information fields such as optical communications and optical interconnection.

2. Description of Related Art

Optical circuits, as is well known in the art, play an important role in various optical information processing systems such as optical exchanges in optical communication. We have proposed various systems regarding optical circuits for optical interconnections wherein we form optical circuits by coupling IC's, multichip modules, boards, etc. by optical waveguides in optical circuits using optical waveguides and optical fibers and transmit signals over the same. According to these proposals, the optical circuit is primarily formed by optical waveguides. In an optical circuit comprised primarily of optical waveguides, however, there is the problem of attenuation of the intensity of the signal light along with the propagation and transmission of light.

Further, proposals have been made of various systems for generating optical signals from electrical signals. For example, a proposal has been made of the method of guiding non-signal light generated at a light source through an optical waveguide and generating signal light having intensity modulation by a voltage-controlled type optical branching filter formed by an electro-optic material etc. In these methods, however, when generating a plurality of signal lights from a single waveguide, there is the problem of the difficulty in obtaining signal light with a fixed intensity.

On the other hand, as an element for amplifying the attenuating signal light, in the field of optical communications, study has been made of optical amplification fibers using optical fibers. While these are effective as elements for amplifying the signal light propagated through an optical fiber, there is the problem that they are not suitable in terms of integration or compatibility as elements for amplifying the signal light propagated through an optical waveguide.

On the other hand, waveguide optical amplifiers and waveguide lasers are applied for the above-mentioned optical circuits and are promising in themselves as the important components in various types of optical systems.

That is, optical fiber amplifiers comprising optical fibers doped with rare earth ions are used for long distance optical communications. To use waveguides in the long distance optical communications and to make optical systems more compact is effective for reduction of the size of optical systems. In the case of a waveguide, however, since the optical path becomes shorter, it becomes necessary to increase the amount of doping depending on the shortness of the path. Until now, attempts have been made to realize a waveguide amplifier of a polymer by doping the polymer with molecules containing a rare earth element or with rare earth ions in large amounts, but there were problems of reabsorption of the light and of light extinction due to the large amount of doping of rare earth-containing molecules or rare earth ions. Similar problems also arose in a glass-type waveguide.

On the other hand, along with the higher speeds and greater miniaturization of LSI's, the problem of wiring delay and heat generation have arisen. In view of this, numerous attempts have been made to introduce optical wiring for the wiring inside the LSI's, between LSI's, and between boards (MCM's). In a system where a large number of light emitting elements are made in a conventional chip and signals are sent by turning these on and off, there have been various difficult problems such as the need to fabricate the micro LD's on the Si wafer by a heteroepitaxy method, to finely adjust the position of the optical couplers, etc. As opposed to this, there is a method of mounting LD's and PD's in a hybrid fashion, but also in this case, the problem has remained of a difficulty in improving the efficiency of optical couplers such as the need for fine positional adjustment.

Furthermore, general problems of optical wiring include the fact that the amount of light reaching the light receiving element ends up changing depending on the number of fanouts or that there is no simple method of formation of waveguides in the longitudinal direction, and therefore, there are the problems that, when introducing light into the substrate, the majority is introduced from the lateral direction or the degree of freedom of introduction of light is small and when connecting a spatial beam (i.e., a beam propagating through space), there is the problem that there is no effective means of beam control. It should be noted that a hologram would be effective, but until now, holograms have been flat, and therefore, there was the problem that noise became terrible, when trying to control a large number of beams.

On the other hand, optical switches play an important role in various optical systems such as optical interconnections in computers and optical exchanges. As such optical switches, there have been known directional coupler systems in the past and intersection-type full-reflection type optical switches. Directional couplers, however, are sensitive to fluctuations in dimensions and temperature and in particular are difficult to use for matrix optical switches comprised of optical circuit substrates with large temperature fluctuations or large numbers of optical switches integrated together. Further, there is the problem that it is difficult to operate them with multimode waveguides. On the other hand, intersection-type full reflection type optical switches have the problem of residual crosstalk at the cross portion. Also, these two types of optical switches are limited in function to switching inside waveguides and therefore there was the problem that it was not possible to the switch to space.

SUMMARY OF THE INVENTION

Accordingly, the objects of the present invention are to eliminate the above-mentioned problems in the conventional optical circuit system and to provide an optical circuit which can produce a plurality of optical signals from one light source, without the use of separate electro-optic conversion elements and with little fluctuation of intensity.

Another object of the present invention is to improve the structure of an optical circuit and a waveguide optical amplifier, and to provide a novel waveguide optical amplifier material.

A further object of the present invention is to provide an optical LSI, an optical circuit substrate, and a backplane optical circuit substrate which do not require a large number of light emitting elements and fine coupling between these and the transmission path wherein at least part of the electro-optic elements, light receiving elements, waveguides, and the like are incorporated monolithically into the LSI, optical circuit substrate, and backplane optical circuit substrate.

A still further object of the present invention, is to provide a system of transmission of uniform optical signals wherein the amount of the supplied light is adjusted in accordance with the number of fanouts.

A still further object of the present invention is to provide a longitudinal (slanted) direction waveguide extending in the direction of film thickness by growing a polymer film with a different orientation from the surroundings on an underlayer pattern film or forming a CVD growth film etc. on a step difference and a method of optical coupling using the same.

A still further object of the present invention is to provide an efficient spatial coupling system by using a hologram material for the spatial connection medium and forming a hologram, waveguide, and distribution of index of refraction in the medium.

A still further object of the present invention is to provide a stable electro-optic (EO) conversion device by using a reflection type EO optical switch.

A still further object of the present invention further is to provide an optical circuit substrate which enables optical connection just by mounting an LSI on a circuit substrate by giving a light emitting function and/or light receiving function to the circuit substrate side.

A still further object of the present invention is to provide an optical switch which enables switching of the optical path between waveguides with no mutual interaction.

In accordance with the present invention, there is provided an optical circuit including an optical waveguide which transmits a light I carrying signals and information, the optical circuit being comprised of a light source A which generates a light II of a shorter wavelength than the light I, a light source B which is provided at its two ends with opposing reflecting films, mirrors, or diffraction gratings and generates the light I by the light II, and at least one optical switch or optical branching filter which switches to the optical waveguide or branches the light I generated by the light source B according to an electrical signal.

In accordance with the present invention, there is also provided an optical circuit including an optical waveguide which transmits a light I carrying signals and information, the optical circuit being comprised of a light source A which generates a light II of a shorter wavelength than the light I, a light source B which is provided at its two ends with opposing reflecting films, mirrors, or diffraction gratings and generates a light I by the light II, and at least one optical switch or optical branching filter which switches to the optical waveguide or branches the light I generated by the light source B according to an electrical signal and by a light III carrying the same signal having the same wavelength or the information at the light II and the light I and carrying signals and information being coupled or irradiated to the light source B.

In accordance with the present invention, there is further provided an optical circuit which takes out at least a portion of the light of a light power source corresponding to at least one type of output voltage of an IC, board, multichip module, electronic element, or opto-electronic element and generates an optical signal, wherein the light source is an optical waveguide into which light is introduced, light reflecting portions are provided at its ends and/or middle, a signal transmission waveguide is formed in contact with the side surface and/or top or bottom surface of an optical waveguide or in proximity to the same at a certain distance, and the optical signal corresponding to at least one type of output voltage of the IC, board, multichip module, electronic element, or opto-electronic element is made to propagate to the signal transmission waveguide.

BRIEF DESCRIPTION OF DRAWINGS

The present invention will be explained in further detail referring to the appended drawings.

FIGS. 18(A), 18(B) and 18(C) give views schematically showing an organic earth doped material.

FIG. 21 is a view showing an example of an optical LSI.

FIG. 23 is a view showing a pickup system (formed so that the PD cuts across the waveguide) provided with a light power source (or a photoelectric source) using a waveguide laser and amplifier comprised of a rare earth ion doped glass, polymer, or ceramic.

FIG. 29 is a view showing an example of the change of the light supplying power in accordance with the fanouts of the signal in the optical LSI.

FIGS. 57(a) and 57(b) give views showing an example (a) of application of voltage to the cladding and an example (b) of optical switching with a window formed at a slant.

DESCRIPTION OF THE PREFERRED EMBODIMENTS

Figure 1:
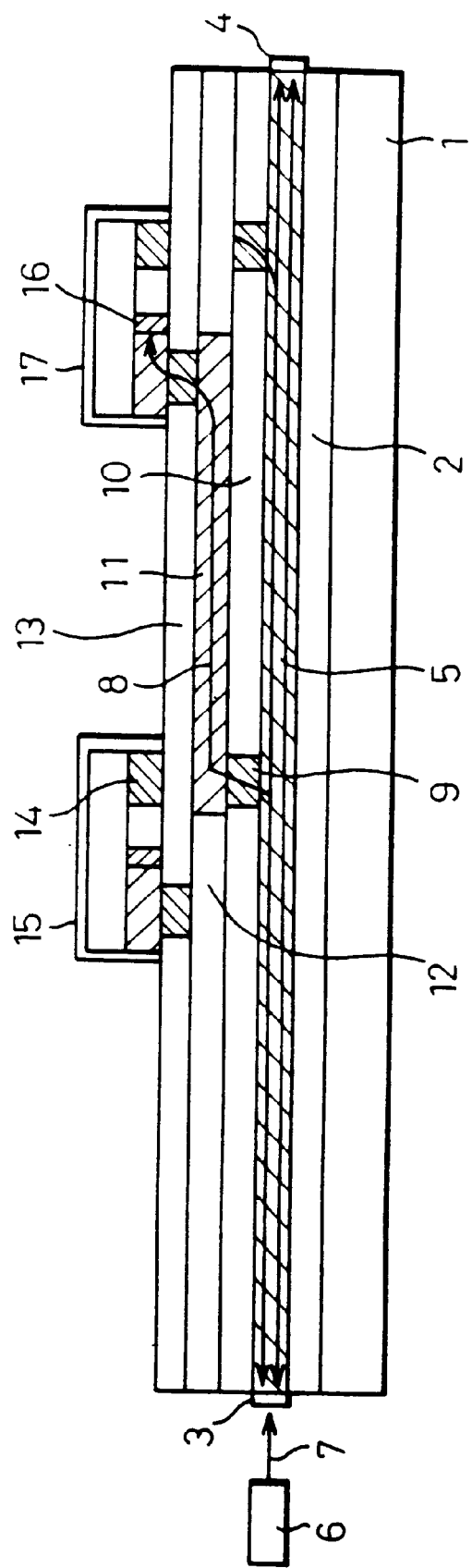
FIG. 1 is a view showing an embodiment of the structure of the optical circuit according to one aspect of the present invention.

According to a first aspect of the present invention, there is provided an optical circuit including an optical waveguide which transmits a light I carrying signals and information, the optical circuit being comprised of a light source A which generates a light II of a shorter wavelength than the light I, a light source B which is provided at its two ends with opposing reflecting films, mirrors, or diffraction gratings and generates a light I by the light II, and at least one optical switch or optical branching filter which switches to the optical waveguide or branches the light I generated by the light source B according to an electrical signal.

According to the present invention, there is further provided an optical circuit including an optical waveguide which transmits a light I carrying signals and information, the optical circuit being comprised of a light source A which generates a light II of a shorter wavelength than the light I, a light source B which is provided at its two ends with opposing reflecting films, mirrors, or diffraction gratings and generates a light I by the light II, and at least one optical switch or optical branching filter which switches to the optical waveguide or branches the light I generated by the light source B according to an electrical signal and by a light III of the same wavelength as the light II and light I and carrying signals and information being coupled or irradiated to the light source B.

In the above-mentioned two optical circuits, the light source B is preferably comprised of a high index of refraction region and a low index of refraction region contacting each other. Provision is made of opposing reflecting films, mirrors, or diffraction gratings at the two ends of the high index of refraction region and the light II or the light II and the light I generated by the light source C are coupled or irradiated at the low index of refraction region. The optical switch or optical branching filter are preferably an optical switch or optical branching filter which are formed by a material having an electro-optic effect, undergo a change in the index of refraction upon application of voltage, and thus switch or branch part of the light I of the light source B.

The optical switch or optical branching filter further preferably is formed by a material having electrodes with a cyclic structure and having an electro-optic effect and thereby forms a cyclic pattern of modulation of the index of refraction upon application of voltage to the electrodes. They may be made an optical switch or optical branching filter which switch or branch part of the light I of the light source B.

It should be noted that in the present invention, the light source A is disposed on the same substrate as the light source B and the light II produced by the light source A is coupled or irradiated at the light source B using as a medium optical waveguide, optical fiber, or space or else the light source A is disposed on a different substrate as the light source B and the light II produced by the light source A is coupled or irradiated at the light source B using as a medium an optical waveguide, optical fiber, or space.

According to the present invention, there is further provided an optical amplification optical circuit including an optical waveguide for transmitting light III having intensity modulation, the optical circuit comprised of a light source for generating a light IV of a wavelength shorter than the light III, an optical waveguide I for amplifying the intensity modulation of the light III by a light IV, an optical coupler I for coupling the light III to the optical waveguide I, an optical coupler II for coupling the light IV to the optical waveguide I, and a diffraction grating which diffracts the light III guided through the optical waveguide I.

According to the present invention, there is further provided an optical amplification optical circuit including a waveguide for transmitting light having intensity modulation, the optical circuit comprised of a light source for generating a light IV of a wavelength shorter than the light III, an optical waveguide I for deflecting the direction of progression of light by one or more diffraction gratings for diffracting at least the light III and for amplifying the intensity modulation of the light III by the light IV, an optical coupler I for coupling the light III to the optical waveguide I, an optical coupler II for coupling the light IV to the optical waveguide I, and an optical branching filter for branching the light III from the light guided in the optical waveguide I.

According to the present invention, there is further provided an optical amplification optical circuit including an optical waveguide for transmitting light III having intensity modulation, the optical circuit comprised of a light source for generating a light IV of a wavelength shorter than the light III, a waveguide I for amplifying the intensity modulation of the light III by the light IV, reflecting films, mirrors, or diffraction gratings for reflecting at least the light III and formed at the two ends of the waveguide I facing each other, an optical coupler I for coupling the light III to the waveguide I, an optical coupler II for coupling the light IV to the waveguide I, and a branching filter for branching the light III of the waveguide I.

According to the present invention, there is further provided an optical amplification optical circuit for transmitting light III having intensity modulation, the optical circuit comprised of a light source for generating a light IV of a wavelength shorter than the light III, a mirror I and mirror II or a reflecting film I and reflecting film II facing each other in parallel or substantially in parallel, and a block provided between the two mirrors for amplifying the intensity modulation of light III and by irradiating light IV to the block and irradiating the light III to the block in a direction wherein the light reciprocates at least once between the two mirrors.

According to the present invention, there is further provided an optical amplification optical circuit including a waveguide for transmitting light III having intensity modulation, the optical circuit comprised of a light source for generating a light IV of a wavelength shorter than the light III, a film or block provided connected to the waveguide, having an index of refraction lower than the guiding layer of the waveguide, and amplifying the intensity modulation of the light III by the light IV, and an optical coupler I for introducing the light IV to the waveguide.

According to the present invention, there is further provided an optical amplification optical circuit including a waveguide for transmitting light III having intensity modulation, the optical circuit comprised of a light source for generating a light IV of a wavelength shorter than the light III and a film or block provided connected to the waveguide, having an index of refraction lower than the guiding layer of the waveguide, and amplifying the intensity modulation of the light III by the light IV and by irradiating the light IV to the film or block.

In the first aspect of the present invention, first, light for producing an optical signal is produced in the substrate on which the electrical circuits are placed. Therefore, the light which is produced becomes used in parallel with the various electrical circuits, so it becomes possible for the plurality of electrical circuits to use this light and to produce a plurality of optical signals with little variation of intensity.

In accordance with the present invention, a waveguide is prepared by a material including a material causing population inversion on a substrate on which electrical circuits are placed. By forming reflecting films, mirrors, or reflecting diffraction gratings on the two ends, laser oscillation becomes possible, light can be generated, and the waveguide itself becomes a light source. If light causing a population inversion (light II) is introduced or irradiated to the waveguide, population inversion occurs, a dielectric discharge occurs, and constant light is generated. By branching this light as intensity modulated light by an electrical response type optical branching filter corresponding to the electrical elements, signal light is produced. It is also possible to introduce to the waveguide light having the same wavelength as the light produced by the waveguide. Further, the waveguide may be made a structure having at the periphery of the cladding a low index of refraction region having an index of refraction lower than the center high index of refraction region and an index of refraction higher than the cladding and may be constituted provided with reflecting films, mirrors, or reflecting diffraction gratings at the high index of refraction region. In this case, it is possible to introduce light into the waveguide from the low index of refraction region of the waveguide where no reflecting films, mirrors, or refracting diffraction gratings are provided at a high efficiency.

The electrical response type optical branching filter used in the present invention may be formed using for example an electro-optic material. By connecting to the light producing waveguide an electro-optic material having electrodes connecting with the signal ends of the electrical circuit, applying an electrical signal from the electrical circuit, and thereby changing the index of refraction of the electro-optic material, it is possible to obtain intensity modulated light modulated by an electrical signal. Note that the electrodes may be made a cyclic structure and a cyclic structure may be given to the index of refraction to branch light by diffraction.

As the material for the light producing waveguide used in the present invention, use may be made of any inorganic material or organic material. As examples of such an inorganic material, mention may be made of rare earth doped glasses, such as Er doped glass, Pr doped fluoride glass. On the other hand, as the organic material, mention may be made of xanthene dyes such as Rhodamine 6G, Rhodamine B, cumarin dyes such as dimethyl-ethylaminocumarin, methyldimethylaminocumarin, trifluoromethylmethylethylaminocumarin, epoxy polymers, acrylic polymers, urethane polymers, etc.

According to other examples of the first aspect of the present invention, a proposal is made of an optical circuit for amplifying signal light propagated through an optical waveguide. Use of a waveguide shaped optical amplification element is effective when trying to increase integration. As an optical signal amplification element, there is a material, one utilizing dielectric Raman scattering, which is one kind of nonlinear effect, and one utilizing population inversion. In general, an optical amplification element utilizing dielectric Raman scattering requires a larger pump light intensity than an element utilizing population inversion, and therefore, it is advantageous to use an element utilizing population inversion.

The material for an optical amplification element usable in the present invention is the same as the inorganic material or organic material usable used in the above-mentioned light producing waveguide material. By preparing a waveguide by a material comprising these materials as its main components and guiding or irradiating light (pump light) having a higher energy than signal light to the same, a population inversion occurs. If the signal light is guided here, then a dielectric discharge occurs and optical amplification occurs. The above-mentioned materials have wavelengths effective for optical amplification, and therefore, the materials are selected in accordance with the wavelength of the signal light. For example, Er doped glass is effective with respect to light of a 1.55 $\mu$m band, while Pr doped fluoride glass is effective with respect to the 1.3 $\mu$m band. Materials including various types of organic dyes are effective with respect to a wavelength near the maximum wavelength band of fluorescent light of organic dyes.

Therefore, the optical amplification optical circuit in accordance with the present invention has as its constituent elements the above-mentioned optical amplification waveguide, an optical coupler for introducing signal light there, and an optical coupler for introducing pump light or an optical system for irradiating the same and an optical branching filter for separating the signal light from the light in the waveguide and taking it out. As the optical coupler for introducing signal light or pump light, for example, mention may be made of a Y-type waveguide or directional coupler. As the optical branching filter, mention may be made of a diffraction grating and a wavelength selective Y-type waveguide etc. The optical amplification waveguide used in the present invention may take a bent structure where the light is deflected by a reflecting diffraction grating and reflecting film and may take a structure where the light is reciprocated between two opposing reflecting diffraction gratings or mirrors. There is the advantage that the bent structure or reciprocating structure can increase the length of action for optical amplification in a small element structure.

Further, according to the present invention, it is also possible to adopt a system of utilization of the evanescent wave, present in the clad layer, of the light guided through the above-mentioned waveguide. For example, if a film or a block formed by an optical amplification element material with an index of refraction lower than the waveguide is provided connected to the top layer or bottom layer of the waveguide through which the signal light is guided, pump light is irradiated to the optical amplification element material, and the signal light is guided to the waveguide, then a dielectric discharge occurs due to the evanescent wave of the signal light invading the optical amplification optical circuit material and the signal light is amplified. Pump light may be guided through the waveguide as well. In this case, a population inversion is caused by the evanescent wave of the pump light. Further, as mentioned above, the waveguide may have a bent structure or a reciprocating light structure.

According to a second aspect of the present invention, there is provided an optical circuit which takes out at least a portion of the light of a light power source corresponding to at least one type of output voltage of an IC, board, multichip module, electronic element, or opto-electronic element and generates an optical signal, wherein the light source is an optical waveguide into which light is introduced, light reflecting portions are provided at its ends and/or middle, a signal transmission waveguide is formed in contact with the side surface and/or top or bottom surface of the optical waveguide or in proximity to the same at a certain distance, and the optical signal corresponding to at least one type of output voltage of the IC, board, multichip module, electronic element, or opto-electronic element is made to propagate to the signal transmission waveguide.

Further, another optical circuit of the present invention is an optical circuit which takes out at least a portion of the light of a light power source corresponding to at least one type of output voltage of an IC, board, multichip module, electronic element, or opto-electronic element and generates an optical signal, wherein the light power source is a waveguide laser which oscillates by pump light, the light power source itself is the light source, a signal transmission waveguide is formed in contact with the side surface and/or top or bottom surface of the waveguide laser or in proximity to the same at a certain distance, and the optical signal corresponding to at least one type of output voltage of the IC, board, multichip module, electronic element, or opto-electronic element is made to propagate to the signal transmission waveguide.

In the optical circuit of the present invention, the light power source or signal transmission waveguide itself preferably has an electro-optic effect (a phenomenon in which the index of refraction changes in accordance with a voltage or an intensity of irradiated light) or the region between the signal transmission waveguide and light power source has an electro-optic effect.

Next, the waveguide optical amplifier or waveguide laser of the present invention is composed of two regions: a doped region and a nondoped region. Further, it has a high concentration doped region and a low concentration doped region.

Further, the waveguide optical amplifier or waveguide laser of the present invention provides a region with a large index of refraction with respect to pump light or a region with a small one.

The waveguide optical amplifier or waveguide laser of the present invention further has a larger index of refraction with respect to pump light in the high concentration doped region than in the nondoped or low concentration doped region and conversely has a larger index of refraction with respect to signal laser light in the nondoped or low concentration doped region than in the high concentration doped region.

The waveguide optical amplifier or waveguide laser of the present invention has a molecule including one or a plurality of rare earth ions constituted as a polymer side chain or has a molecule including one or a plurality of rare earth ions incorporated into a polymer main chain.

Further, in a waveguide optical amplifier or waveguide laser comprised of the waveguide optical amplifier or waveguide laser of the present invention with the matrix material doped, the rare earth ion is included as a halide, oxide, sulfide, oxyhalide, and/or sulfohalide.

The waveguide optical amplifier or waveguide laser of the present invention may be fabricated by the formation of a film for the waveguide optical amplifier or the waveguide laser on a substrate by sputtering of a glass or Group II-VI compound target including a halide, oxide, sulfide, oxyhalide, and/or sulfohalide of a rare earth ion.

The waveguide optical amplifier or waveguide laser of the present invention may further be fabricated by the formation of a film for the waveguide optical amplifier or the waveguide laser on a substrate by multitarget sputtering using a target of a halide, oxide, sulfide, oxyhalide, and/or sulfohalide of a rare earth ion and a target of a glass or Group II-VI compound target.

The waveguide optical amplifier or a waveguide laser of the present invention may further be fabricated by the formation of a film for the waveguide optical amplifier or the waveguide laser on a substrate by evaporation of a glass or Group II-VI compound target including a halide, oxide, sulfide, oxyhalide, and/or sulfohalide of a rare earth ion.

The waveguide optical amplifier or a waveguide laser of the present invention may further be fabricated by the formation of a film for the waveguide optical amplifier or the waveguide laser on a substrate by multi-evaporation using a source of a halide, oxide, sulfide, oxyhalide, and/or sulfohalide of a rare earth ion and a source of glass or a Group II-VI compound.

The waveguide optical amplifier or waveguide laser of the present invention may further be fabricated by the formation of a region with a high index of refraction in advance on a substrate and the formation of a film for a waveguide optical amplifier or a waveguide laser on that region.

According to a third aspect of the present invention, there is provided an optical LSI including optical wiring which drives an electro-optic optical switch or optical modulator formed in the LSI by a voltage of a transistor in the LSI and/or an electrode connected to the same, picks up at least part of the light of a light power source (for example, a waveguide laser, waveguide optical amplifier, etc.), and thereby converts the output electrical signal of the transistor in the LSI to an optical signal, transmits this optical signal through the waveguide or space (spatial medium), converts this to an electrical signal by a light receiving element provided in the same or another LSI or outside the LSI, and thus transmits the signal.

According to the third aspect of the invention, further, there is further provided an optical LSI including optical wiring which drives an electro-optic optical switch or optical modulator formed in the LSI by a voltage of a transistor in the LSI and/or an electrode connected to the same, picks up at least part of the light of a waveguide, and thereby converts the output electrical signal of the transistor in the LSI to an optical signal, transmits this optical signal through a waveguide or a spatial medium, converts it to an electrical signal by a light receiving element provided in the same or another LSI or outside the LSI, and thus transmits the signal.

According to the third aspect of the present invention, there is further provided an optical circuit substrate including optical wiring which drives an electro-optic optical switch or optical modulator provided on the optical circuit substrate by a voltage of a transistor in the LSI and/or an electrode connected to the same, picks up at least part of the light of a light power source or the light of a waveguide, and thereby converts the output electrical signal of the transistor in the LSI to an optical signal, transmits this optical signal through a waveguide or spatial medium, converts this to an electrical signal by a light receiving element provided in the optical circuit substrate, a light receiving element provided in an LSI, or a light receiving element mounted on the optical circuit substrate, and thus transmits the signal to a transistor in the same or another LSI and/or an electrode connected to the same.

According to the third aspect of the present invention, there is further provided a backplane optical circuit substrate for connecting optical circuit substrates, which backplane optical circuit substrate includes optical wiring and drives an electro-optic optical switch or optical modulator provided in the backplane optical circuit substrate by a voltage of an electrode of an optical circuit substrate, picks up at least part of the light of a light power source (for example, a waveguide laser, waveguide optical amplifier, etc.) or a waveguide, and thereby converts the output electrical signal of the optical circuit substrate to an optical signal, transmits this optical signal through a waveguide or spatial medium, converts this to an electrical signal by a light receiving element provided in the backplane optical circuit substrate or a light receiving element provided in another optical circuit substrate mounted on the backplane, and thus transmits the signal.

In the third aspect of the present invention, all or part of a waveguide can be composed of a polymer and/or glass and/or ceramic, and all or part of the electro-optic optical switch or optical modulator can be made from an electro-optic polymer, a material selected from secondary or tertiary organic nonlinear optical materials, or a material selected from semiconductor materials and glass. The electro-optic optical switch and optical modulator may be operated by using the reflected light resulting from causing a difference in the index of refraction in the optical waveguide by application of voltage. Further, it is possible to operate them by using the leakage of light resulting from opening a window of the index of refraction in the cladding by the application of voltage.

The light receiving element may be formed above the waveguide, below the same, or in a manner cutting across the inside of the waveguide and may be selected from a photodiode, phototransistor, and MSM detector composed of amorphous silicon, polycrystalline silicon, or a conjugated polymer. The substrate may be a semiconductor crystal with the light receiving element formed in the substrate. Note that a light receiving element using a polymer material and/or a light receiving element using a polymer material may be mounted monolithically on the substrate. The light power source used in the present invention may be composed of a glass ceramic, polymer, or glass. Note that the polymers mentioned above are formed by the vapor phase growth method.

In the third aspect of the present invention, a light supplying power is allocated in accordance with the fanouts of the signal. Further, provision is made of an optical path switching portion in the transmission path. As the pumping light or the light incident to the waveguide, use may be made of light from a light emitting element formed in the LSI or mounted on the LSI, light introduced from a fiber to the LSI, a spatial beam, light of a waveguide formed in the circuit substrate mounting the LSI, light from a light emitting element formed in or mounted on the optical circuit substrate, light introduced from a fiber to the optical circuit substrate, a spatial beam, or light of a waveguide formed in the backplane mounting the optical circuit substrate.

In the third aspect of the present invention, it is possible to introduce the light from the LSI to a waveguide formed in the circuit substrate mounting the LSI to transmit it. Further, it is possible to introduce the light from the optical circuit substrate to the waveguide formed at the backplane mounting the optical circuit substrate to transmit it.

In the third aspect of the present invention, there is further provided an optical tab in which waveguides are formed in or on a flexible substrate and one waveguide (optical fiber) and another waveguide (optical fiber) or a light emitting element and a waveguide (optical fiber) or a light receiving element and a waveguide (optical fiber) are coupled by crimping or by the coupling method (optical solder) as described in Japanese Patent Application No. 4-298920 filed on Nov. 9, 1992 (relating to a method of optical coupling by an optical material for optically coupling waveguides, optical fibers, laser diodes, photodiodes, and other optical elements together, in which method of optical coupling one optical fiber is held by a movable holder, another optical fiber is held by a fixed portion, the optical coupling face of the one optical fiber and the optical coupling face of the other optical fiber are made to abut against each other, then an arc discharge device or the like is used to melt together the one optical coupling portion and the other optical coupling portion, with the movable holder automatically aligning the one optical coupling portion and the other optical coupling portion, thereby achieving optical coupling) and/or by a distributed index of refraction type coupler which forms a distribution of index of refraction by light emitted from the waveguide (optical fiber) to a photosensitive substance and enables optical coupling by self-alignment between optical elements due to the same.

In the third aspect of the present invention, there are provided an optical LSI, optical circuit substrate, backplane optical circuit substrate, optical tab, or flexible waveguide in which at least part of the interlayer insulating layer for electrical wiring is used also for the waveguide layer.

According to the present invention, there is provided in three-dimensional packaging of optical circuit substrates and LSI's in which a beam pass out through a medium such as a polymer or glass layer, an optical coupling capable of controlling the beam by forming a hologram or waveguide by distribution of index of refraction in the medium. This optical coupling can be realized by provision of an optical-optical switch and modulator in the transmission path between the optical coupling and the transmission destination and by modulation of the waveguide light of the transmission path of the transmission origin by optical signals from the transmission path of the transmission destination. According to the present invention, it is possible to achieve the optical coupling between the PD's and LD's mounted by solder bumps or PD's and LD's on the LSI mounted by solder bumps and the optical waveguide formed in the substrate, optical coupling between the optical LSI mounted by solder bumps and optical waveguide formed in the substrate, and optical coupling between the backplane optical circuit substrate and the optical circuit substrates by a method selected from optical tabs, optical solder, hologram optical elements (HOE), and longitudinal direction (slanted direction) incoming and outgoing ends. Further, optical coupling between the backplane optical circuit substrate and optical circuit substrates may be performed by provision of an optical-optical switch and modulator in the transmission path of the backplane and modulating the backplane waveguide light by the optical signals from the optical circuit substrates.

According to the third aspect of the present invention, there are provided a longitudinal direction (slanted direction) optical waveguide in the direction of film thickness formed by selectively changing the orientation state or thickness of a polymer film on the substrate, a longitudinal direction (slanted direction) waveguide fabricated by forming an organic or inorganic film on a surface provided with a step difference and using this as the waveguide layer, or a longitudinal direction (slanted direction) waveguide fabricated by forming a film by the vapor phase growth method on a surface provided with a step difference and using this as a waveguide layer. These waveguide layers may be shaved at the surface after formation of the film so as to make longitudinal direction incoming/outgoing ends. Before forming the waveguide layers, an underlayer (buffer layer) may be provided. They may also be formed selectively at part of a step difference.

The waveguide may have provided above and/or below it an element selected from a light emitting element, light receiving element, electro-optic element, waveguide, fiber, holographic optical element, and microlens to form an optical LSI, optical circuit substrate, or optical circuit element.

According to the third aspect of the present invention, there are further provided parallel transmitters, which parallel transmitters transmit optical signals by connecting the output electrodes of the transmitted electrical signals to electro-optic optical switch and modulator arrays, driving the electro-optic optical switches or optical modulators by the voltage of the electrodes, and pick up at least part of the light of a light power source (waveguide laser, waveguide optical amplifier).

In the present invention, when connecting to a cooling substrate, it is possible to connect optical circuit substrates by using optical connection for signal transmission between a circuit substrate in a cooler and a circuit substrate outside. Further, it is possible to use an optical transmitter or supply light from the outside and make the optical wiring by a flexible waveguide.

According to the fourth aspect of the present invention, there is provided an optical circuit substrate which includes optical wiring and drives a light emitting source provided in or mounted on the optical circuit substrate by a transistor in the LSI so as to modulate the light intensity or wavelength or phase, transmits the optical signal through an optical waveguide and/or space and/or medium space, converts this to an electrical signal by a light receiving element provided in the optical circuit substrate or a light receiving element provided in the LSI or a light receiving element mounted on the optical circuit substrate, and thereby transmits the signal to a transistor in the same LSI and/or an electrode connecting to the same.

According to the fourth aspect of the present invention, there is provided a backplane optical circuit substrate for connecting optical circuit substrates, which backplane optical circuit substrate includes optical wiring, drives a light emitting source provided in or mounted on the backplane optical circuit substrate by an electrical signal of an electrode of an optical circuit substrate so as to modulate the light intensity or wavelength or phase, transmits the optical signal through a waveguide, converts this to an electrical signal by a light receiving element provided in or mounted on the backplane optical circuit substrate or a light receiving element provided in or mounted on another optical circuit substrate mounted on the backplane, and thereby transmits the signal.

According to the fourth aspect of the present invention, there is provided an optical circuit substrate which introduces light from an optical circuit substrate to a waveguide formed in the backplane mounting the optical circuit substrate and/or introduces light from the backplane to a waveguide formed in the optical circuit substrate.

In the optical circuit substrate, it is possible to mount on the optical circuit substrate a sub-substrate including optical elements or carrying an LSI and an LSI or a sub-substrate including or carrying an LSI. Note that it is possible to form the optical waveguide in the interlayer insulating layer and/or protecting layer of these circuit substrates (multichip modules (MCM)), the waveguides may be provided in multiple layers, and clock line and bus line wiring may also be performed.

In the above optical circuit substrate, the light receiving element may be formed above and/or below the waveguide and/or in a manner cutting across the inside of the waveguide or may be formed above and/or below the waveguide at a distance away from it. Further, the light receiving element may be selected from a photodiode, phototransistor, or MSM detector comprised of amorphous silicon and/or polycrystalline silicon, may be selected from a photodiode, phototransistor, or MSM detector comprised of a conjugated polymer and/or low molecular weight crystal, and may be selected from a photodiode, phototransistor, or MSM detector formed in an LSI. The light receiving element may be formed in a semiconductor crystal substrate and may be formed above and/or below the waveguide and/or in a manner cutting across the inside of the waveguide or the light receiving element may be formed above and/or below the waveguide at a distance from the same. The light emitting element may be selected from an LD, LED, and EL. Further, it may be made an organic light emitting element comprised of a low molecular weight crystal and/or polymer.

The optical circuit substrate according to the fourth aspect of the present invention may have all or part of a waveguide comprised of a polymer and/or glass and/or ceramic. In the case of a polymer, it may be partially or completely fluorinated and the polymer may be formed by the vapor phase growth method.

The optical circuit substrate according to the fourth aspect of the present invention can change the light supplying power in accordance with the fanouts of the signal and can provide an optical path switch portion in the middle of the transmission. In the present invention, when a light passess through a medium such as a polymer or glass layer and three-dimensionally packaging optical circuit substrates and LSI's, by forming a hologram, waveguide, or distribution of index of refraction in the medium, it is possible to control the beams. Further, by provision of an optical-optical switch and modulator in the middle of the transmission path of the transmission destination, it is possible to modulate and optically couple the waveguide light of the transmission destination by an optical signal from the transmission path of the transmission origin. In the present invention, the optical coupling between the light receiving elements and/or light emitting elements mounted by solder bumps or the light receiving elements on the LSI mounted by solder bumps and the optical waveguides formed on the substrate or the optical coupling between the backplane optical circuit substrate and the optical circuit substrates may be performed by a method selected from optical tabs, optical solder, HOE's, and longitudinal (slanted direction) incoming and outgoing ends.

According to a fifth aspect of the present invention, there is provided an optical switch which changes the optical path of all or part of a waveguide by changing the index of refraction of the waveguide and/or cladding, which optical switch changes the indexes of refraction of waveguides and/or cladding between two or more uncoupled waveguides by applying voltage or irradiating light to the waveguides and/or cladding so as to switch the light, in particular, light from a waveguide to space.

The optical switch may have electrodes formed in a manner sandwiching in the waveguide and/or cladding, Preferably, the electrodes are transparent or translucent. The electrodes may be formed in a manner sandwiching in the waveguide and/or cladding while being shifted vertically. Further, provision may be made at the top and/or bottom of the waveguide or cladding of a layer with an uneven index of refraction and/or a hologram layer.

EXAMPLES

Examples of the present invention will now be explained with reference to the drawings, but of course the present invention is not limited in scope by these

EXAMPLES

Example 1

FIG. 1 shows an example of the constitution of an optical circuit according to the present invention. In this example, use is made of an optical circuit including an optical waveguide formed on a support to transmit information between IC's provided on the optical circuit. The optical circuit is comprised of a light source 5 for generating light 8 for transmission of information, a light source 6 for generating light 7 serving as the pump light for generating the light 8 at the light source 5, an optical branching filter 9 for branching the light 8 of the light source 5, a waveguide 11 for transmitting light branched by the optical branching filter 9, a clad layer 10 between the light source 5 and the waveguide 11, a clad layer 2 under the light source 5, a clad layer 13 above the waveguide 11, and a substrate 1 serving as the support for the same. The light source 5 is comprised of a waveguide for guiding the light 8 and reflecting films 3 and 4 at the two ends of the waveguide. The waveguide is prepared using a material which enters an excited electron state and generates the light 8 by the light 7. The reflecting films 3 and 4 are formed under conditions reflecting the light 8 at a high efficiency. The optical branching filter 9 is composed of an electro-optic element prepared by a material having an electro-optic effect and an electrode 14. By applying a voltage to the electrode 14, the index of refraction of the electro-optic element becomes higher and the light 8 of the light source 5 is branched. By applying a signal voltage to the electrode 14 of the IC 15, an optical signal in accordance with the voltage signal is produced. The optical signal propagates through the waveguide 11 and reaches the optical sensor 16 of the IC 17. The optical sensor 16 converts the optical signal to an electrical signal. The IC 17 receives this electrical signal, whereby information is transmitted from the IC 15 to the IC 17. Note that in FIG. 1, the light 8 may be introduced from the outside.

Example 2

Figure 2:
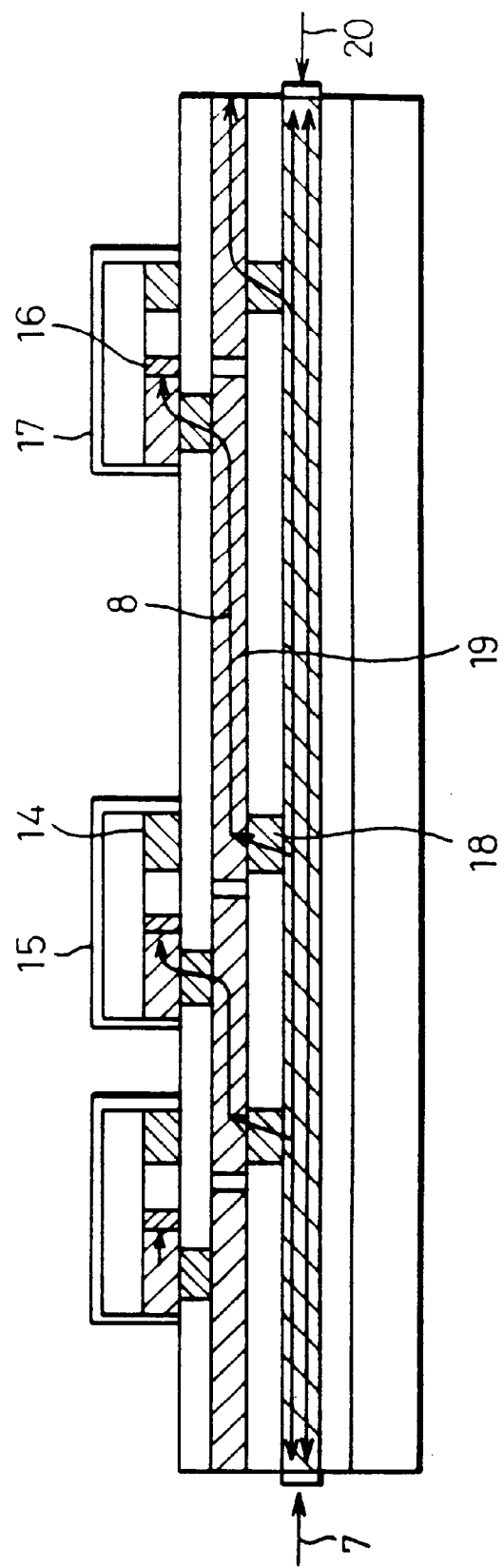
FIG. 2 is a view showing another embodiment of the structure of the optical circuit according to the present invention.

FIG. 2 shows another example of the constitution of the optical circuit. FIG. 2 shows a basic construction the same as in FIG. 1. The optical branching filter 9 of FIG. 1 is composed of a high index of refraction clad portion 18 and an electro-optic material waveguide 19. The high index of refraction clad portion 18 is prepared with a passive material and branches the light 8 from the light source 5. The waveguide 19 is prepared by a material having an electro-optic effect and guides or blocks the light 5 of the high index of refraction clad portion 18 by the presence or absence of voltage of the electrode 14. Further, as shown in this example, it is also possible to introduce from the outside a light 20 of the same wavelength as the light 8 produced by the light source 5 and carrying signals or information. In this case, the optical branching filter functions as a gate for the signal light or information light.

Example 3

Figure 3:
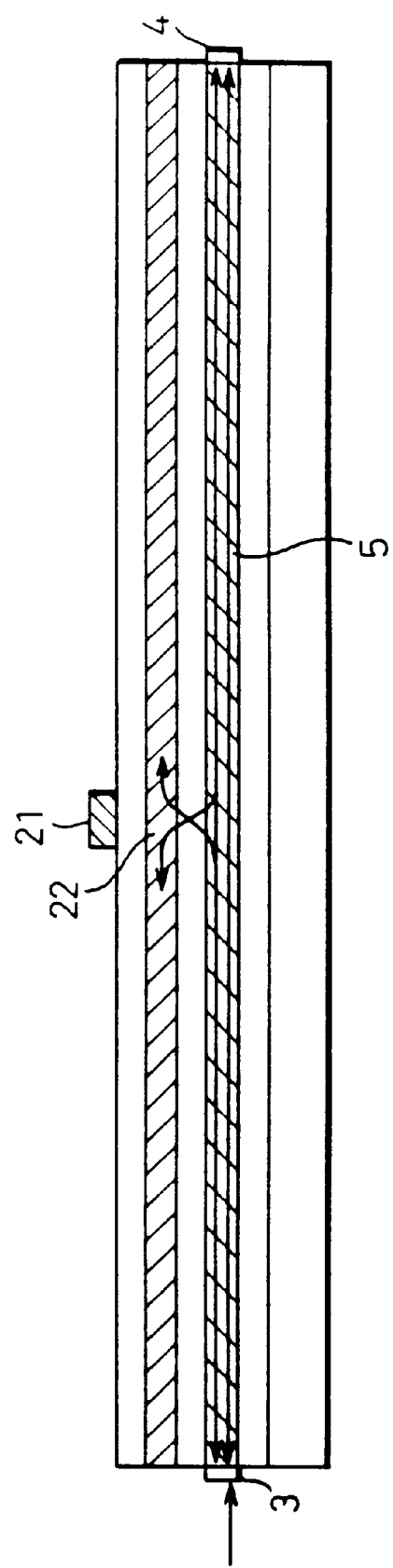
FIG. 3 is a view showing the multiple directions of progression of branched light in an embodiment of the structure of the optical circuit according to the present invention.

The light from the light source 5 branched by the optical branching filter 9 can be made to progress in a plurality of directions. FIG. 3 shows an example of a two-fanout optical branching filter. The basic constitution of this example is the same as in FIG. 2. The light produced by the light source 5 reciprocates between the reflecting films 3 and 4 and therefore has two directions of progression. Therefore, by applying a signal voltage to the electrode 21, it is possible to make the light branched at the electro-optic material waveguide progress in two directions as shown in FIG. 3.

Such a structure can be formed by the following for example. First, a thin film of Nd doped glass etc. is deposited on a heat oxidized silicon substrate by CVD, sputtering, evaporation, or other methods to 0.5 to 10 μm to form a waveguide constituting the light source. On the top of this is deposited an SiO$_2$ film to 0.5 to 5 μm to form a top clad layer. Next, a waveguide is prepared by a material having an electro-optic effect such as an electro-optic polymer. This waveguide is prepared by preparing a film by the method of coating a solution of an electro-optic polymer etc. by spin coating or a doctor blade or by evaporation, CVD, or another method and by removing the film by etching or another method to leave a waveguide portion. A clad layer is over-coated on this top layer to realize the constitution shown in FIG. 3.

Example 4

Figure 4:
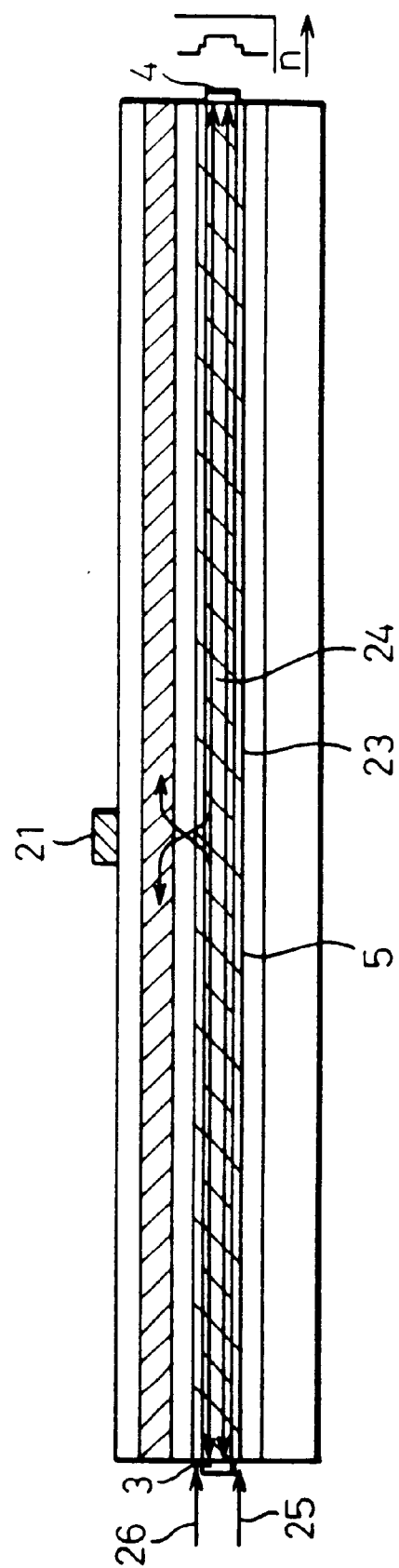
FIG. 4 is a view showing an example of the method of irradiating light to a light source in a view of the optical circuit according to the present invention.

The light source 5, as shown in FIG. 4, may also have a waveguide serving as the light source constituted by a region 23 with a low index of refraction at the periphery of the cladding and a region 24 with a high index of refraction at the center. The reflecting films 3 and 4 at the two ends of the light source are provided at the cross-section of the high index of refraction region of the waveguide. By introducing light from the cross-section of the low index of refraction region, it is possible to introduce light with a high efficiency. It should be noted that that 25 shows pump light, while 26 shows signal light.

Example 5

Figure 5:
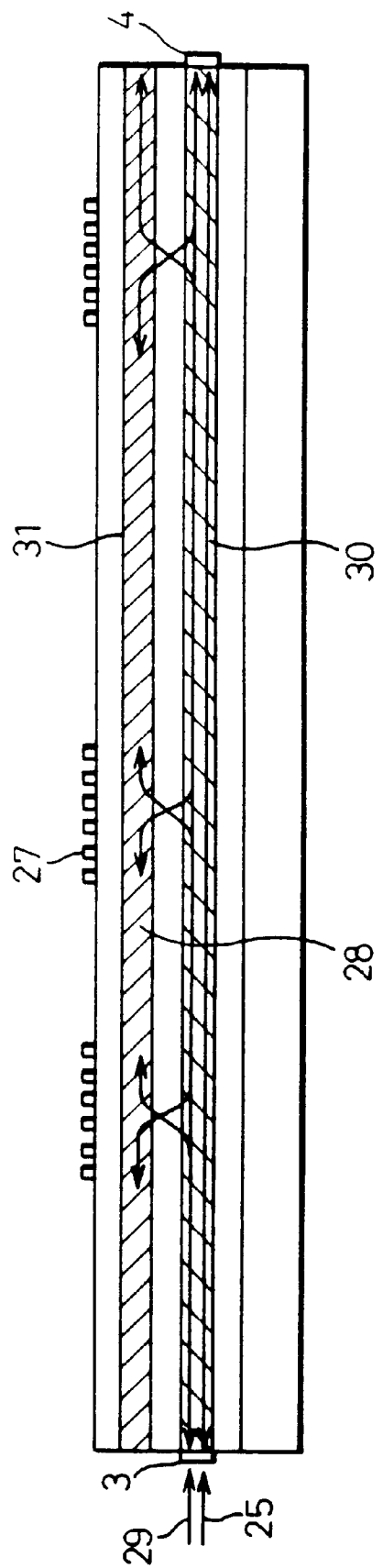
FIG. 5 is a view showing an example of use of an electrode having a cyclic structure in an optical-circuit for optical amplification according to the present invention.

For the electrode used for the optical branching filter, use may be made of an electrode 27 having a cyclic structure as shown in FIG. 5. By the application of voltage, a cyclic structure of the index of refraction is formed in the electro-optic material 28. Using this cyclic structure of the index of refraction, the light of the light source is diffracted and the light is branched. Note that in FIG. 5, 29 shows laser light, 30 a light source (laser waveguide), and 31 an optical waveguide (signal transmission).

Example 6

Figure 6:
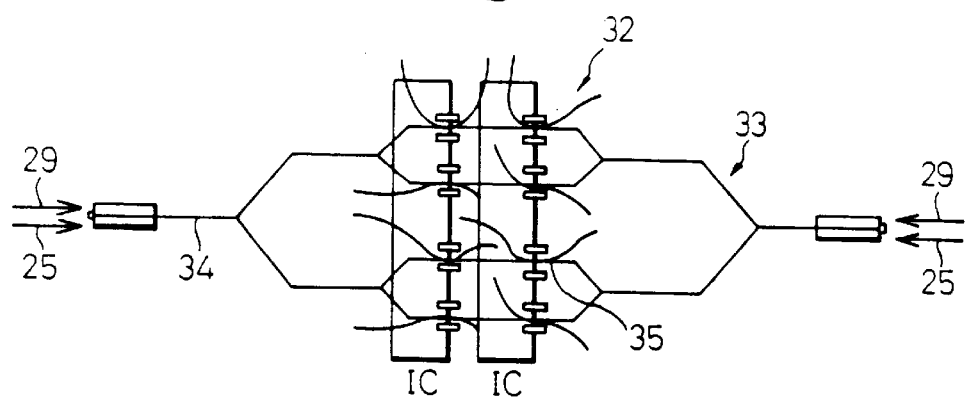
FIG. 6 is a view showing another example of an optical amplification optical circuit according to the present invention.

FIG. 6 shows an example of a view of the plane structure of an optical circuit according to the present invention. In FIG. 6, the waveguide 32 at the top of the multilayer structure optical circuit is shown by the thick lines, while the waveguide 33 of the bottom is shown by thin lines. In FIG. 6, the bottom layer waveguide 33 is used as the light source and the top layer waveguide 32 is used as a signal transmission path. As shown in FIG. 6, in the case of a construction where the top and bottom waveguides are made to intersect at the optical pickup portion as shown in FIG. 6, there is no longer a need for constructing the two index of refraction portions in the clad layer in this construction. Note that in FIG. 6, 34 is a channel waveguide and 35 is an optical branching filter.

A slab shaped light source may be constructed in a broad region of the substrate surface. In this case, an optical pickup portion is formed at any position of the slab shaped light source. The clad layer, for example as shown in FIG. 2, is constituted by a high index of refraction portion and low index of refraction portion branching the light.

Example 7

Figure 7:
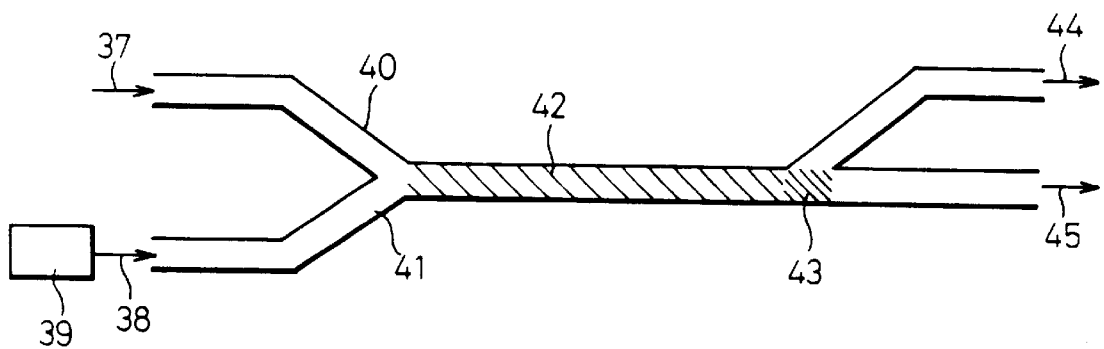
FIG. 7 is a view showing still another example of an optical amplification optical circuit according to the present invention.

FIG. 7 shows an example of an optical amplification optical circuit for amplifying light having intensity modulation. In this example, the light 37 having intensity modulation transmitted by the optical waveguide is amplified by an optical amplification waveguide, and the light 37 of the optical amplification circuit is made to diffract using the diffraction grating for diffracting the light 37, branching the same to the succeeding waveguide. The optical amplification optical circuit is comprised by an optical amplification waveguide 42 for amplifying the light 37, an optical coupler 41 for coupling the light 37 to the optical amplification waveguide 42, a light source 39 for generating light of a wavelength shorter than the light 31, an optical coupler 41 for coupling the light 38 generated by the light source 39 to the optical amplification waveguide 42, and a diffraction grating 43 which diffracts the intensity modulated light amplified by the optical amplification waveguide 42 and branches it to the succeeding optical waveguide. The light 38 of the light source 39 is guided to the optical amplification waveguide 42. If the light 37 is introduced to the optical circuit in that state, the optically amplified light 44 is obtained.

This construction, for example, is formed as follows: A waveguide 42 is formed on a heat oxidized silicon substrate serving as the support by an acrylic polymer in which is dissolved a cumarin dye. Next, the optical couplers 40 and 41 are formed by a mixture of polymethylmethacrylate/polystyrene. Next, a photosensitive film is formed at a portion for preparation of the diffraction grating 43 by a composition comprised of an acrylic/fluorine containing acrylic copolymer, vinyl carbazole, allyl carbazole, trimethylolpropanetriacrylate, and other polymerizing monomer mixtures and a photosensitizer. This film is irradiated by light having the same wavelength as the light 37 and generated by the same light source from the side of irradiation of the light 37 and the side of emission of the light 44 to prepare a diffraction grating. A film comprised of a silicone resin is formed on the top layer as a whole to form the top clad layer.

Example 8

Figure 8:
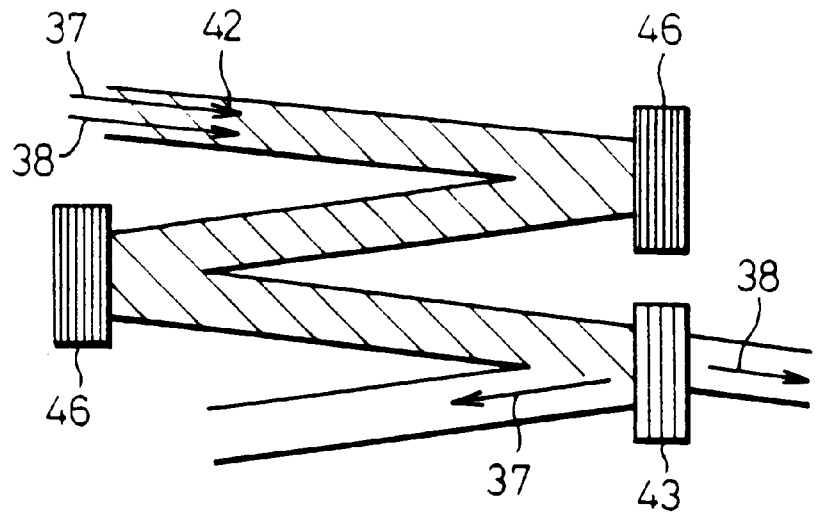
FIG. 8 is a view showing still another example of an optical amplification optical circuit according to the present invention.
Figure 9:
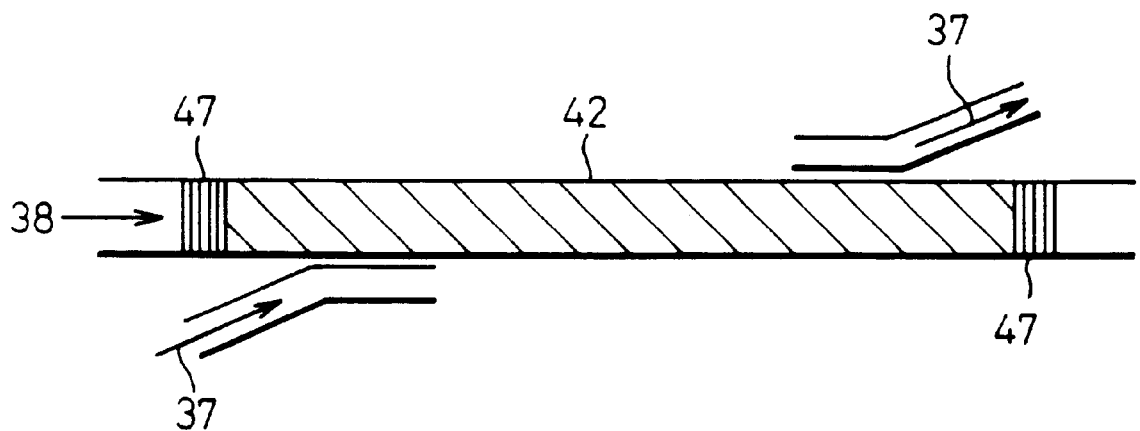
FIG. 9 is a view showing still another example of an optical amplification optical circuit according to the present invention.
Figure 10:
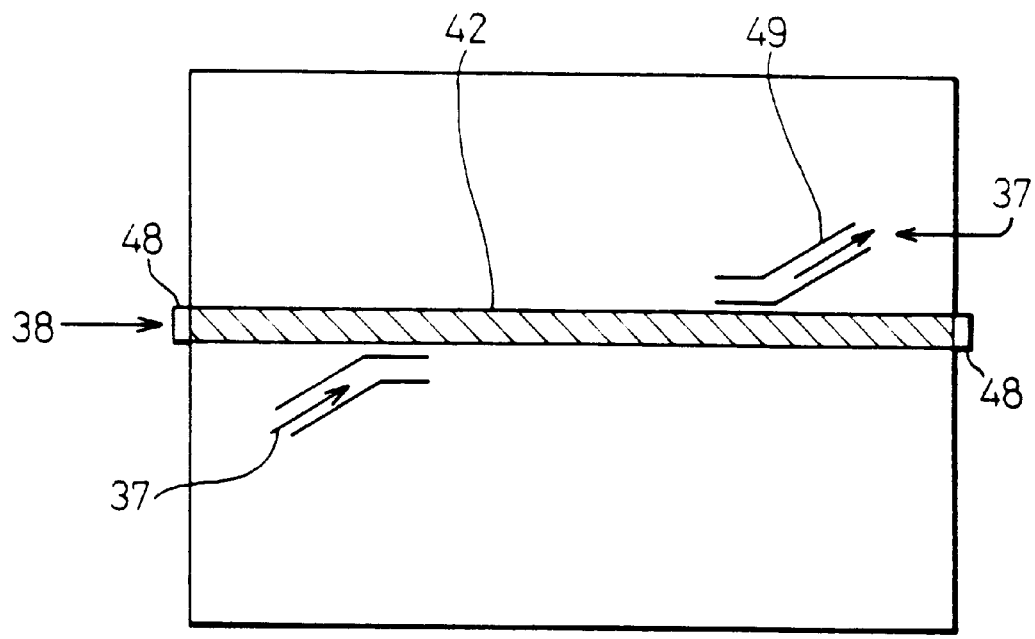
FIG. 10 is a view showing still another example of an optical amplification optical circuit according to the present invention.

The optical amplification waveguide, as shown in FIG. 8, may be a waveguide wherein the light 37 and 38 are reversed in direction of progression by a multilayer reflection type hologram and progress in a zigzag manner. In this case, the construction may be also made one where pump light is introduced to the waveguide and a long optical amplification length can be obtained with a short element length. Further, as shown in FIG. 9 and FIG. 10, the construction may also be one where diffraction gratings 47 for reflecting and diffracting the light 37 (signal light) or reflecting films 48 for reflecting the signal light are attached at the two ends of the optical amplification waveguide 42 and the light 37 is reciprocated in the waveguide 49.

Further, the construction may be one where a waveguide 49 in which light 38 is guided is formed at the top or bottom of the optical amplification waveguide 42 in which light 37 is guided, guide the light 38 in the waveguide 49, and guide the light 37 in the waveguide 42. The construction may be one where an optical amplification waveguide 49 (or optical amplification element) is formed at the top or bottom of a waveguide 42 where the light is guided. Also, the construction may also be one where the light 38 is irradiated from space to the optical amplification waveguide 42 (or optical amplification element).

Example 9

Figure 11:
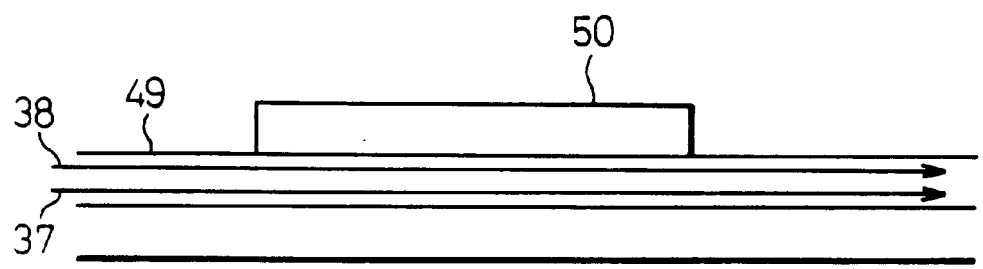
FIG. 11 is a view showing still another example of an optical amplification optical circuit according to the present invention.
Figure 12:
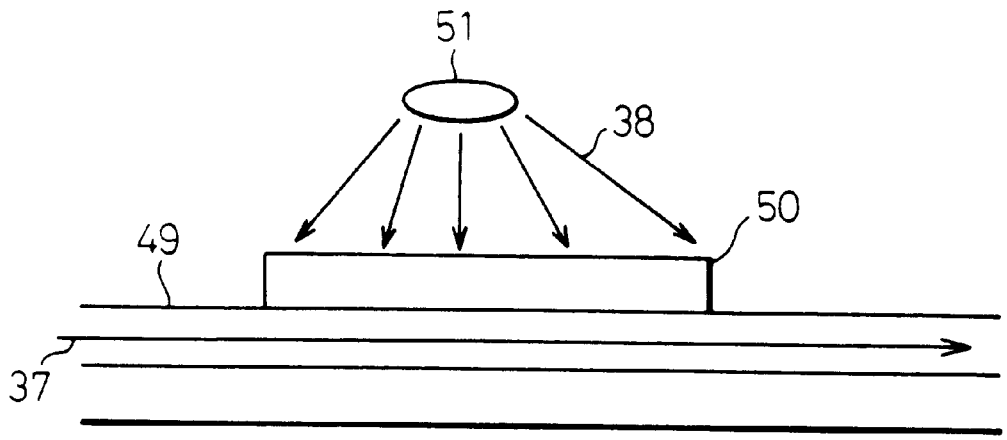
FIG. 12 is a view showing still another example of an optical amplification optical circuit according to the present invention.

FIGS. 11 and 12 show examples of optical amplification optical circuits according to the present invention having a two-layer structure of elements. In this case, for example, a solution comprised of a solvent in which is dissolved an acrylic polymer, a high index of refraction monomer, and an optical polymerization initiator is coated on the clad layer to prepare a film, a pattern is exposed on the film from above, and the high index of refraction monomer is polymerized at the exposed portion to form an index of refraction modulated type optical waveguide 49. On this top layer, a solution in which an xanthene dye and a fluorine-containing epoxy polymer are dissolved is coated to form a film and form the optical amplification element 50. If this film is irradiated with pump light 38 and signal light 37 is introduced to the waveguide 49, an amplified signal is obtained (light source 51).

Example 10

Figure 13:
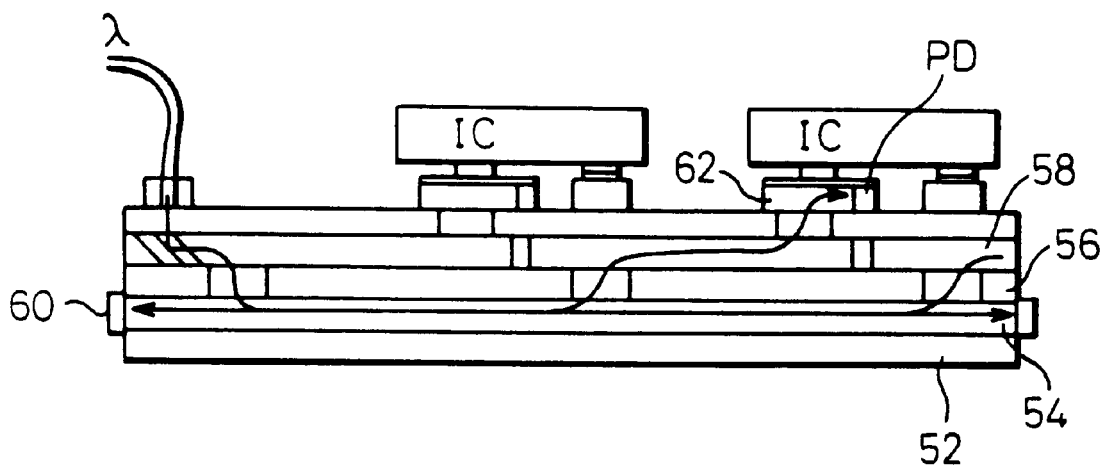
FIG. 13 is a structural view of an embodiment of an optical circuit of a second aspect of the present invention.

FIG. 13 shows an example of an optical circuit of the second aspect of the present invention. In this example, a light power source 54 is provided on the substrate 52. As this light power source, use is made of a usual optical waveguide. A signal transmission waveguide 58 is provided on the top of the light power source through an EO polymer 56. On the other hand, light reflecting portions 60 are provided on the two sides of the light power source 54. As the light reflecting portions 60, use is preferably made of reflecting films or gratings. By constituting things in this way, it is possible to preferably seal in the supplied light ($\lambda$) in the waveguide. By this, rather than what we may call a waveguide, a "reservoir" of light packed with photons is formed and serves as the light power source. Note that in the optical circuit of FIG. 13, use is made of a waveguide laser for the light power source 54. For example, use is made of a waveguide laser doped with a rare earth. Pump light is introduced into this rare earth doped waveguide to cause laser oscillation. In this case, the light of $\lambda$ is produced by laser oscillation using pumping rather than being supplied from the outside. The laser light does not have to be taken out from the end surface to the outside, but preferably is sealed inside as much as possible to increase the number of photons. Therefore, the index of refraction is preferably made larger.

As shown in the example of FIG. 13, if the index of refraction of the EO polymer is changed by the output voltage of the IC, for example, it acts as an optical switch and at least a part of the light of the light power source is introduced into the signal transmission waveguide 58 and is transmitted to the light receiving element 62 provided corresponding to the input portion of the IC. Here, an EO polymer 58 is used at the middle, but another waveguide portion or light power source portion may also be given an EO effect. As the EO polymer and passive polymer, use may be made of any usual epoxy, polyimide, conjugated polymer, etc.

Figures 14A, 14B:
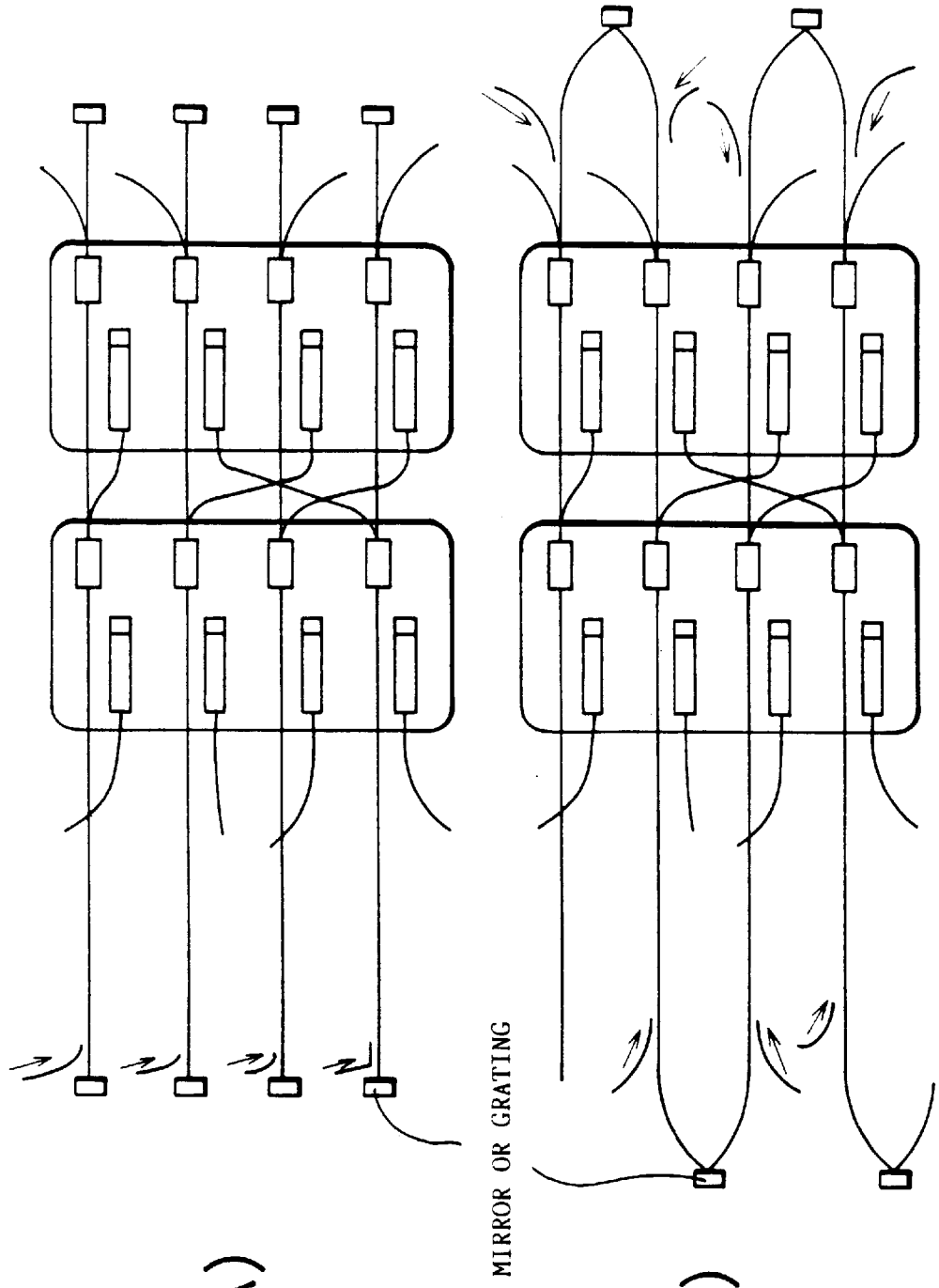
FIGS. 14(A) and 14(B) give plan views of optical circuits provided with light power sources.

FIG. 14(A) and FIG. 14(B) are schematic views showing the shape of a light power source from above. The light, for example, may be introduced through a grating or a holographic optical element or may be introduced by a directional coupler. Further, if the index of refraction of the light power source is made larger than the index of refraction of the introduction use waveguide, reversal of light from the light power source to the introduction use waveguide can be suppressed and the efficiency of sealing in the light is improved.

Figure 15:
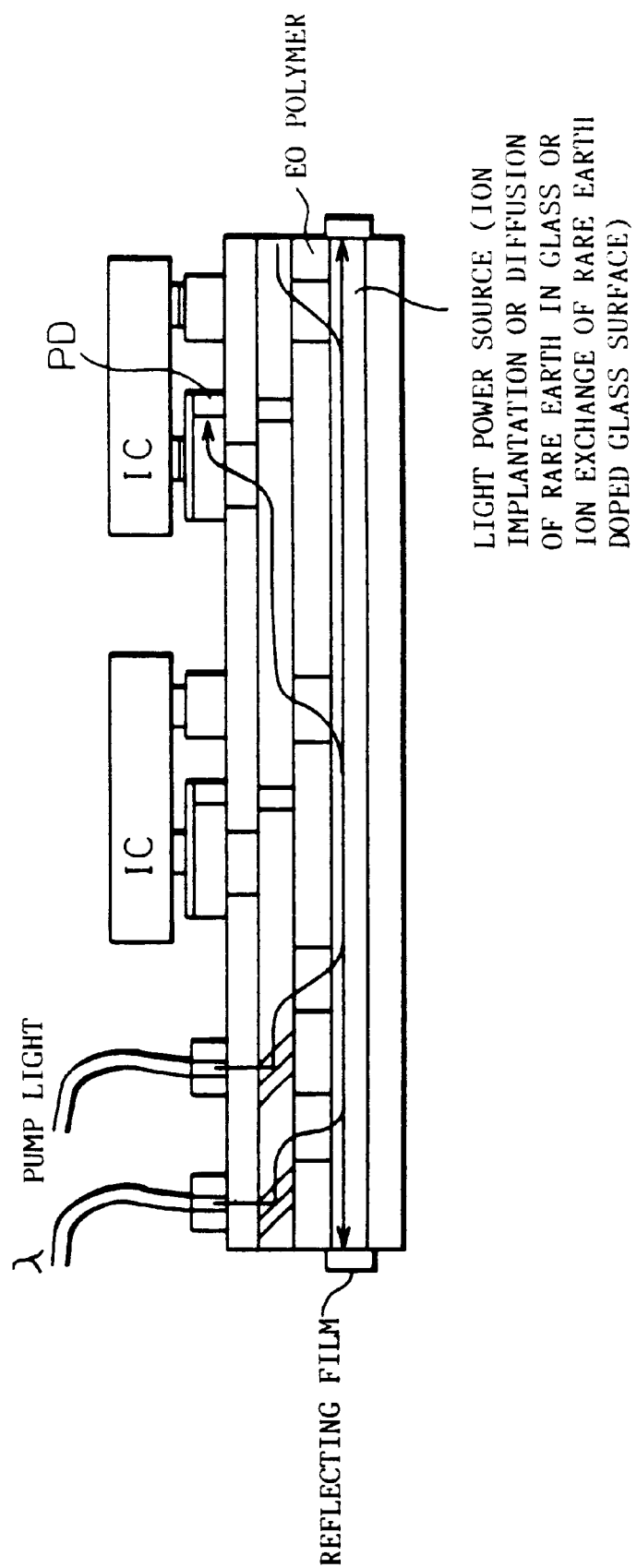
FIG. 15 is a view showing an embodiment of the structure of an optical circuit having a light power source (waveguide optical amplifier).
Figure 16:
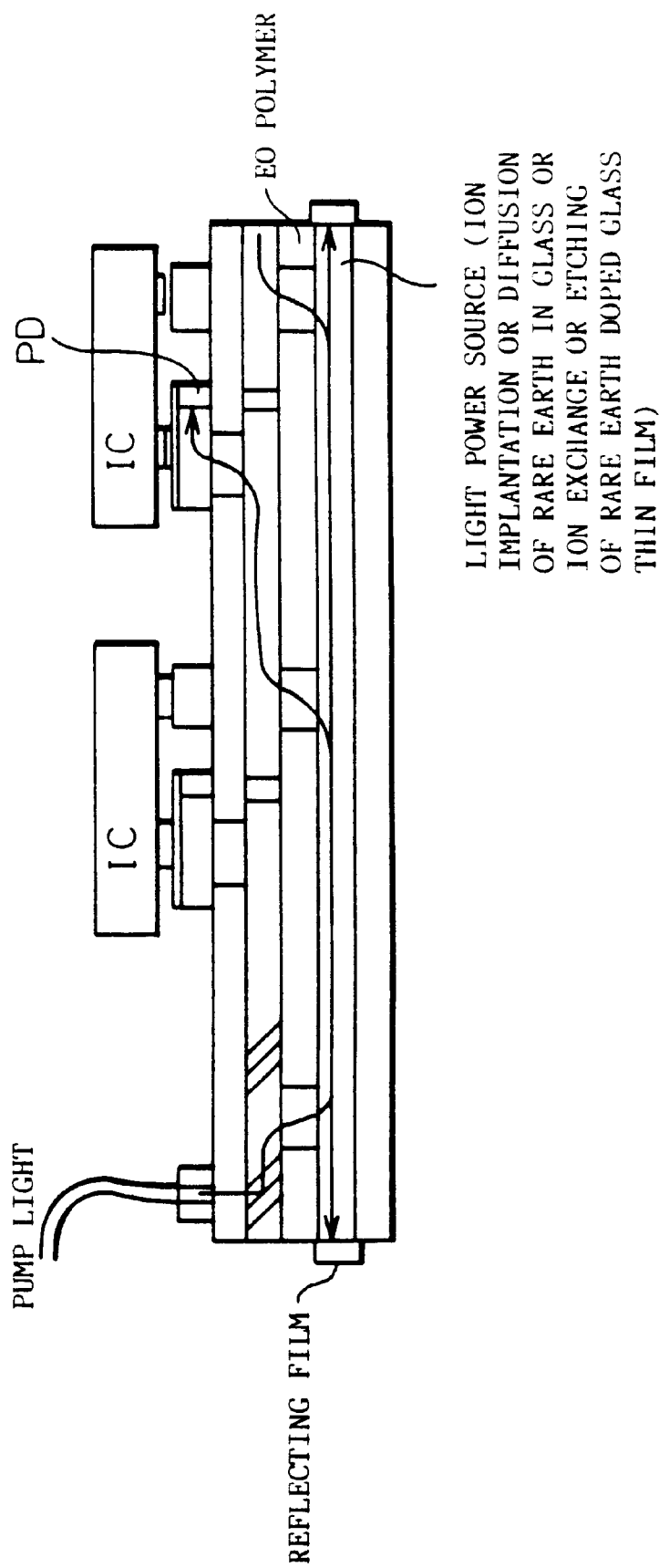
FIG. 16 is a view showing an embodiment of the structure of an optical circuit having a light power source (waveguide optical amplifier).

FIGS. 15 and 16 show examples of the structures of optical circuits having light power sources (waveguide optical amplifier (FIG. 15) and waveguide laser (FIG. 16)). (1) The light power source is formed by implanting rare earth ions or dispersing rare earths (for example, normal laser glass) in the desired region of the substrate surface or by removing the rare earth ions from the desired region (see FIG. 15). (2) The light power source is formed by implanting rare earth ions or dispersing rare earths in the desired region of a film formed on a substrate, by removing the rare earth ions from the desired region, or by etching the desired region (see FIG. 16). (3) The light power source is formed by ion exchange at a desired region of a substrate including rare earth ions (for example, the usual laser glass) or a desired region of a film formed on the substrate and including the rare earth ions.

Below, an explanation will be made of an example of the fabrication of the light power source using laser glass. A channel waveguide is formed by the two-stage ion exchange method in commercially available Nd ion-added laser glass (HOYA LHG-5, $Nd_2O_3$; 3.3 wt %). A dielectric multilayer reflecting film is formed at the two end surfaces to create a resonator structure (Aoki et al., Laser Gakkai, "Proceedings of 6th Nonlinear Optical Effect Device Study Group", Kokai Kenkyukai Shiryo, pp. 41 to 46). For example, if pump light, that is, LD light of 800 nm, is introduced into a single mode waveguide of a cross-sectional area of 10 $\mu$m×20 $\mu$m and a length of 5 mm, oscillation light of 1052 nm and 7 mW can be obtained with respect to a pump light intensity of 30 mW.

An explanation will now be made of examples for making the optical circuit operate stably over a long period. To prepare for the case where the laser breaks down, a plurality of lasers are provided and are switched in accordance with need. Further, it is preferable to interpose a connector to enable the switching of the lasers to be performed smoothly.

Example 11

Next, an explanation will be made of a waveguide optical amplifier or waveguide laser according to the present invention. These are schematically shown in FIGS. 17(a) to (f), but they both have structures improved from the prior art example.

Figure 17A:
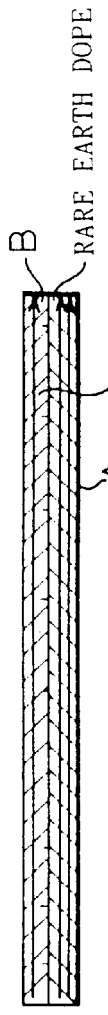
FIG. 17, comprising subparts (a), (b), (c), (d), (e) and (f) gives views showing an improved structure of a waveguide optical amplifier or waveguide laser of the present invention.
Figure 17B:
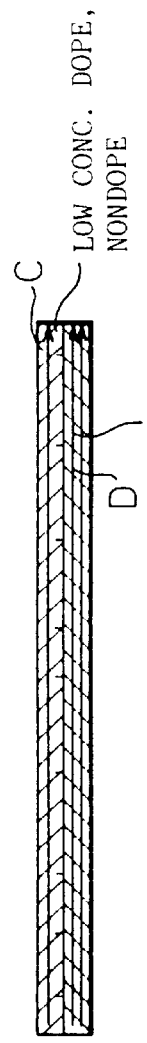
Figure 17C:
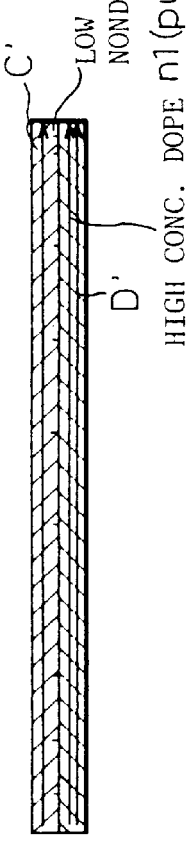
Figure 17D:
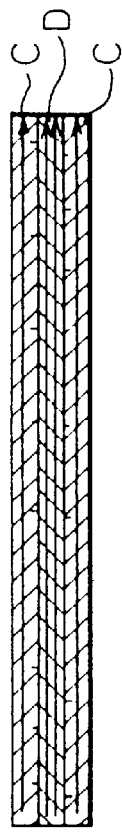
Figure 17E:
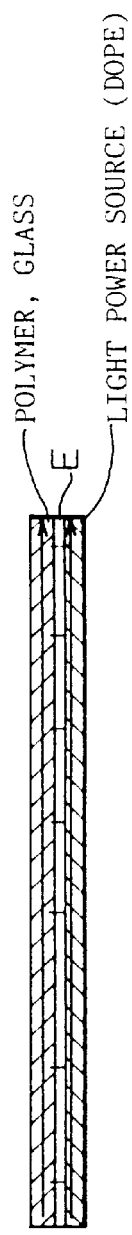
Figure 17F:
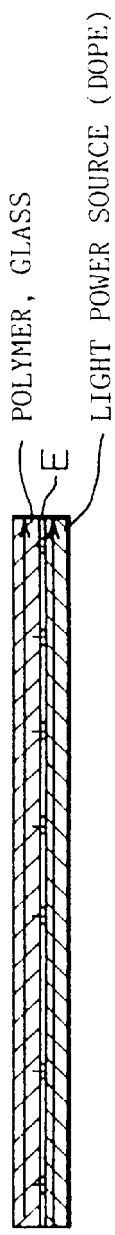

FIG. 17(a) is an example of the formation of the doped region A and the nondoped region B in a waveguide. FIG. 17(b) is an example of the provision of the low concentration region C and the high concentration region D. Here, as shown in FIG. 17(c), if the index of refraction with respect to the pump light in the high concentration region C' or the index of refraction with respect to laser light (or amplified light) in the nondoped (or low concentration) region C' is made higher, the pump light will be more present in the high concentration region while the resultant laser light (or amplified light) will move to the nondoped (or low concentration) region, resulting in efficient production of light. Further, it is possible to switch the light of $\lambda$ efficiently to the signal transmission waveguide by provision of an optical switch at the nondoped (or low concentration region) side. As shown in FIG. 17(d), it is also possible to form several regions. Further, as shown in FIG. 17(e) and FIG. 17(f), a low index of refraction region E may also be interposed. Note that for control of the indexes of refraction of the regions, adjustment can be made by the dope concentration. Adjustment can also be made by the matrix material or the composition of the matrix material.

A normal waveguide laser and waveguide optical amplifier is comprised of a single waveguide and has mixed pump light and oscillation light. In this case, when fetching out the laser light, there is interference in both the laser light and the pump light. As a result, the phase relationship of the laser light and the pump light changes and there is a risk of the oscillation stopping or instability. As opposed to this, in the present invention, when the laser light is amplified, it simultaneously escapes to the side waveguides, while the pump light concentrates at the original waveguide. Accordingly, the amplification of the laser light and the generation of the laser light are performed at the original waveguide. In this case, by taking out the laser light from the side waveguides, there is less effect on the pump light and laser light in the region of production of the laser light and therefore the effect of phase distortion is reduced and the risk of oscillation stopping becomes smaller.

Example 12

Next, an embodiment of the specific structure of the example of FIG. 17(c) will be shown.

Figure 20:
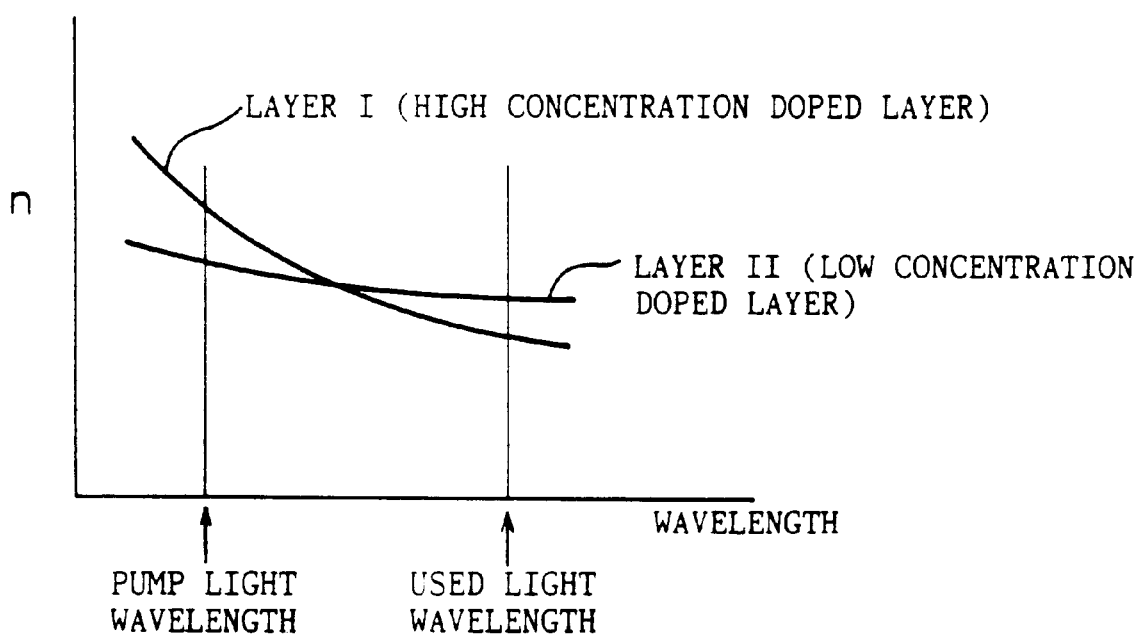
FIG. 20 is a graph showing the relationship between the indexes of refraction of two types of layer materials forming the waveguide optical amplifier and waveguide laser and having different distributions of indexes of refraction and the wavelength of the light.

For example, to make the structure shown in FIG. 17(c), it is possible to use the waveguide having the dispersion of the index of refraction shown in FIG. 20. Below, the high concentration doped region in the figure will be referred to as the layer I and the nondoped or low concentration doped region as the layer II.

For example, use is made of a polyimide material as the layer I (rare earth doped polymer prepared by vapor phase growth method as explained later). As the layer II, it is possible to use a mixed film, solid solution film, or multi-layer film of, for example, $Al_2O_3$ and $SiO_2$. Here, if the rare earth ion is made $Tm^{3+}$, the pump light becomes 0.68 nm and $\lambda$ becomes about 0.8 nm. The index of refraction of the polyimide film becomes n (0.68 nm)=1.65 and n (0.8 nm)= 1.60, the index of refraction of the $Al_2O_3/SiO_2$ film becomes, by adjusting the ratio between $Al_2O_3$ and $SiO_2$, n (0.68 nm)=1.62 and n (0.8 nm) =1.62 at about 1:1, and it is possible to satisfy the conditions of the above figure.

Instead of $Al_2O_3/SiO_2$, it is possible to use a polymer per se with a smaller dispersion of the index of refraction than the above-mentioned polyimide, for example, a siloxane resin, silicone resin, or other copolymer. A transparent polyimide having a wider energy gap than the usual polyimide is also possible.

By this, the light of $\lambda$ amplified by the pump light at the layer I moves to the layer II. Therefore, $\lambda$ can an be propagated without passing through a layer doped with ions to a high concentration, so the reabsorption of $\lambda$ can be suppressed. Further, if an optical switch is provided at the layer II side, only the light of $\lambda$ is switched and taken out (since the pump light is sealed in the layer I). Therefore, a branching function is naturally provided.

Example 13

Figure 19:
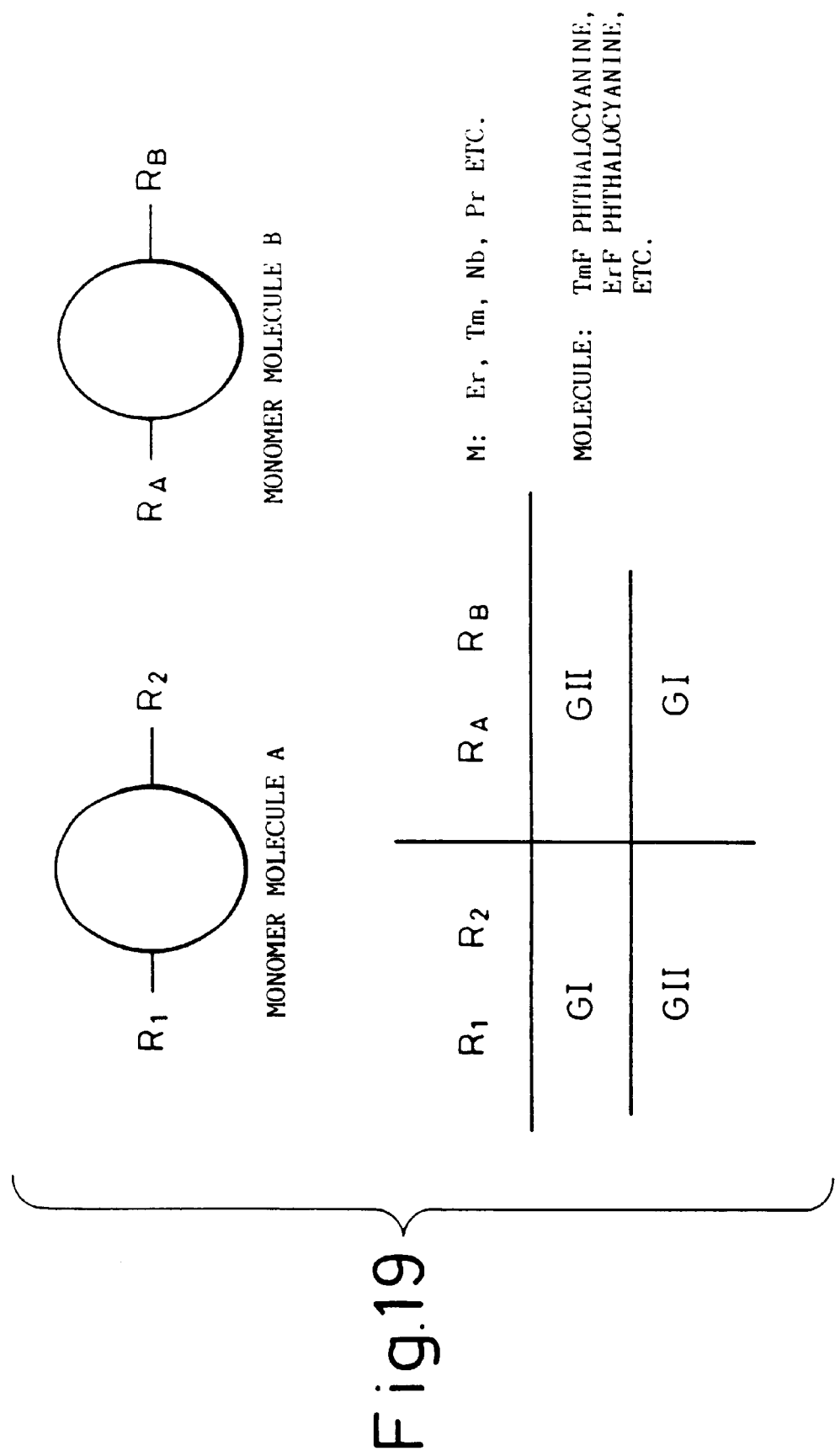
FIG. 19 is a view schematically showing a monomer molecule used for incorporating a rare earth ion in a polymer.

Next, the material in which an organic rare earth is included is schematically shown in FIG. 18(A). In this example, a molecule M including one or a plurality of rare earth ions ($M^{3+}$) is used. $M^{3+}$ may be incorporated in the form of a halide, oxide, sulfide, oxyhalide, or sulfohalide. Any shape of molecule is possible, but a form with the ions introduced in a ring shaped or spherically shaped molecule is preferable to reduce the interaction among rare earth ions as much as possible and suppress the deactivation of the excited electrons. For example, as examples of the molecules, there are phthalocyanine and porphyrin. A molecule containing a number of rare earth ions is also acceptable. For example, since phthalocyanine has a coordination number of 2, it is possible to introduce a trivalent rare earth in the form of MF or MCl. The molecule is added as a polymer side chain (FIG. 18(B)) or introduced into the main chain (FIG. 18(C)). Unlike a conventional material (Japanese Unexamined Patent Publication (Kokai) No. 4-12333) where the molecule is dispersed in the polymer, it is possible to introduce a high concentration of rare earth ions while maintaining the distance between ions. It is possible to produce a polymer as shown in FIG. 18 by adding the groups belonging to the two groups shown in Table 1 to the molecules and by a usual polymerization reaction (FIG. 19). In particular, it may be formed by vapor deposition polymerization, CVD, MLD, MBD, and other vapor phase film forming methods.

Example 14

Below, an example of vapor phase film formation will be shown.

The explanation will be made of the case of making the monomer molecule A of FIG. 19 a phthalocyanine molecule including a rare earth ion, for example making $R_1$ and $R_2$ an amino group, and making the molecule B a dianhydrous pyromellitic acid. A quartz cell containing powder of the molecules A and B is heated and the contents gasified and introduced into a vacuum chamber. The crucible of the molecule A is heated to 100 to 250° C. and the crucible of the molecules B to 80 to 150° C. The substrate temperature is for example 150° C. By this, the molecules A and B are alternately bonded and a polymer film grown on the substrate placed in the chamber (heat oxidized Si wafer) by the reaction of the amino group and anhydrous dicarboxylic acid group. Further, it is possible to obtain a polyimide containing rare earth ions by annealing this at 250° C. for 2 hours. The polyimide film is used as a film for the waveguide optical amplifier or waveguide laser of the present invention.

If $R_1$ and $R_2$ are made —$NH_2$ groups, $R_A$ and $R_B$ are made —CHO groups, the molecule B is made terephthalaldehyde, the substrate temperature is made 100° C., the cell of the molecule A is made 100 to 250° C., and the cell of the molecule B is heated to 60° C., it is possible to obtain a polyazomethine film including rare earth ions.

In addition, a polymer can be formed by selecting and reacting $R_1$ and $R_2$ from GI (GII) and $R_A$ and $R_B$ from GII (GI). Of course, it is possible to use molecules including rare earth ions such as porphyrin instead of phthalocyanine.

Further, when use is made of an epoxy group for $R_1$, and $R_2$ ($R_A$, $R_B$), it is possible to make $R_A$, $R_B$ ($R_1$, $R_2$) —$NH_2$ and make either one the same.

It should be noted that the meanings of GI and GII in FIG. 19 are as shown in the following table:

| GI<br>Base Group I (GI) | GII<br>Base Group II (GII) |
|---|---|
| [anhydrous dicarboxylic acid structure] *) | —NH2<br>—NHSI(CH$_3$)$_3$<br>—OH |
| | —COCl<br>—NCO<br>—CHO<br>—COOH |
| | [epoxy structure] |

*)Anhydrous dicarboxylic acid group

Further, needless to say, $R_1$, $R_2$ ($R_1$, may even equal $R_2$) may be mutually reacting functional groups (vinyl group, methacrylic group, acrylic group, etc.) and the rare earth ion may be included in the monomer molecule A to make a polymer.

Also, if a film for a waveguide optical amplifier or waveguide laser is formed on a prepatterned underlying film such as an inclined evaporation formed film of a dielectric or a rubbed organic film, it is possible to give the polymer chain orientation and naturally form a waveguide.

Example 15

Next, an explanation will be given of an example of a process for production of a waveguide optical amplifier or a waveguide laser of the present invention explained above.

In this process, use is made of materials including a rare earth ion included as a halide, oxide, sulfide, oxyhalide, and/or sulfohalide. The matrix material is glass or a Group II-VI compound or polymer. Specifically, a film for a waveguide optical amplifier or waveguide laser is formed on the substrate by sputtering a glass or Group II-VI compound target including a halide, oxide, sulfide, oxyhalide, and/or sulfohalide of a rare earth ion.

For example, use is made of an Nd ion-added laser glass (HOYA LHG-5, $Nd_2O_3$; 3.3 wt %) as a target and a 1 to 10 $\mu$m film is formed on a quartz substrate by the sputtering method. Reactive ion etching (RIE) or wet etching is then used to form a channel waveguide and form dielectric multilayer reflecting films at the two end surfaces of the same to thereby produce a resonator structure. When pump light, i.e., LD light of 800 nm, is introduced to this, 1052 nm oscillation light is obtained.

Here, the halides of rare earth ions include, for example, $ErF_3$, $PrF_3$, $NdF_3$, $TmF_3$, $YbF_3$, $TbF_3$, $HoF_3$, $SmF_3$, $PmF_3$, etc.

The oxyhalides, sulfohalides, etc. of rare earths include, for example, ErOF, PrOF, NdOF, TmOF, YbOF, TbOF, HoOF, SmOF, PmOF, ErSF, PrSF, NdSF, TmSF, YbSF, TbSF, HoSF, SmSF, PmSF, etc.

Examples of glass include borosilicate glass, phosphate glass, quartz, fluoride glass, fluorophosphate glass, laser glass, etc. Examples of Group II-IV compounds include ZnS, ZnSe, ZnO, SrS, CaS, etc.

The sputtering operation may be performed for example as follows:

As the target, use is made of ZnS including 5 molar percent of TmOF. The substrate is a heat oxidized Si wafer. The substrate temperature was made 300° C.

For the sputtering, first a vacuum is created to $10^{-6}$ Torr. Next, a gas (a mixed gas of 30% Ar and 70% He) is introduced to a gas pressure of $10^{-3}$ to $10^{-2}$ Torr and a plasma is created by RF (high frequency). The RF power is suitably 50 to 1000W/100 cm$^2$. The film is formed while monitoring the film thickness by a sputter sensor.

The resultant film is annealed at 500 to 700° C. for one hour.

Further, the film may be formed by multitarget sputtering using a target of the above-mentioned inorganic compound and a target of a glass or Group II-VI compound.

As a target, use was made of TmOF and ZnS. The substrate was a heat oxidized Si wafer. The substrate temperature was made 300° C. For the sputtering, a vacuum was created to $10^{-6}$ Torr, then a mixed gas of 30% Ar and 70% He was introduced. The gas pressure was $10^{-3}$ to $10^{-2}$ Torr. The RF power was applied independently to the targets. Five to 500W was introduced to the TmOF and 50 to 1000W to the ZnS. The substrate was alternately moved on the ZnS and TmOF targets to form the film. The amount of TmOF in the ZnS was controlled by the RF power, the residence time of the substrate on the target, and the magnitude of the projections on the target. The suitable amount was about 5 mole % to 10 mole %. The amounts of molecules flying from the targets were independently monitored by setting film thickness monitors for each of the same.

Further, it is possible to form a film by evaporation of a glass or Group II-VI compound source containing the above-mentioned inorganic compound.

A ZnS:TmOF (content of TmOF 5 mole %) was subjected to EB evaporation in a vacuum of $10^{-6}$ Torr. The substrate temperature was 300° C. and the substrate was the same as in the case of sputtering.

Further, it is possible to form a film by multisource evaporation using a source of the above-mentioned inorganic compound and a source of glass or a Group II-VI compound.

The ZnS target and TMOF target were independently heated to evaporate by EB to form the film. The amounts of flying molecules were monitored independently by separate film thickness monitors.

Here, in both the case of sputtering and evaporation, a uniform dispersion can be easily obtained by alternately exposing the substrate to the flying matter from the targets or sources.

On the other hand, when a polymer is used as the matrix material, it is possible to form a film by simultaneously or alternately supplying a halide, oxide, sulfide, oxyhalide, and/or sulfohalide and supplying a polymer and/or supplying a monomer serving as the material for the polymer. Note that, in particular, it is easy to obtain excellent characteristics if the halogen is fluorine.

It is also possible to performing multitarget sputtering using a rare earth target or a Group II-VI compound target or perform multisource evaporation using a rare earth source or a Group II-VI compound source. A good dispersion can be realized by alternately exposing the substrate to the flying matter from the targets or the sources.

Further, it is effective to suitably introduce oxygen, water, hydrogen sulfide, and the like to improve the film quality and create a plasma. Annealing at above the film formation temperature further improves the film quality.

Further, it is possible to form the waveguide of the present invention by forming in advance on the substrate a region with a high or low index of refraction and forming a film over the same.

For example, a waveguide with an index of refraction higher than the surroundings may be formed on a glass substrate by the ion exchange method, ion implantation method, etc. It is also possible to make a waveguide amplifier/waveguide laser by forming a film for a waveguide amplifier/waveguide laser over the same.

As the substrate, in addition to bulk glass it is possible to form a waveguide with an index of refraction higher than its surroundings of the same type as above by forming a dielectric film of $SiO_2$ or a polymer film on Si or glass and then using photolithography to place a film of a different composition and type partially on the same. It is possible to form a desired waveguide optical amplifier/waveguide laser by similar processing as above.

Example 16

FIG. 21 shows an example of an optical LSI comprised of an LSI on which are superposed a cladding, waveguide, and cladding and performing optical wiring between the same. In this example, a usual secondary or tertiary nonlinear optical material, for example, an electro-optic polymer, conjugated polymer, nonlinear optical glass, semiconductor, etc. is used for the waveguide. These materials may be selected from to make the materials partially different. Details of the LSI are not shown. The unevenness of the LSI is not shown either, but optical wiring is possible overcoming the unevenness by waveguides with good step coverage such as polymer waveguides formed by organic CVD and glass waveguides formed by CVD.

If a voltage occurs across the electrodes of an LSI, part or almost all of the light which is supplied is reflected and is picked up by the signal transmission waveguide. The optical switch used here may be a conventional directional coupling switch or a Mach-Zehnder type element etc., but preferably it is an optical modulator-optical switch such as in FIG. 22 operating using the reflected light resulting from the step difference in the index of refraction at the optical waveguide due to application of voltage or any optical modulator-optical switch operating using the resultant leakage of light caused by opening a window in the index of refraction in the cladding as a result of application of voltage. Since the amount of pickup is modulated by the voltage, the output voltage becomes an optical signal and is propagated through the waveguide to reach the light receiving element (PD etc.) There, it is opto-electrically converted and output as voltage to the input electrode of the LSI.

Here, there is no need to make the entire waveguide a nonlinear optical material. It is sufficient to give nonlinear optical characteristics to the switch portion alone. In this case, as the passive waveguide, use may be made of a fluorinated polymer, glass, etc. Here, the output electrode and the input electrode are not absolutely necessary. It is also possible to apply the voltage of the transistor as is to the waveguide or drive the receiving side transistor by the charge generated by the light receiving element itself. By providing a matrix optical switch in the middle of the signal waveguide, switching between signal wirings becomes possible and the degree of freedom of wiring can be increased.

FIG. 23 shows a system where provision is made of a light power source using a waveguide laser-amplifier comprised of a rare earth ion doped glass or polymer or ceramic and the light from there is picked up. The light power source and the signal waveguide do not necessarily have to be superposed and can be on the same plane as well. Further, the signal may be passed not only through the optical waveguide, but also through space, a medium space, or a fiber. Sometimes, it is also possible to do this by a pickup from a waveguide passing DC laser light, but there is the unavoidable effect that the amount of the light falls the further downstream one goes. Accordingly the method of using a light power source is much more superior.

Figure 24A:
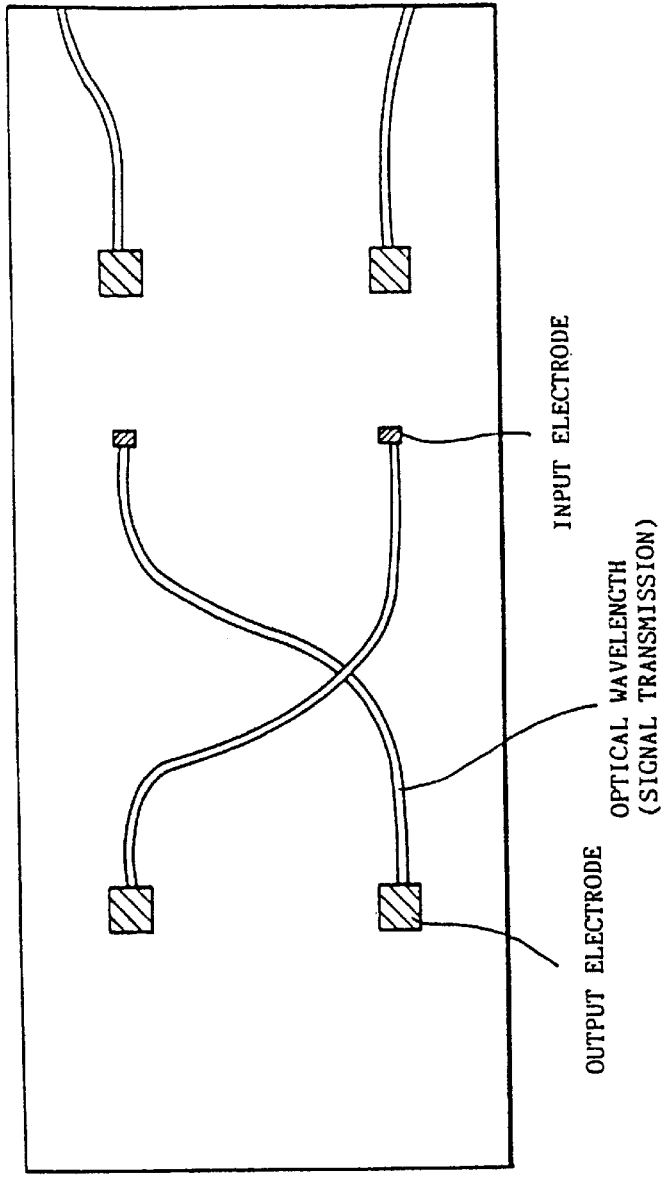
FIG. 24 is a view showing an example of an optical LSI using a polymer waveguide (with a PD formed in the LSI)
Figure 24B:
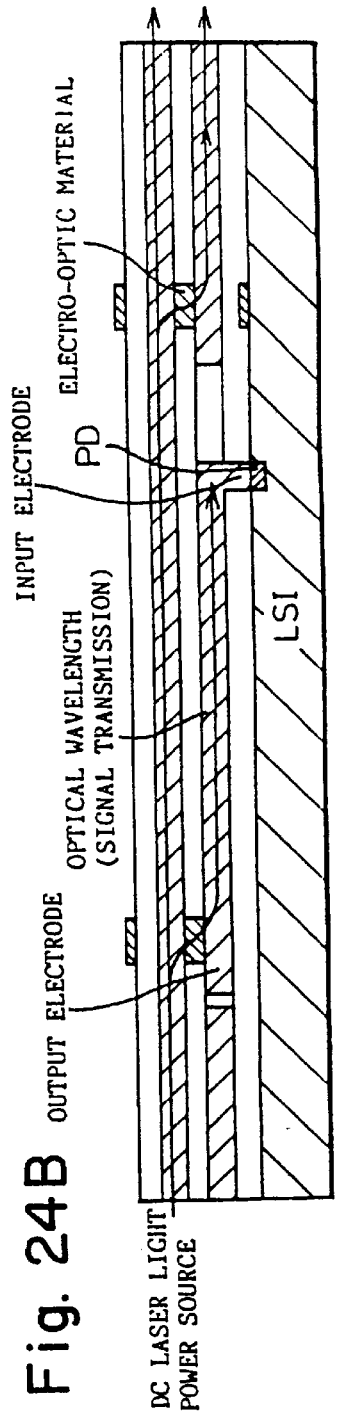

FIG. 21 and FIG. 23 show the example of the formation of light receiving element in a manner cutting across the inside of the waveguide. A photodiode, phototransistor, MSM detector, etc. comprised of amorphous silicon, polycrystalline silicon, or a conjugated polymer is suitable. The mode of formation of the light receiving element is not limited to the above mode. It may be formed above or below the waveguide to absorb light from the waveguide. Further, it is possible to form a PD on the LSI substrate to receive light as shown in FIG. 24.

In the case of using a polymer waveguide, since formation is possible even with unevenness in the surface of the LSI, the vapor deposition polymerization method, the CVD method, the MLD method and other vapor phase film formation methods are effective. For example, use may be made of the method described in Japanese Patent Application No. 4-179909 filed Jul. 7, 1992 (an optical waveguide formed on a substrate and comprising a polymer film formed by vapor phase growth or comprising mainly the same, which optical waveguide is formed by forming a patterned organic or inorganic thin film on a substrate, then selectively orienting and forming by vapor phase growth a polyimide film on the patterned thin film, thereby giving an organic polymer film superior in stability, with little optical scattering, and with little absorption loss, and a method enabling the efficient production of such optical waveguides).

Figure 25:
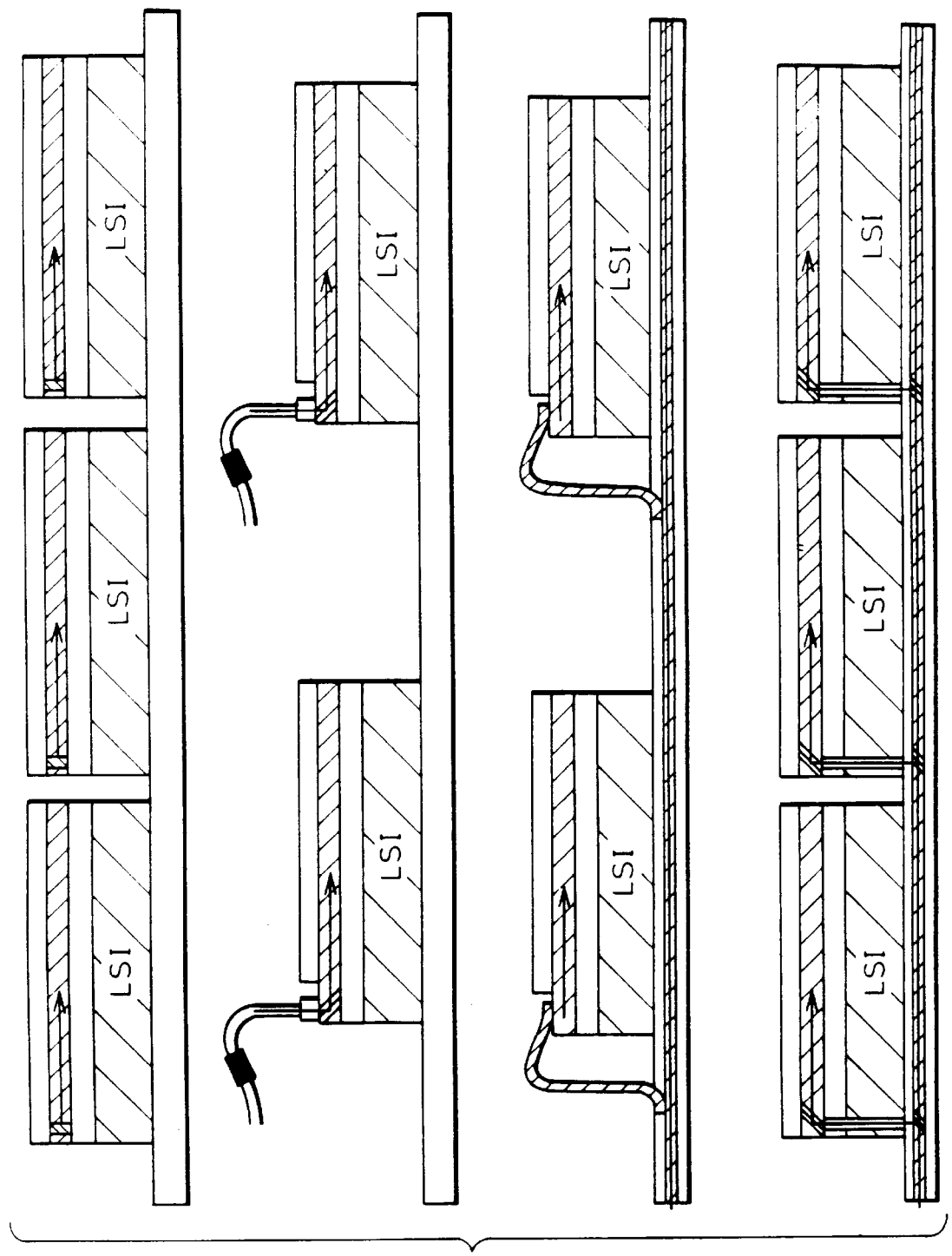
FIG. 25 gives views showing examples of the introduction of light to the optical LSI or the emission of light from the LSI (a plurality of LSI's being incorporated inside).
Figure 26:
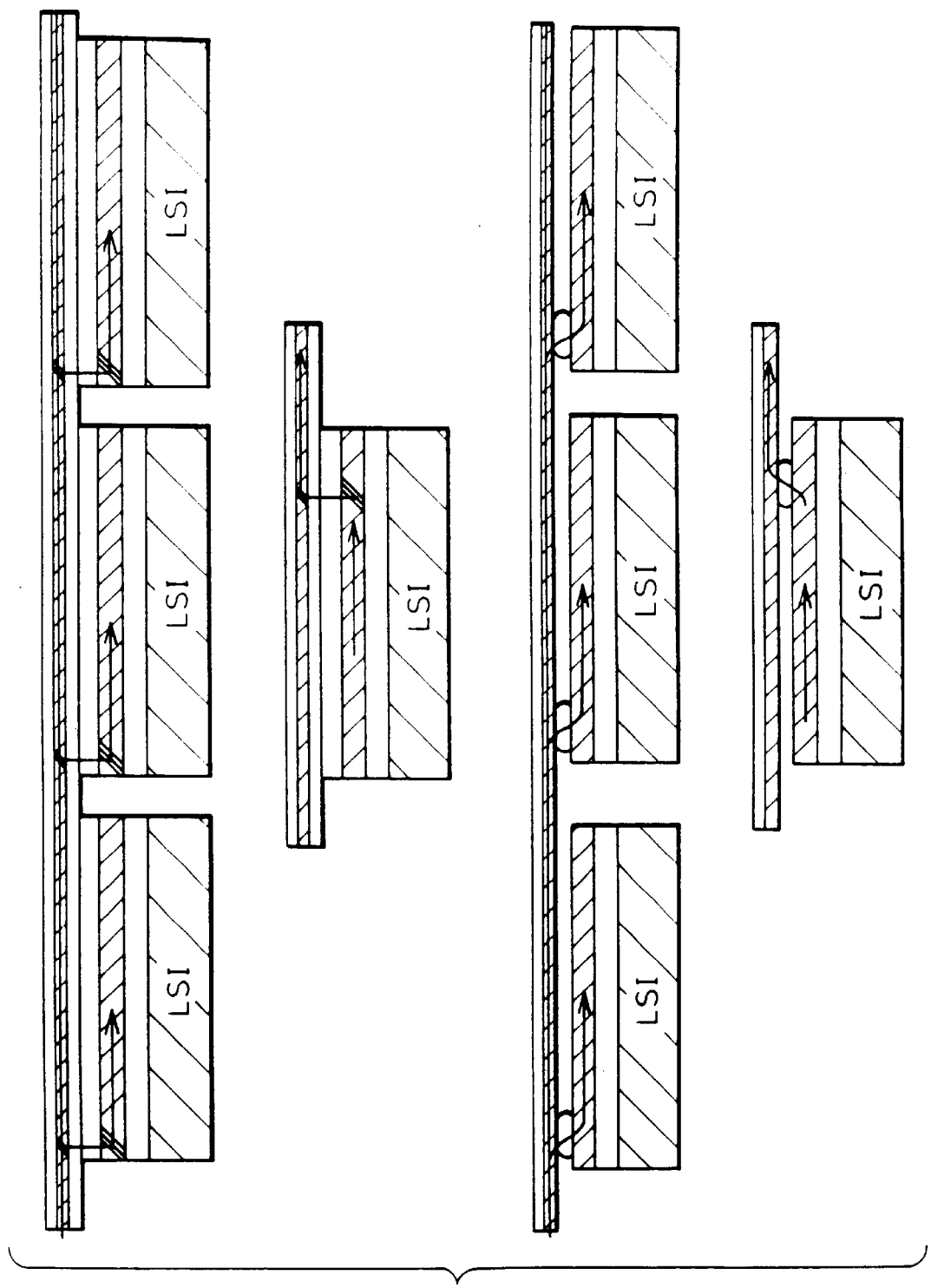
FIG. 26 gives views showing examples of an optical LSI introducing light by an HOE or optical solder or the like from the surface side.

The light power source may be activated as shown in FIG. 25 by using the light from several LD's incorporated in the LSI. Alternatively, use may be made of the method of introducing light from the outside through a connector by a fiber, the method of introducing light from a waveguide of the optical circuit substrate through an optical tab, or the method of direct introduction from the circuit substrate waveguide using a hologram, diffraction grating, reflection by a slanted surface, etc. Also, light may be introduced from the surface of the LSI using an HOE, optical solder, or the like. Introduction of light from the outside means there is no need to make a light source in the LSI, so little modification is needed in the design of LSI's. Further, since the heat source is attached outside, this is also effective for reducing the generation of heat of the LSI and therefore can be said to be a superior method.

By providing multiple layers of waveguides, the density of wiring can be improved. In an optical LSI, normal electrical wiring is also present. Accordingly, the wiring density can be improved by joint use for interlayer insulating film and waveguides.

Example 17

Figure 22:
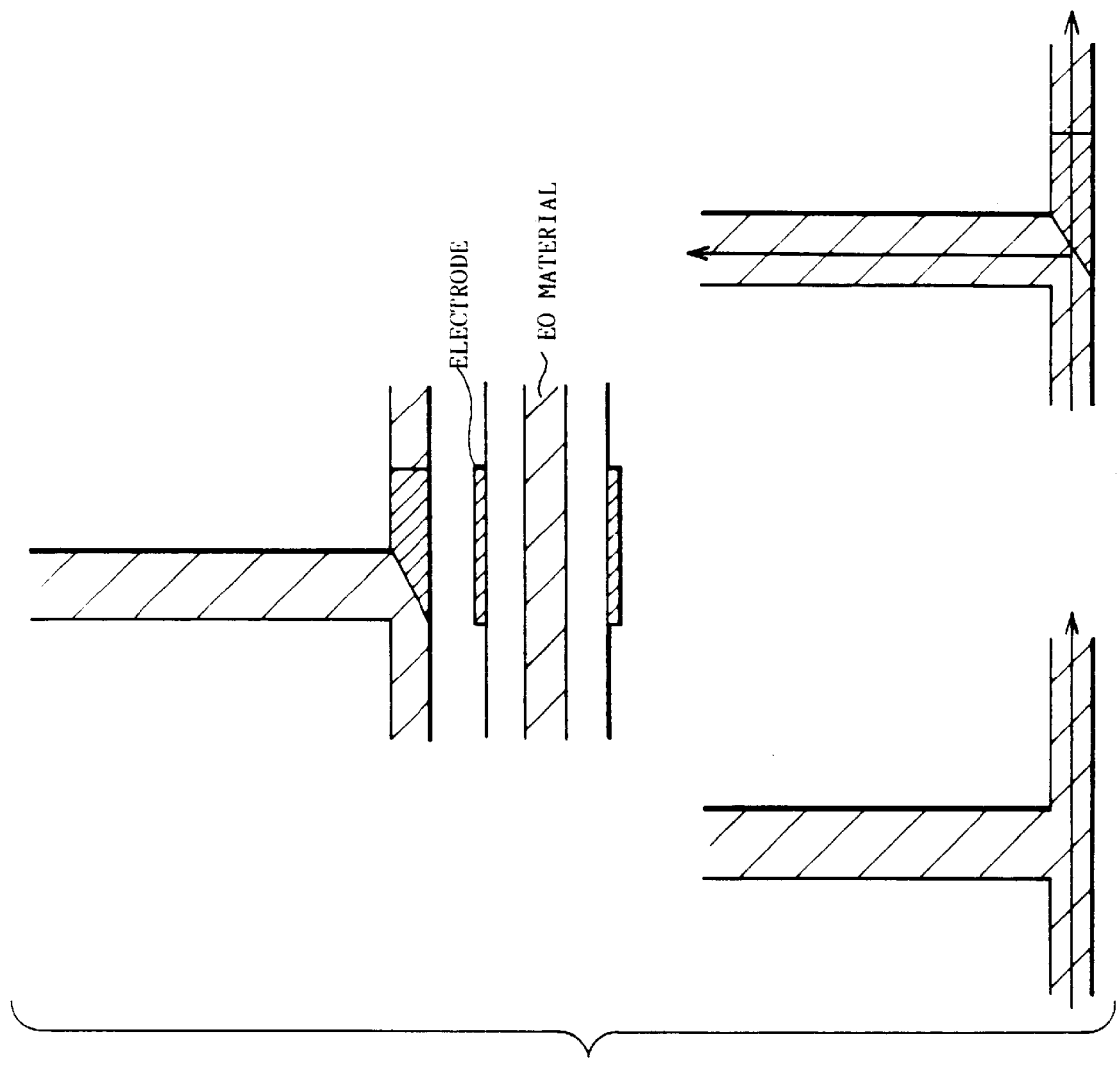
FIG. 22 is a view showing an example of an optical modulator and optical switch.
Figure 27:
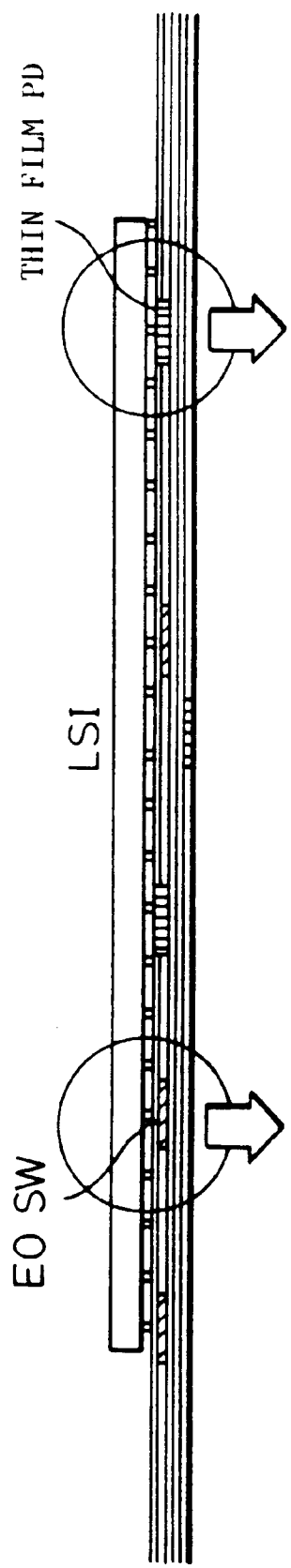
FIG. 27 is a view showing an example of an optical circuit substrate comprised of a cladding and waveguides superposed (monolithic type).
Figure 28:
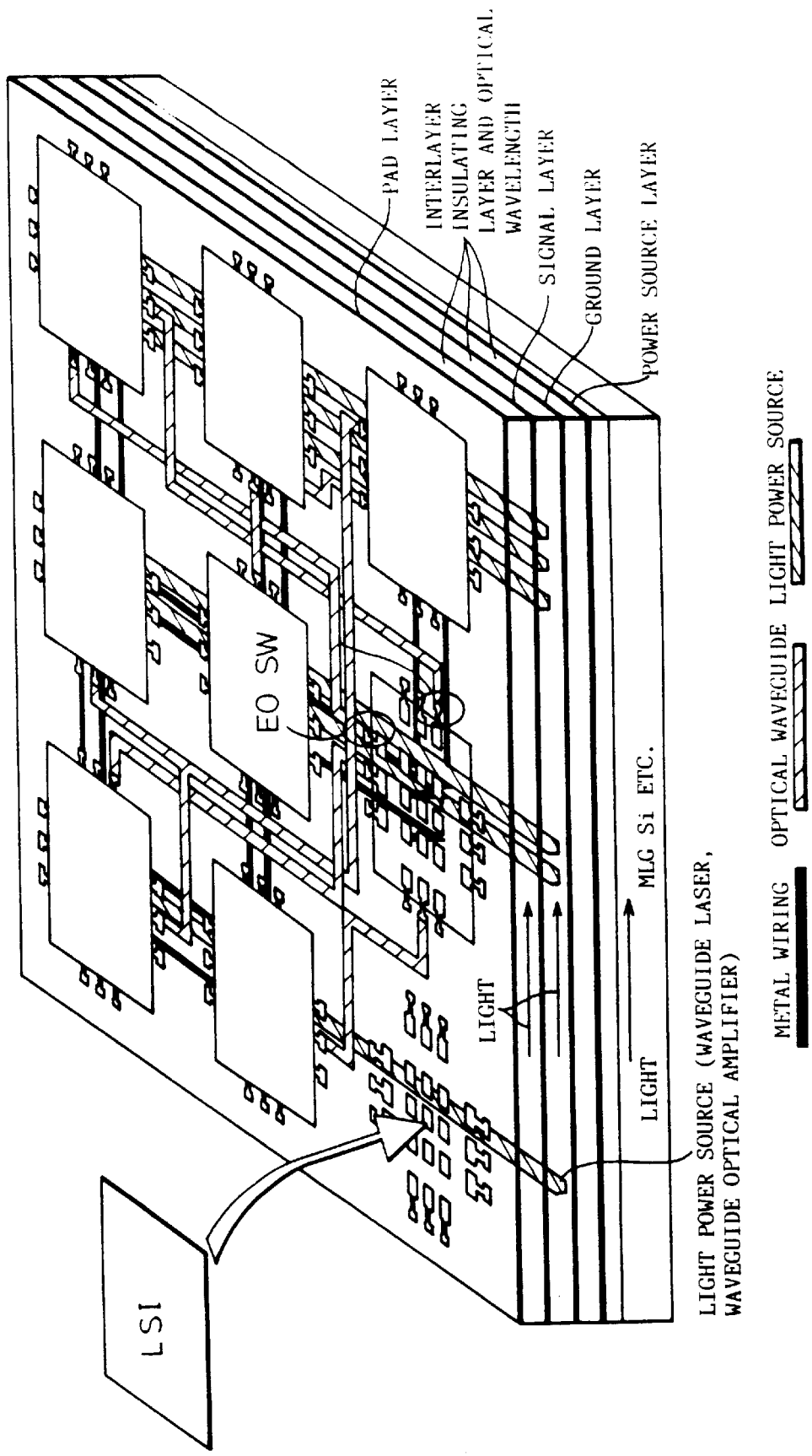
FIG. 28 is a view showing another example of an optical circuit substrate comprised of a cladding and waveguides superposed (monolithic type).

FIGS. 27 and 28 show examples of optical circuit substrates with superposed cladding and waveguides. Even in an optical circuit substrate, optical wiring is possible by substantially the same method as with an optical LSI. The biggest difference is that in an optical LSI, the optical switches and waveguides are formed on the LSI, while in an optical circuit substrate, these are on the optical circuit substrate and that LSI's and optical circuit substrate are coupled by electrical connection such as solder bumps. In this example, the usual secondary or tertiary nonlinear optical materials, for example, electro-optic polymers, conjugated polymers, nonlinear optical glass, semiconductors, etc. are used as the waveguides. Note that other than the switch portions, use may be made of passive waveguides such as polymers or glass. It is also possible to select from these materials and make the materials partially different. Further, while the unevenness of the optical circuit substrate is not shown, optical wiring is possible overcoming the unevenness by waveguides with good step coverage such as polymer waveguides using organic CVD or glass waveguides using CVD. The LSI's are mounted on the optical circuit substrate by solder bumps. If a voltage occurs across the electrodes of an LSI, as shown in FIG. 22, part or almost all of the light of the light power source is reflected and is picked up by the signal transmission waveguide. The optical switch used here is not limited to one of the shape shown in FIG. 22, but may be any optical modulator-optical switch operating using the resultant reflected light caused by the step difference in the index of refraction at the optical waveguide due to application of voltage, any optical modulator-optical switch operating using the resultant leakage of light caused by opening a window in the index of refraction in the cladding as a result of application of voltage, a directional coupling optical switch, a Mach-Zehnder type modulator, etc. Since the amount of pickup is modulated by the voltage, the output voltage becomes an optical signal and is propagated through the waveguide or space or a spatial medium to reach the light receiving element (PD etc.) There, it is opto-electrically converted and output as voltage to the input electrode of the LSI. Here, there is no need to make the entire waveguide a nonlinear optical material. It is sufficient to give nonlinear optical characteristics to the switch portion alone. In this case, as the passive waveguide, use may be made of a fluorinated polymer, glass, etc. Here, the output electrode and the input electrode are not absolutely necessary. It is also possible to apply the voltage of the transistor as is to the waveguide or drive the receiving side transistor by the charge generated by the light receiving element itself. By providing a matrix optical switch in the middle of the signal waveguide, switching between signal wirings becomes possible and the degree of freedom of wiring can be increased.

The light power source and the signal waveguide do not necessary have to be superposed. They may be on the same plane as well. Further, the signal need not only be passed through an optical waveguide, but may also be passed through space, a medium space, or fiber.

The light receiving element may be formed in a manner cutting across the inside of the waveguide or may be formed above or below the waveguide to absorb light from the waveguide. Further, it is possible to form a PD on the LSI substrate to receive light. A photodiode, phototransistor, MSM detector, etc. comprised of amorphous silicon, polycrystalline silicon, or conjugated polymer is suitable.

In the case of using a polymer waveguide, since formation is possible even with unevenness in the surface of the optical circuit substrate, the evaporation polymerization method, the CVD method, the MLD method and other vapor phase film formation methods are effective. For example, use may be made of the method described in Japanese Patent Application No. 4-179909 mentioned earlier.

The light power source may be activated by using the light from several LD's incorporated in the optical circuit substrate. Alternatively, use may be made of the method of introducing light from the outside through a connector by a fiber, the method of introducing light from a waveguide of the backplane optical circuit substrate connecting to the circuit substrate through an optical tab, or direct introduction from the circuit substrate waveguide using a hologram, diffraction grating, reflection by a slanted surface, etc. Also, light may be introduced from the surface or the side surface of the optical circuit substrate using an HOE, optical solder, or the like. Introduction of light from the outside means there is no need to make a light source in the optical circuit substrate, so little modification is needed in the design of conventional circuit substrates. Further, since the heat source is attached outside, this is also effective for reducing the generation of heat.

By providing multiple layers of waveguides, the density of wiring can be improved. In an optical circuit substrate, normal electrical wiring is also present. Accordingly, the wiring density can be improved by joint use for interlayer insulating film and waveguides.

Further it is possible to take over the function of the wiring in the LSI by the optical circuit substrate. For example, a waveguide for passing DC laser light, preferably a light power source, is disposed and the light from there is picked up and received by a light receiving element corresponding to an input terminal in the same LSI. By using this technique, it is possible to form wiring in an LSI without changing the CMOS itself and possible to disperse risks in the LSI and circuit substrate, so this is effective in reducing costs as well. In particular, it is effective for long distance wiring such as clock lines and bus lines.

The backplane optical circuit substrate will not be explained in detail here, but it can be realized in the same manner as an optical circuit substrate in terms of structure and materials. The difference is that the main devices which are mounted are LSI's in the case of an optical circuit substrate and are boards (MCM) and other optical circuit substrates in the case of a backplane optical circuit substrate. Therefore, the structure of the light coupling portion differs. This will be discussed later in more detail.

FIG. 29 shows an example of changing the light supplying power in accordance with the signal fanouts for the case of an optical LSI. For example, when there are three fanouts of signals, by introducing three times the light power source power as in the case of a single fanout, the amount of light at the light receiving portion can be made uniform. The same applies to optical circuit substrates and to backplane optical circuit substrates.

Example 18

Figure 30A:
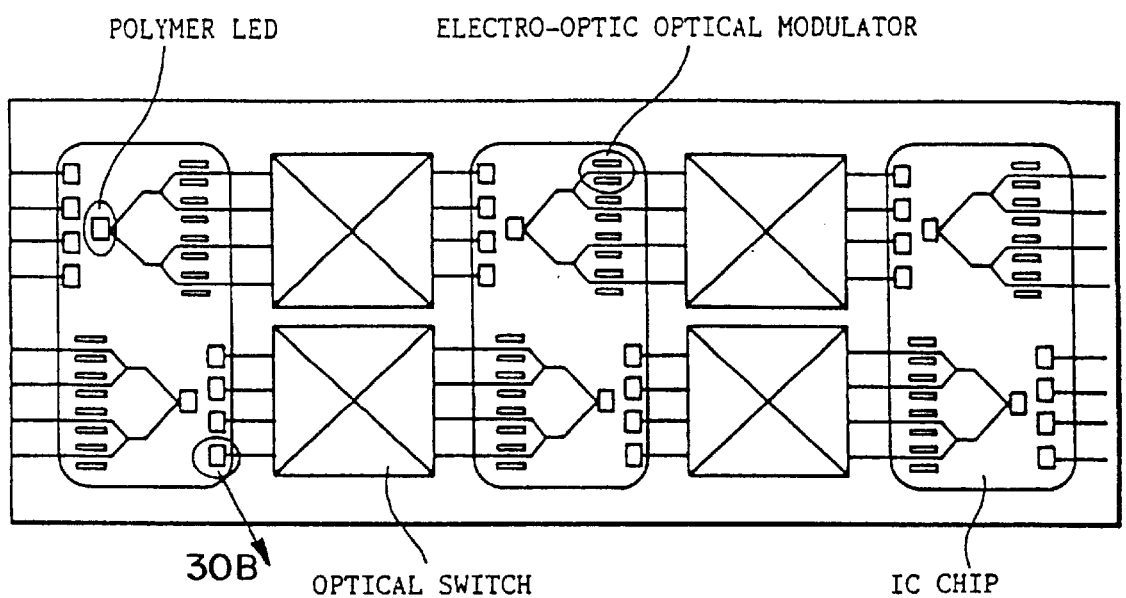
FIG. 30 is a view showing an example of a monolithic optical circuit substrate.
Figure 30B:
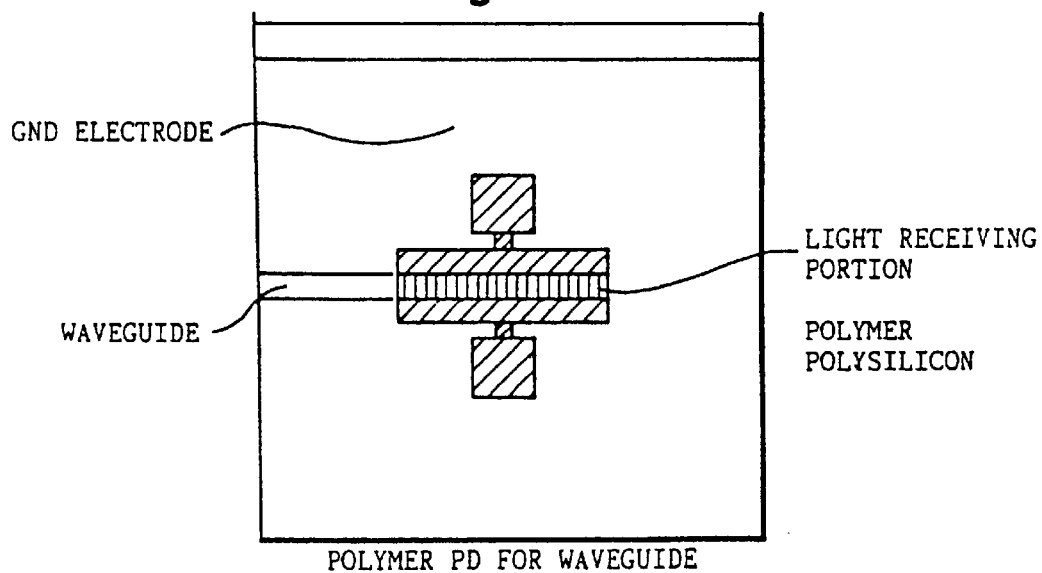
Figure 31:
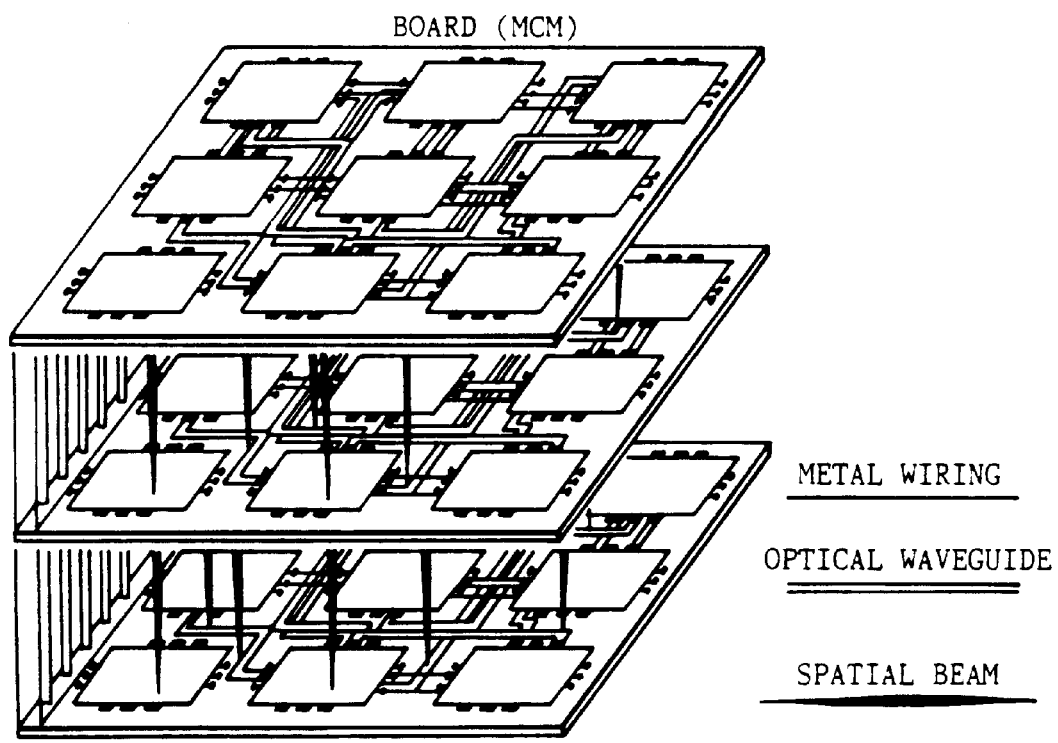
FIG. 31 is a view of the concept of three-dimensional packaging of optical circuit substrates.

FIG. 30 shows an example of a monolithic optical circuit substrate. FIG. 31 is a view of the concept of three-dimensional packaging of optical circuit substrates. Electrical wiring, waveguide wiring, and spatial beam wiring are mixed here. By making the spatial beams propagate through the polymer or glass layer, it becomes possible to achieve stable alignment and also by forming holograms, waveguides, and distributions of index of refraction in the medium, excellent beam control becomes possible.

Figure 32:
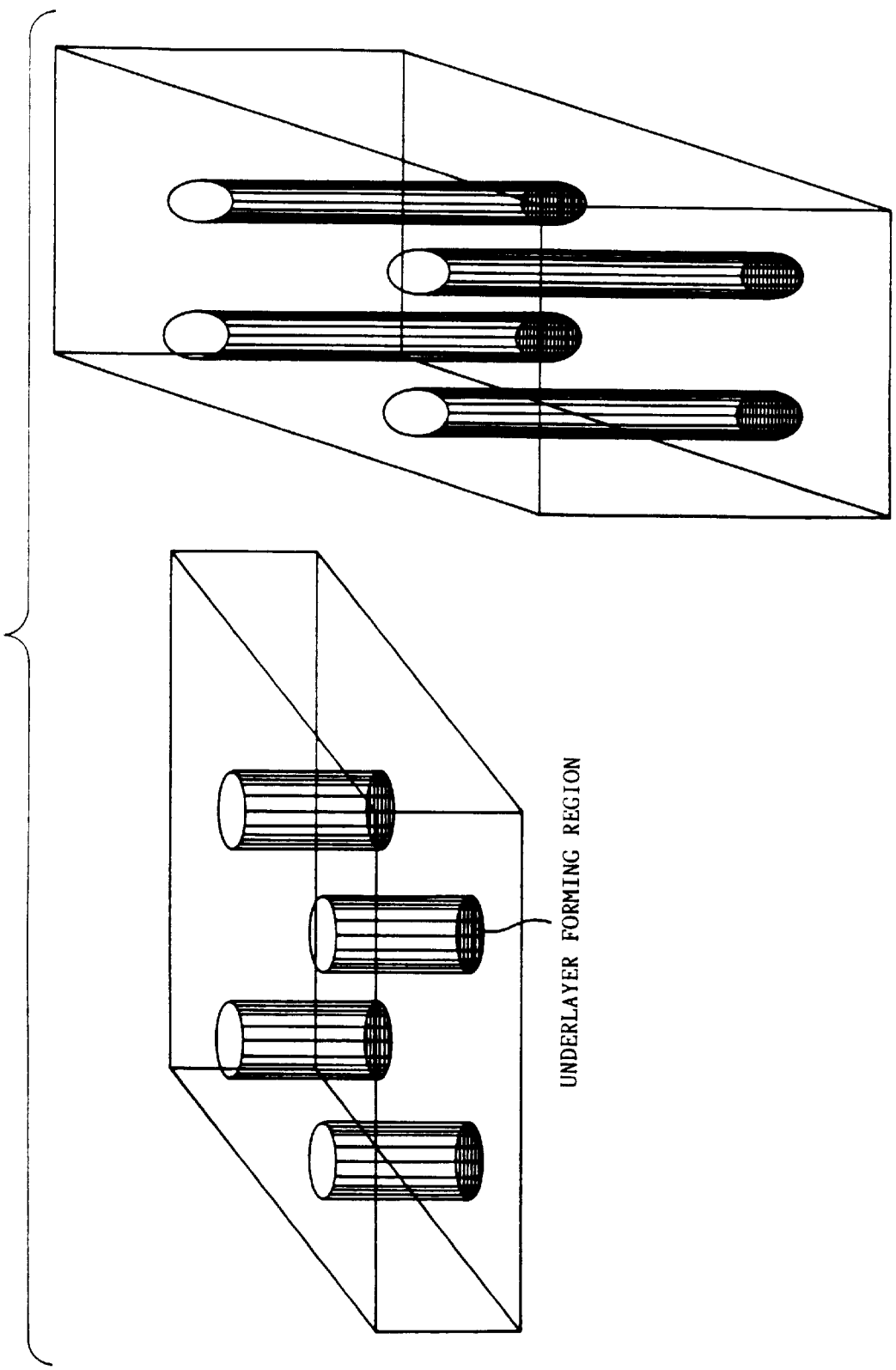
FIG. 32 is a schematic view of longitudinal direction waveguides.
Figure 33:
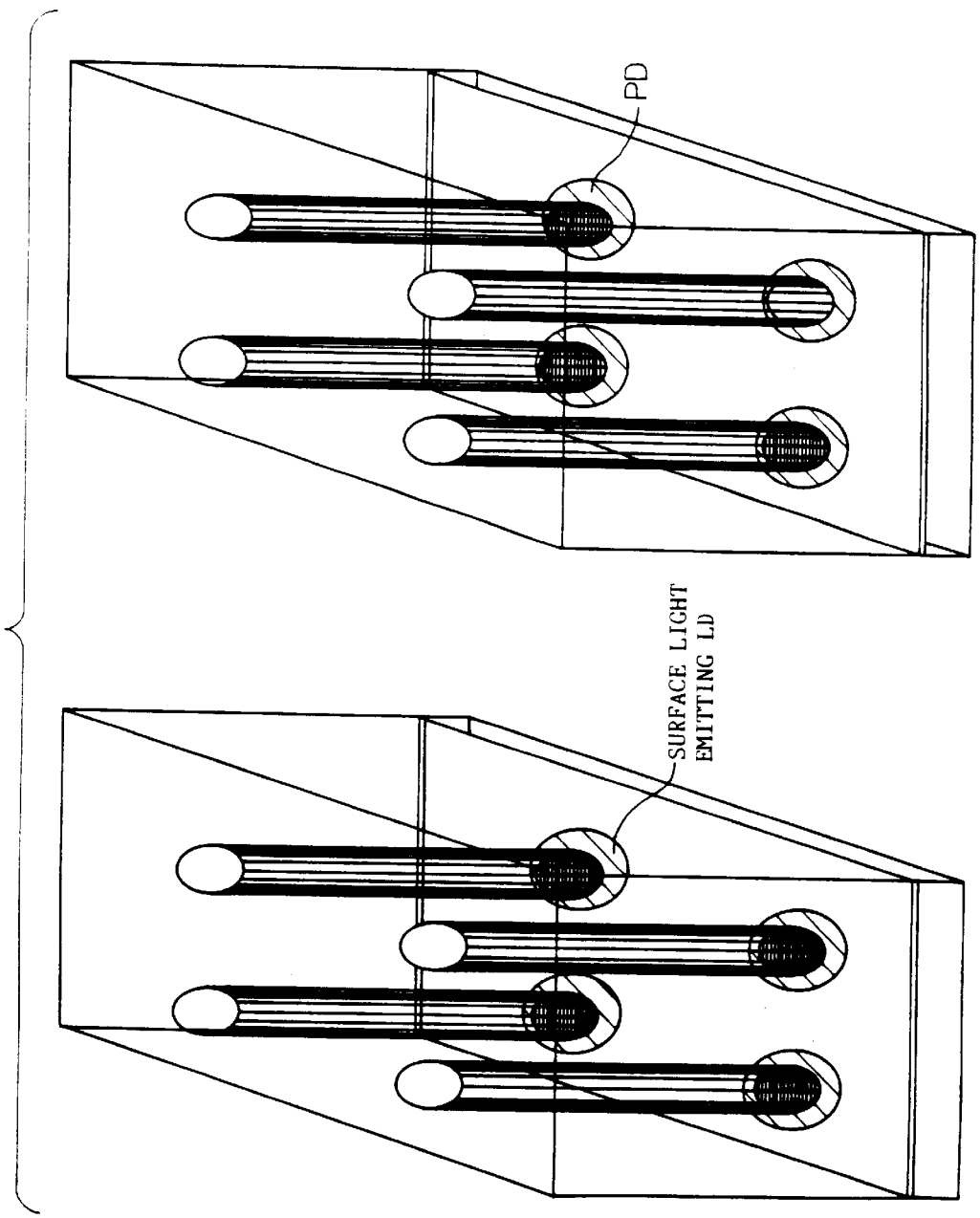
FIG. 33 is view showing an example of the provision of PD's and LD's on the ends of waveguides.
Figure 34:
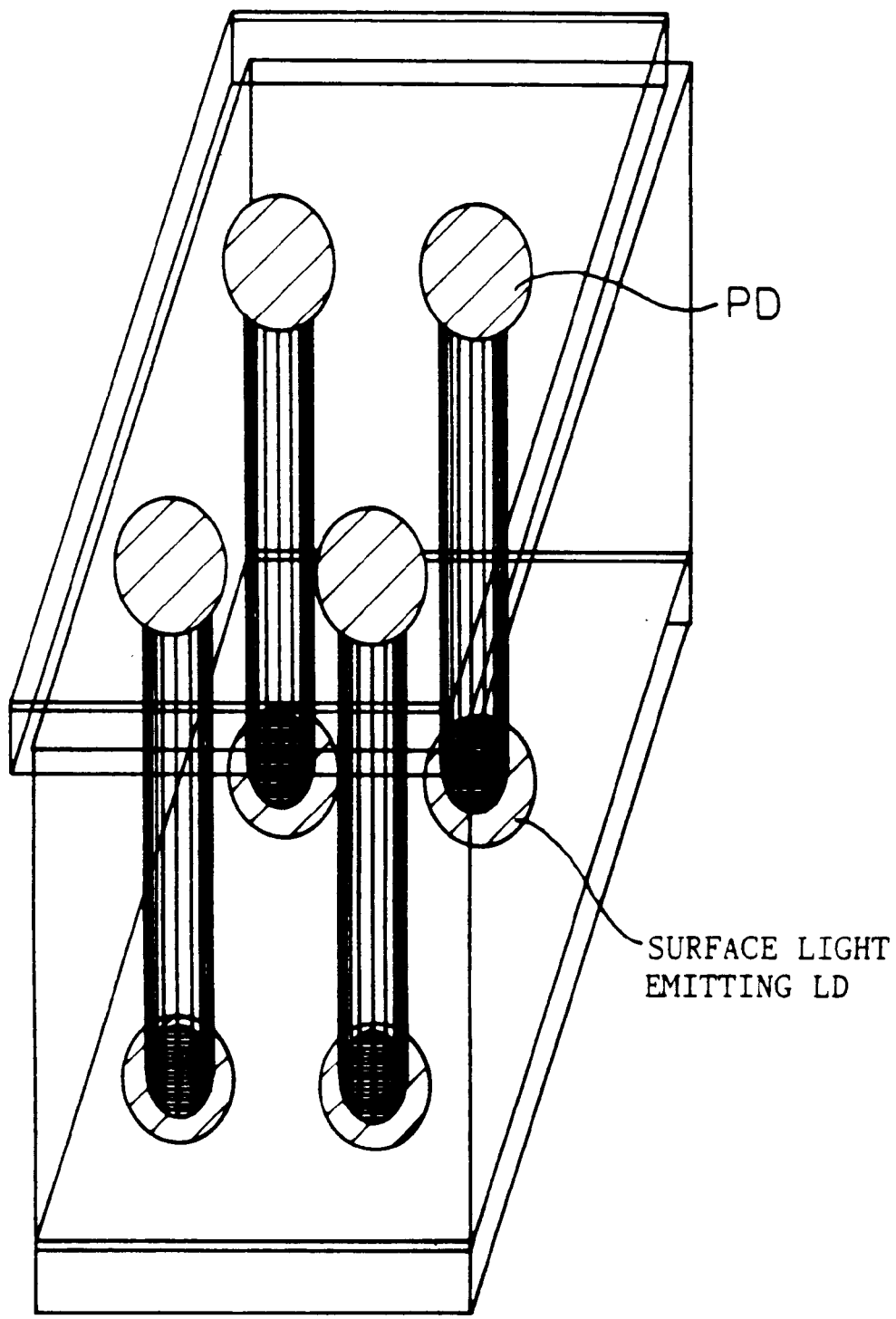
FIG. 34 is a view showing an example of the provision of PD's and LD's on the end of waveguides.
Figure 35:
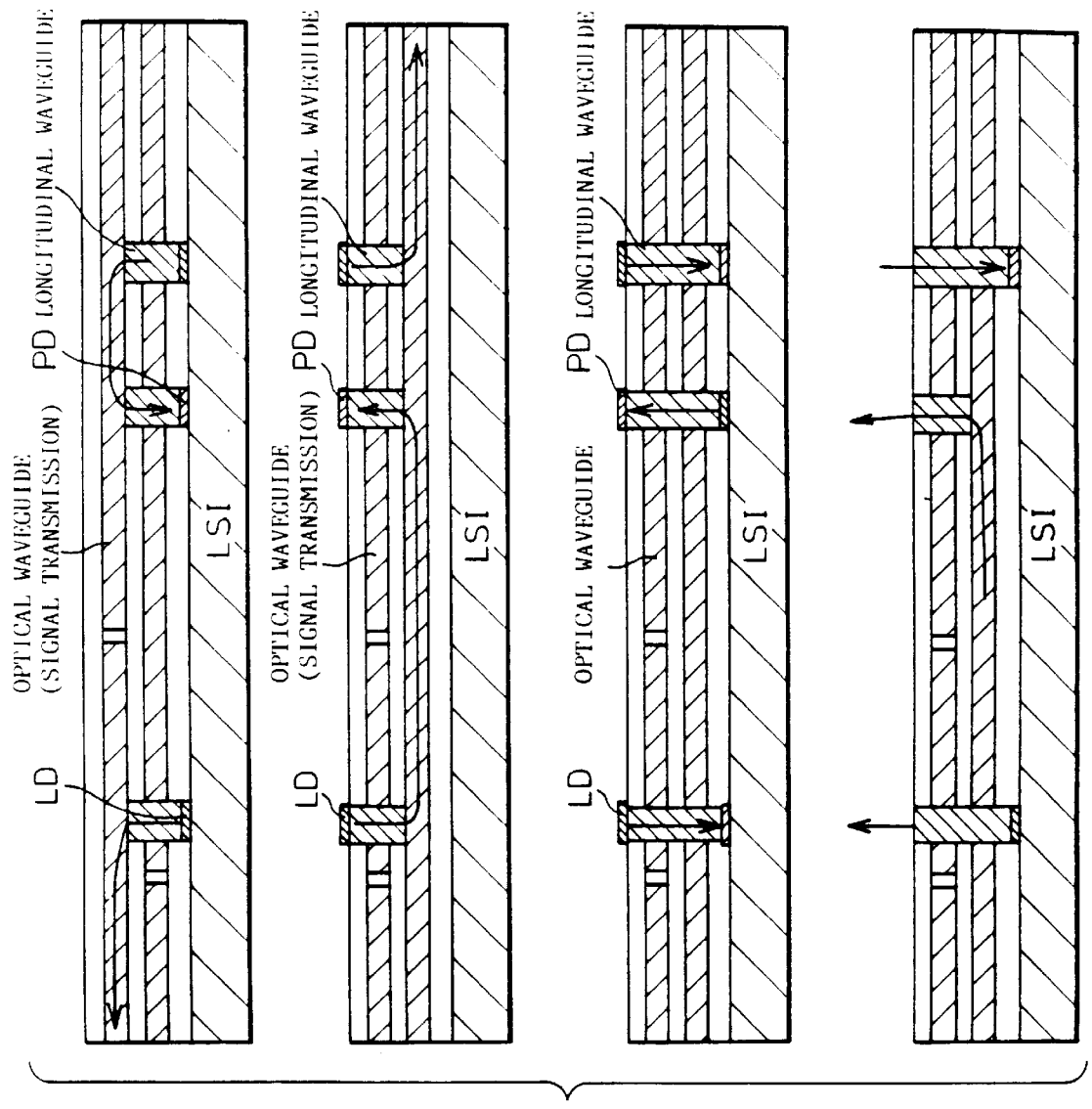
FIG. 35 gives views showing examples of the use of a longitudinal direction waveguide in an optical LSI.

FIG. 32 is a schematic view of longitudinal direction waveguides. As described in Japanese Patent Application No. 4-48961 filed Mar. 6, 1992 (U.S. Ser. No. 28550) (forming an organic or inorganic thin film pattern on a substrate or forming at least two types of organic or inorganic thin films of different types on the substrate or at least two types of organic or inorganic thin films of the same type, but different structures, patterning at least one of the types of the organic or inorganic thin films among them, and selectively forming an organic film on the patterned organic or inorganic thin film or selectively orienting the same), by causing vapor phase growth of a polymer on an $SiO_2$ slanted evaporation deposited film, polymer chains orient in the slanted direction of the substrate. By using this and forming an $SiO_2$ film at the location where it is desired to form a longitudinal direction waveguide, the polymer film on the $SiO_2$ is given a different orientation than the surrounding polymer film and the index of refraction becomes higher with respect to polarized electromagnetic radiation in the chain direction, thus forming a waveguide. When use is made of a polyazomethine CVD film using terephthaldehyde and paraphenylenediamine as sources, the index of refraction in the chain direction becomes about 1.9, the index of refraction in the direction perpendicular to the chain becomes about 1.6, and the index of refraction of the surrounding random film becomes in the middle of the two. Accordingly, this region becomes a waveguide with respect to polarized electromagnetic radiation in the chain direction. FIG. 33 and FIG. 34 show examples of provision of PD's and LD's at the ends of the waveguides. Further, FIG. 35 shows examples of use of the longitudinal direction waveguides in optical LSI's. When transmitting light with space, the efficiency is increased by disposing an HOE or microlens at the waveguide end or near the same. Further, the direction of emission of light can be controlled, The same thing is true for optical circuit substrates.

Figure 36A:
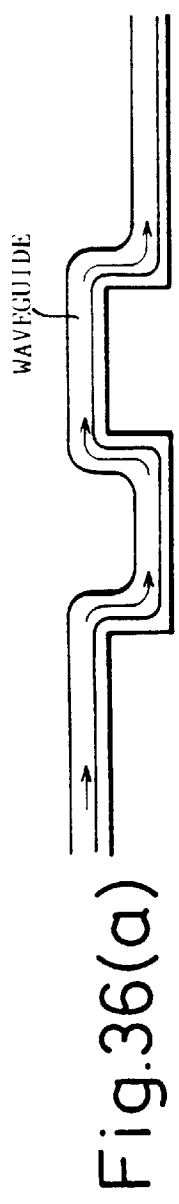
FIGS. 36(a), 36(b) and 36(c) give views showing examples of a longitudinal direction waveguide.
Figure 36B:
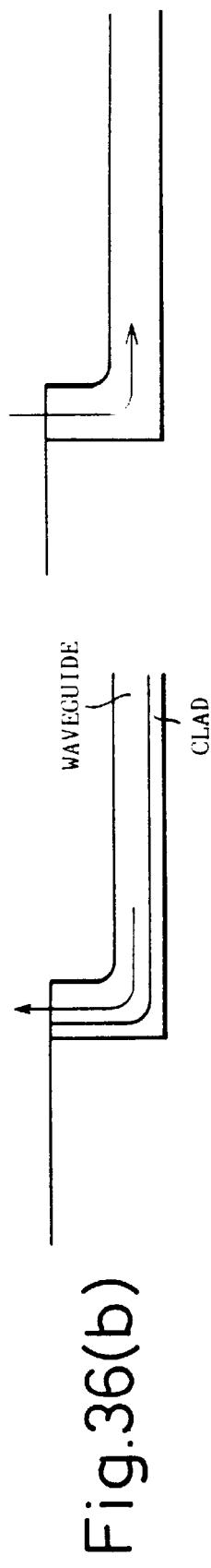
Figure 36C:
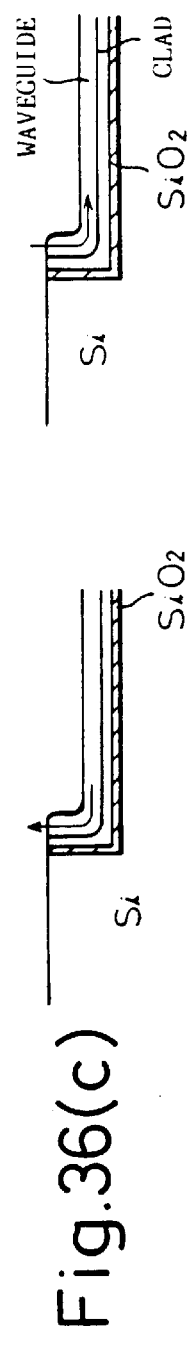

FIG. 36 shows examples of longitudinal direction waveguides prepared by forming a film on a surface with a step difference by vapor phase growth and using this as the waveguide layer. For example, by making the gas pressure at least $10^{-4}$ Torr in organic CVD, the deposition is improved and a waveguide in the longitudinal (slanted) direction off from the surface direction can be formed along a previously provided step difference (slanted surface also possible). By etching the surface etc. after forming the longitudinal or slanted direction waveguide, it is possible to form longitudinal or slanted direction emission ends and emission of light from above the surface or below the surface or introduction of light to above the surface or below the surface become possible. Further, it is possible to use selective growth to form longitudinal or slanted direction emission ends without etching and to form waveguides of a desired shape. Also, a smooth curve can be realized by forming an underlayer (buffer layer) with a lower index of refraction before forming the waveguide layer.

Example 19

Figure 37:
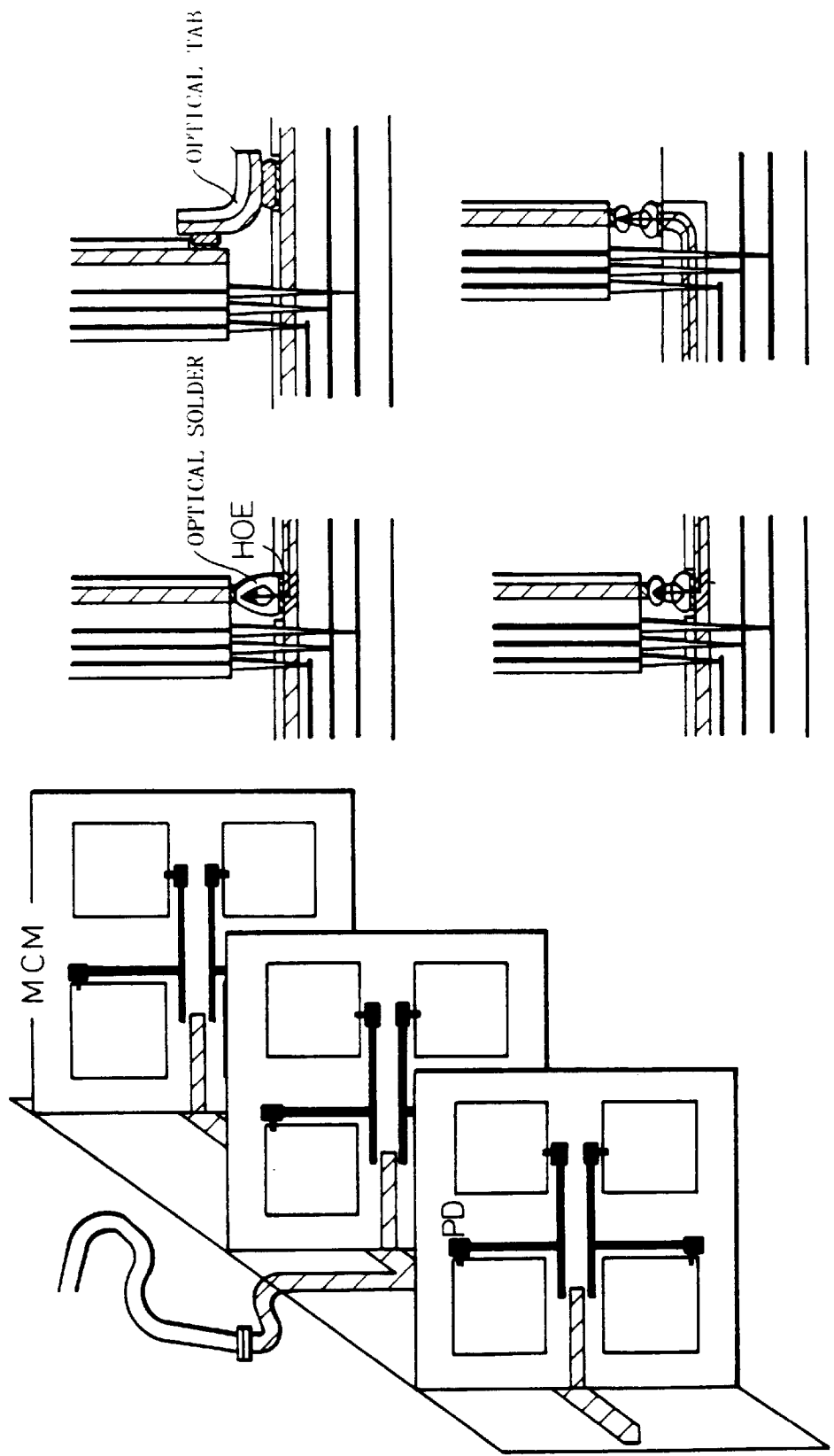
FIG. 37 is a view showing an example of mounting optical circuit substrates on a backplane.
Figure 38:
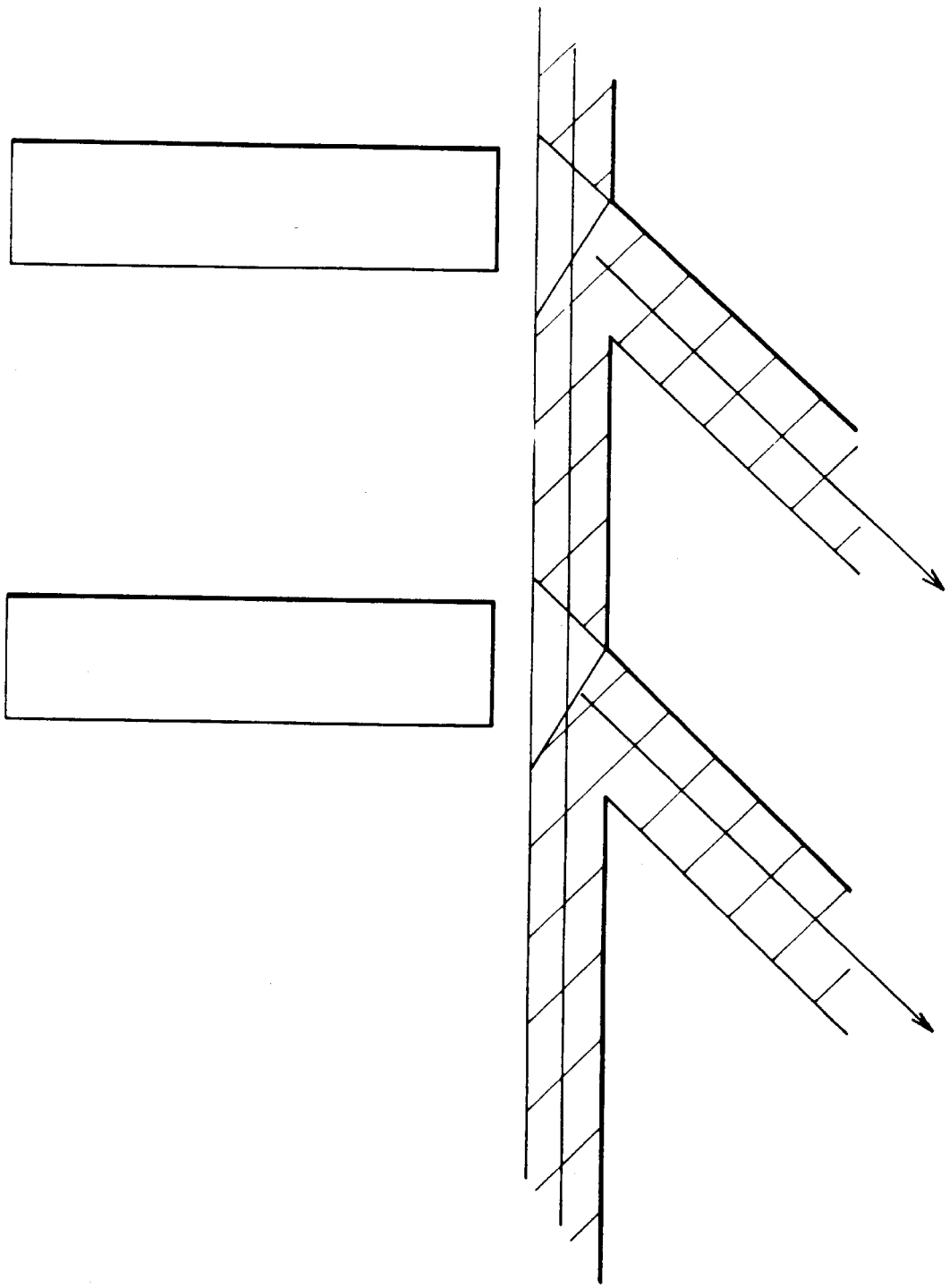
FIG. 38 is a view showing an example of formation of an optical-optical switch on a backplane.

FIG. 37 shows an example of mounting the optical circuit substrates (boards, MCM's) on a backplane (mother board) for simplification of the optical connection. At this time, the problem is the connection of the optical circuit substrates (MCM's) and backplane (mother board). In the present invention, use is made of for example electrical connectors for the electrical connection. For the optical connection, use is made for example of HOE's, optical solder, longitudinal (slanted) direction incoming and outgoing ends, optical tabs, etc. In FIG. 38, optical-optical switches are formed on the backplane, the waveguide light of the backplane is modulated by the light emitted from the optical circuit substrates, and optical coupling is performed with the light substantially as it is. This system of course can be generally used for optical coupling not only for coupling between an optical circuit substrate and a backplane.

As another example, there is the method of transmitting a signal by driving an electro-optic optical switch and optical modulator provided on a backplane optical circuit substrate by voltage of an electrode on an optical circuit substrate, picking up the light of the light power source (waveguide laser, waveguide optical amplifier), and thereby transmitting an optical signal, then converting this to an electrical signal by a light receiving element provided on the backplane optical circuit substrate or light receiving element provided on another optical circuit substrate.

Figure 39:
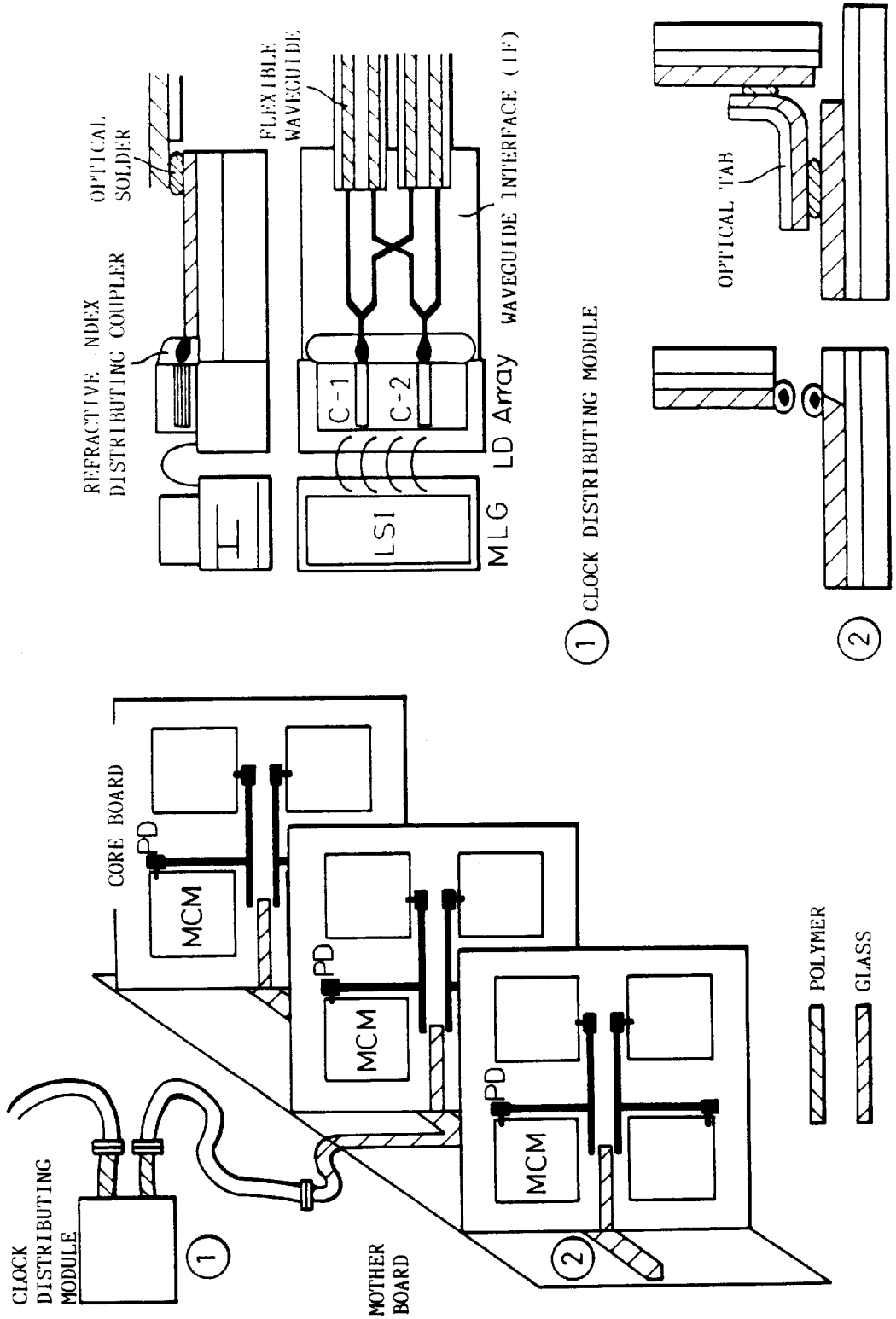
FIG. 39 is a view showing an example of optical coupling by an optical tab and optical solder.

FIG. 39 is an example of optical coupling by basically a flexible waveguide, that is, optical tab and optical solder.

Figure 40:
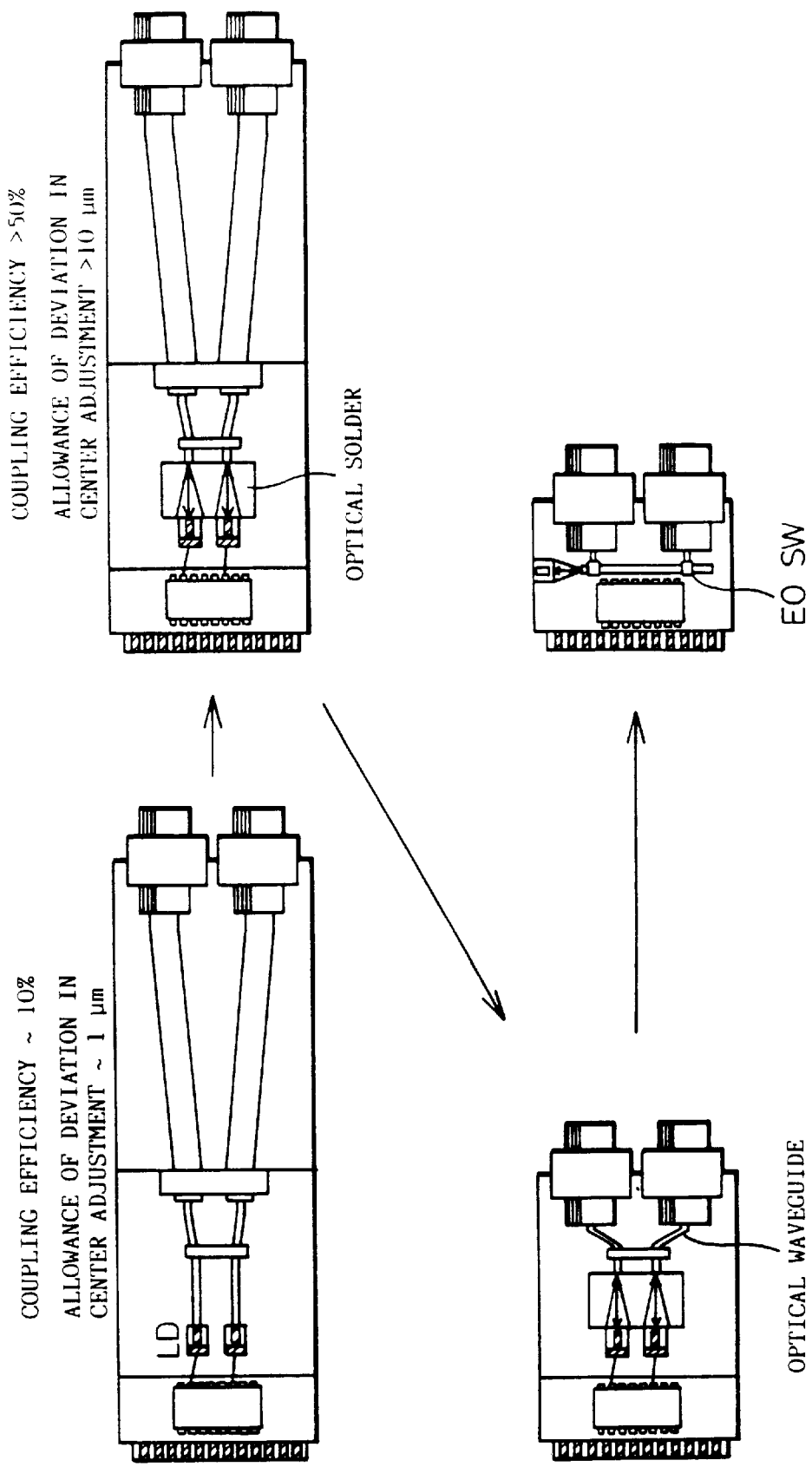
FIG. 40 is a view showing an example of parallel optical transmitters.

FIG. 40 shows an example of parallel transmitters. The output electrodes of the transmitted electrical signals are connected to an electro-optic optical switch and modulator array. The electro-optic optical switches or optical modulators are driven by the voltage of the electrodes and at least a part of the light of the light power source (waveguide laser, waveguide optical amplifier) is picked up, thereby enabling transmission of optical signals. Compared with an LD array, this is superior in terms of output stability and cost and is smaller in size.

Figure 41:
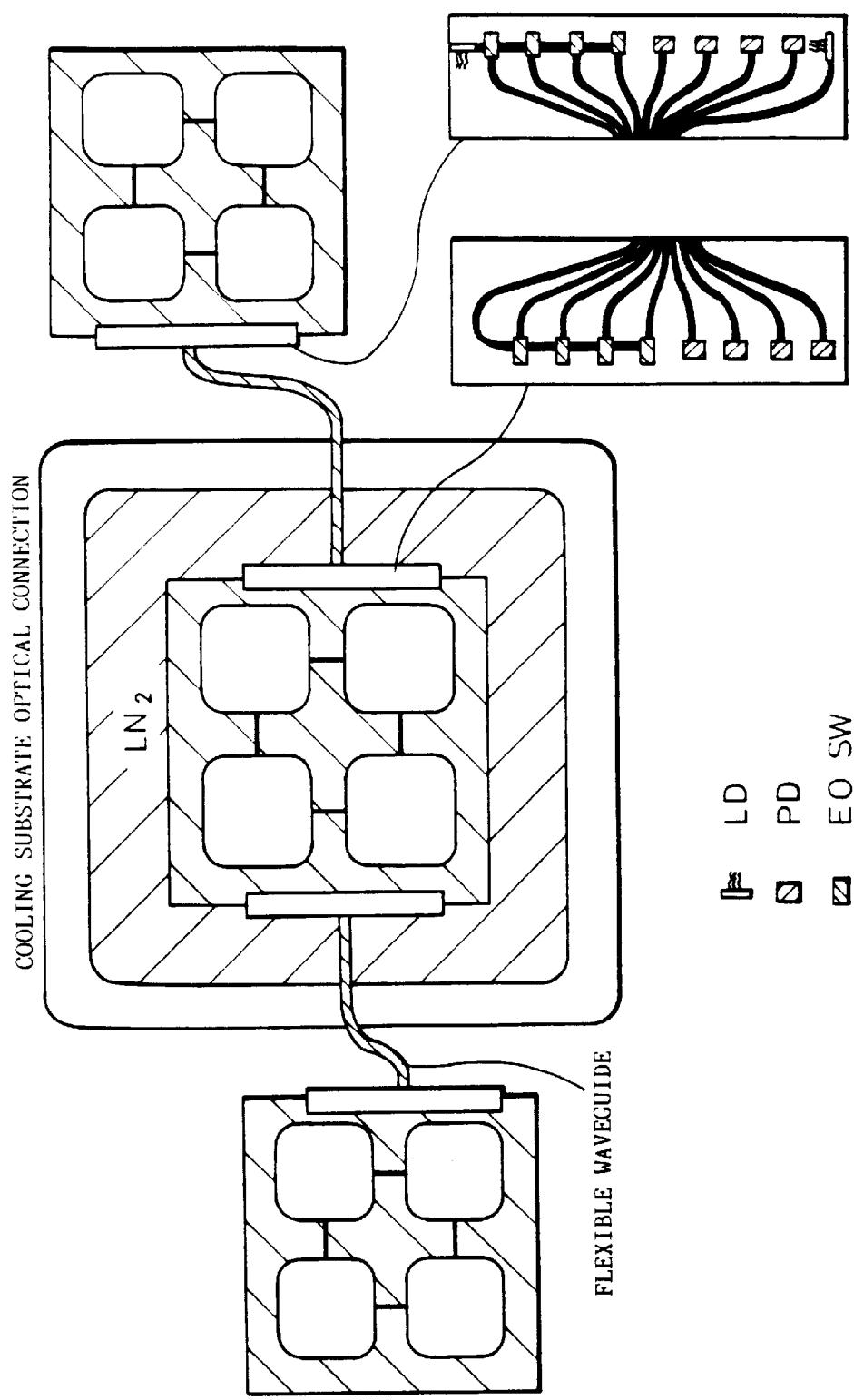
FIG. 41 is a view showing an example of signal transmission between a circuit substrate inside a cooler and outside circuit substrates by optical connection.

FIG. 41 shows an example of use of optical connection for signal transmission between a circuit substrate inside a cooler and outside circuit substrates. The optical wiring may be made using a flexible waveguide. By reducing the cross-sectional area, the heat conduction can be suppressed and the cooling efficiency raised compared with the case of connection by copper wiring. As the optical transmission and reception modules, use may be made of conventional modules using LD arrays and PD arrays. Preferably, instead of LD arrays, use is made of external modulation type modules using electro-optic optical switches and modulator arrays. In particular, it is also possible to use modules similar to those of FIG. 40. Further, by supplying light for the light power source from the outside, it is possible to suppress the generation of heat inside the cooler. The reception module may be formed on the same substrate. Further, as shown in FIG. 41, by suitably adjusting the waveguide intervals, it is possible to obtain interfaces with the connection lines (waveguides, fibers, etc.)

Figure 42:
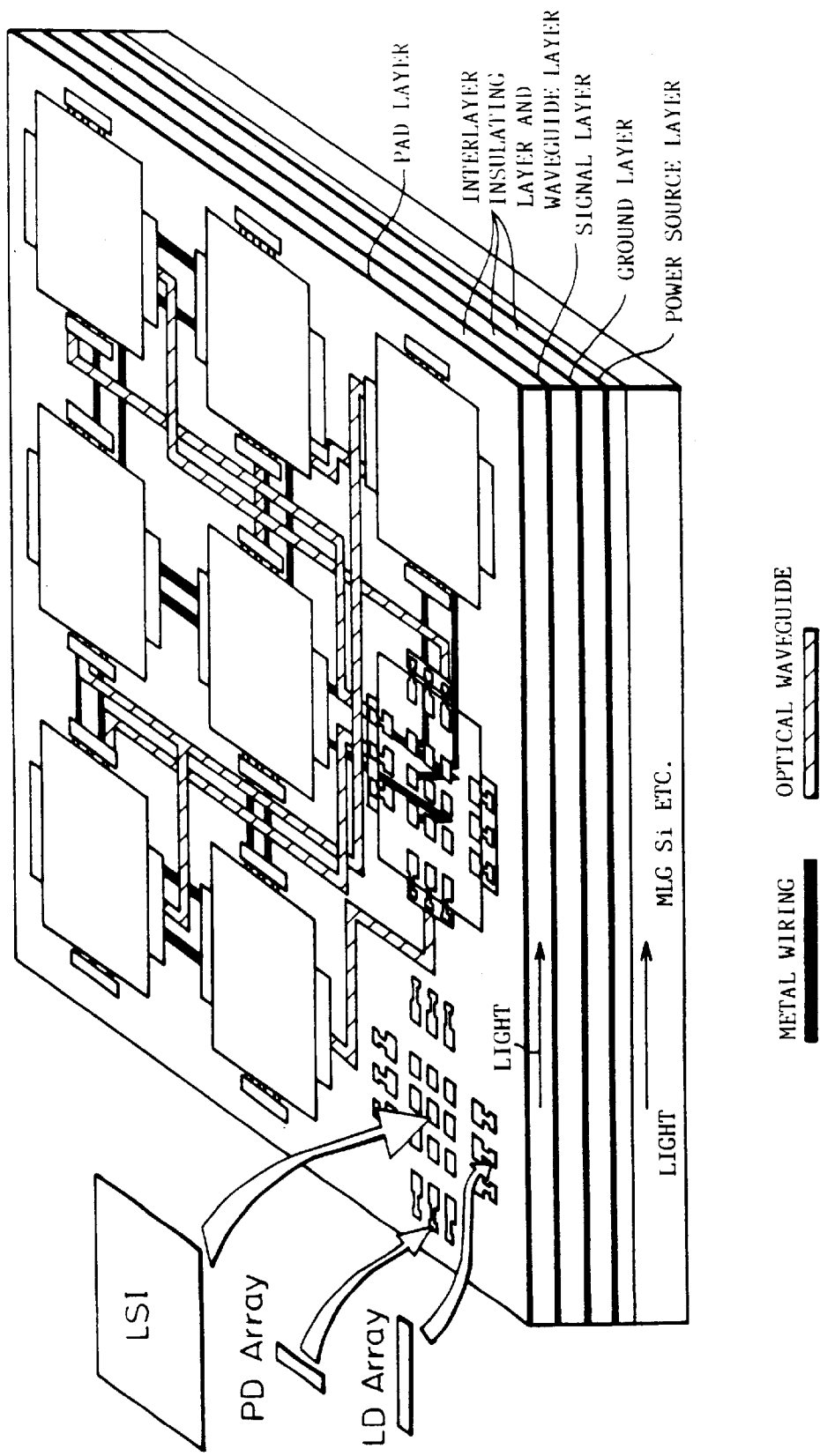
FIG. 42 is a view showing an example of a hybrid optical circuit substrate.
Figure 43:
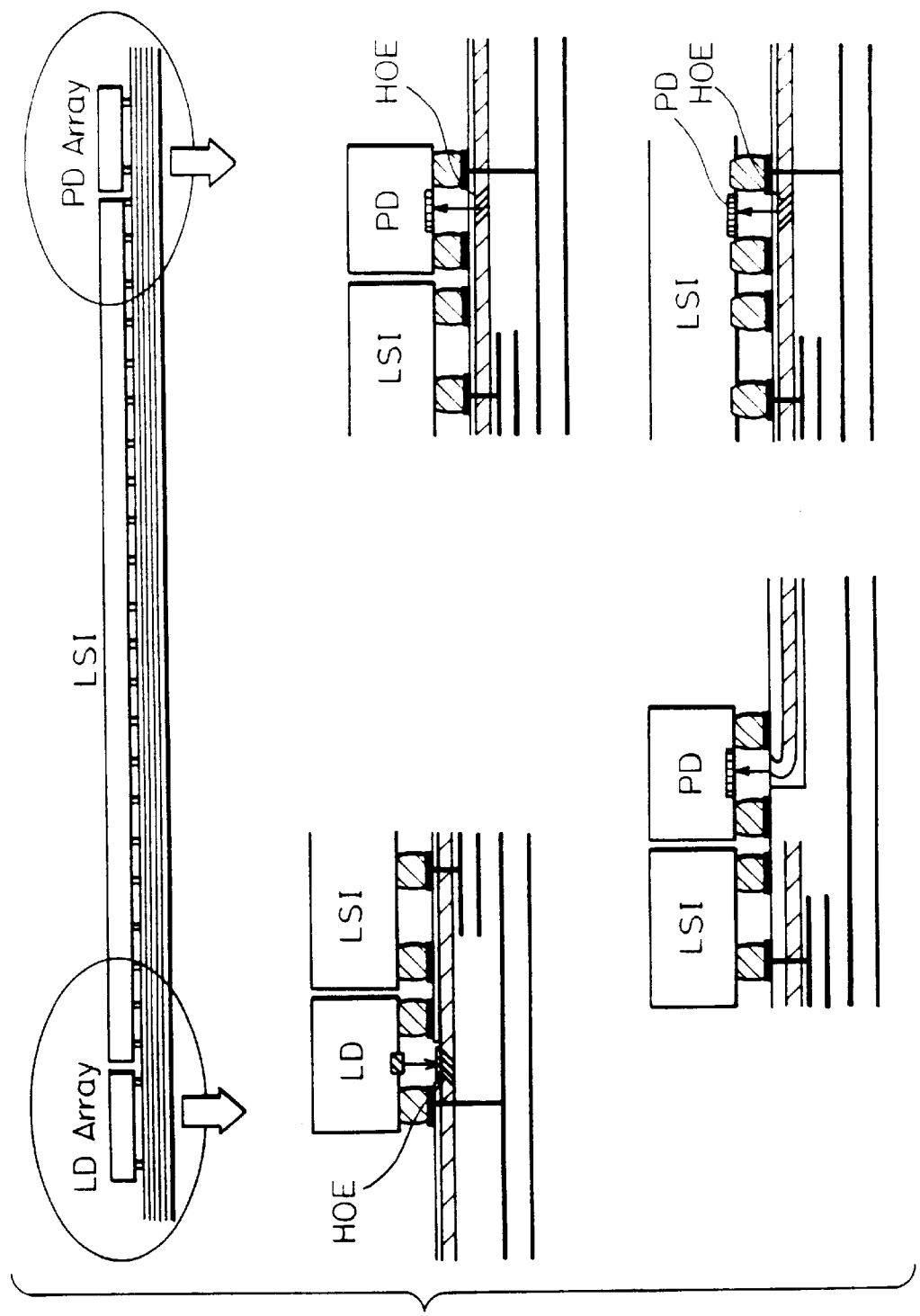
FIG. 43 to FIG. 48 are views showing various modes of packaging on hybrid and monolithic optical circuit substrates.
Figure 44:
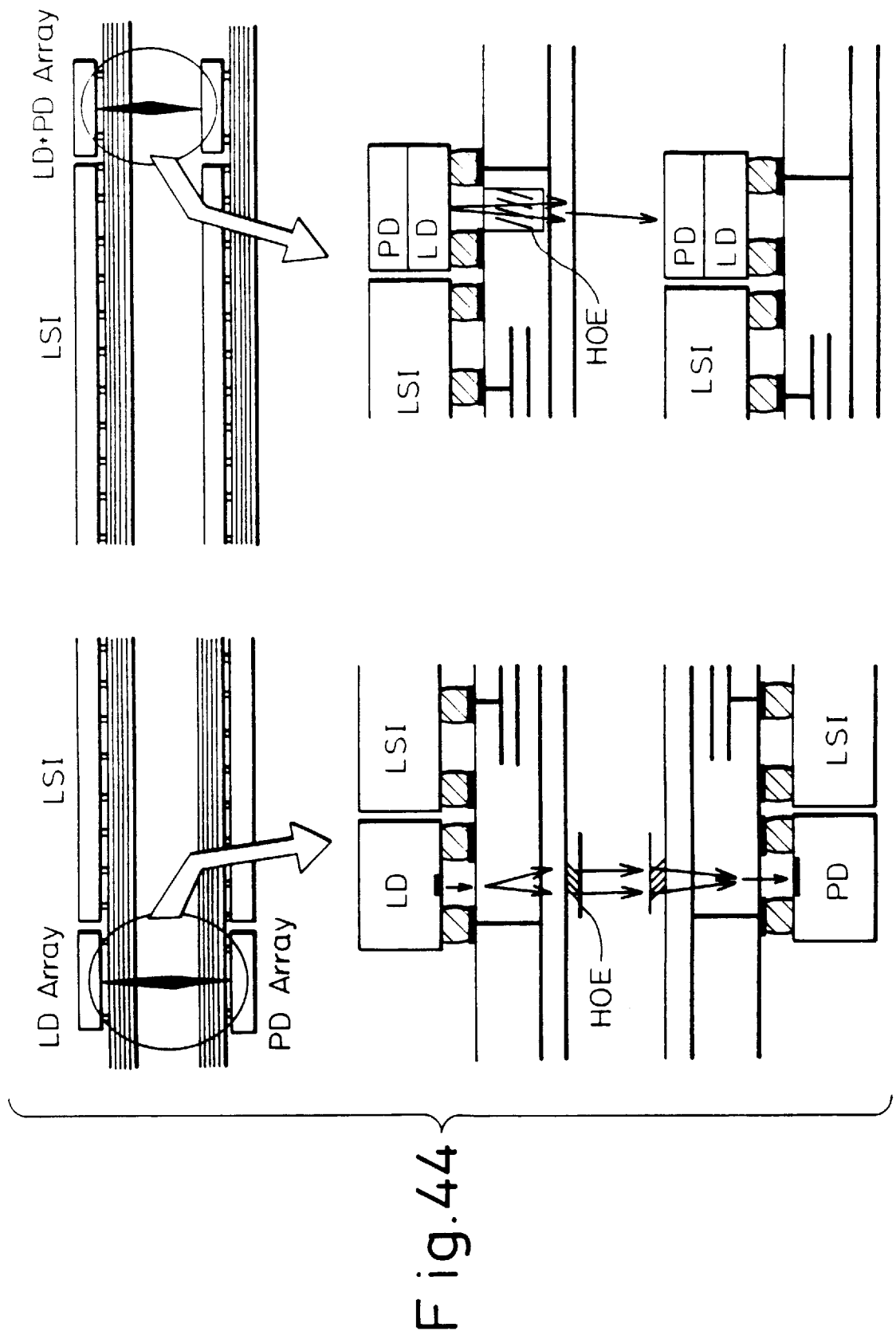
Figure 45:
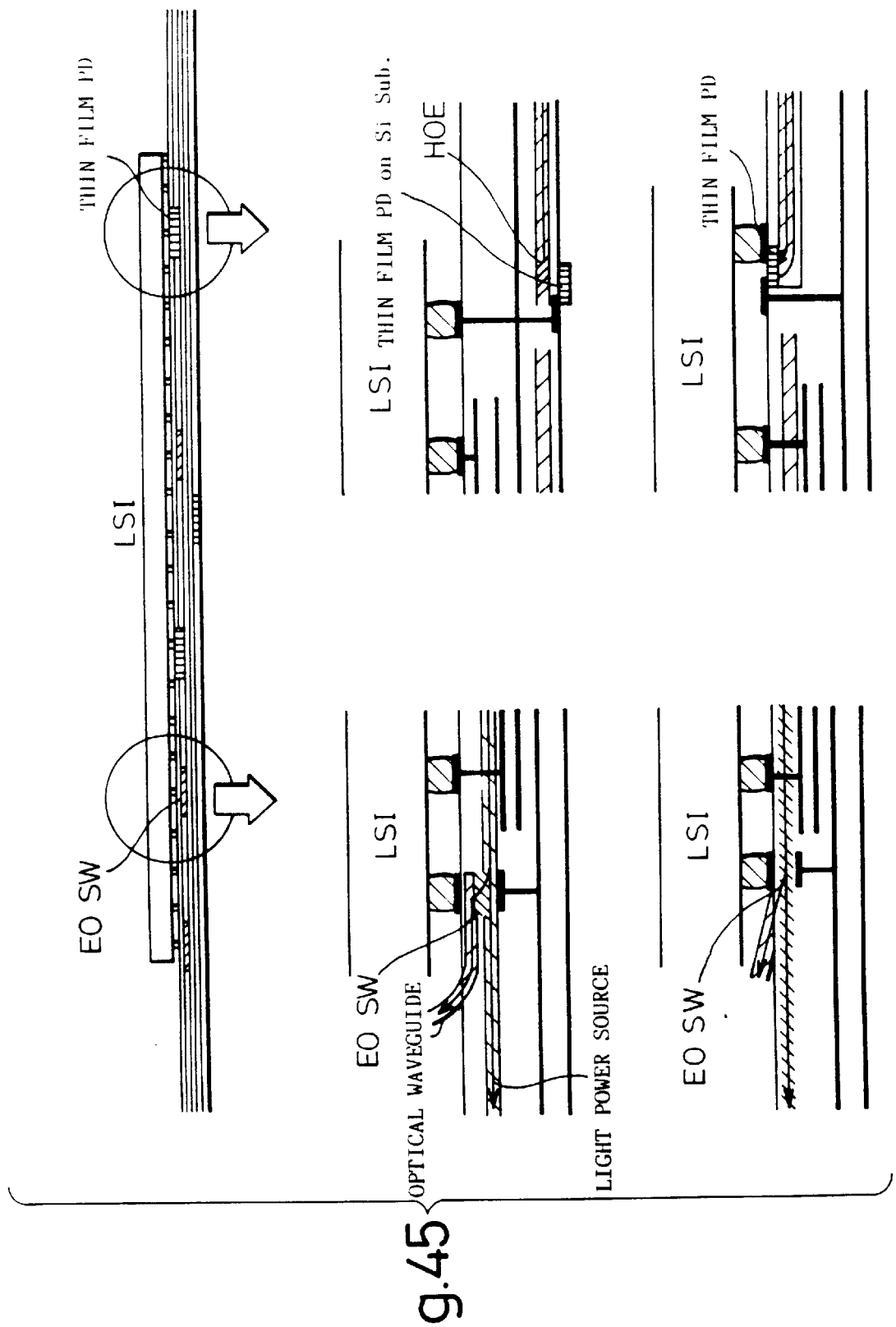
Figure 46:
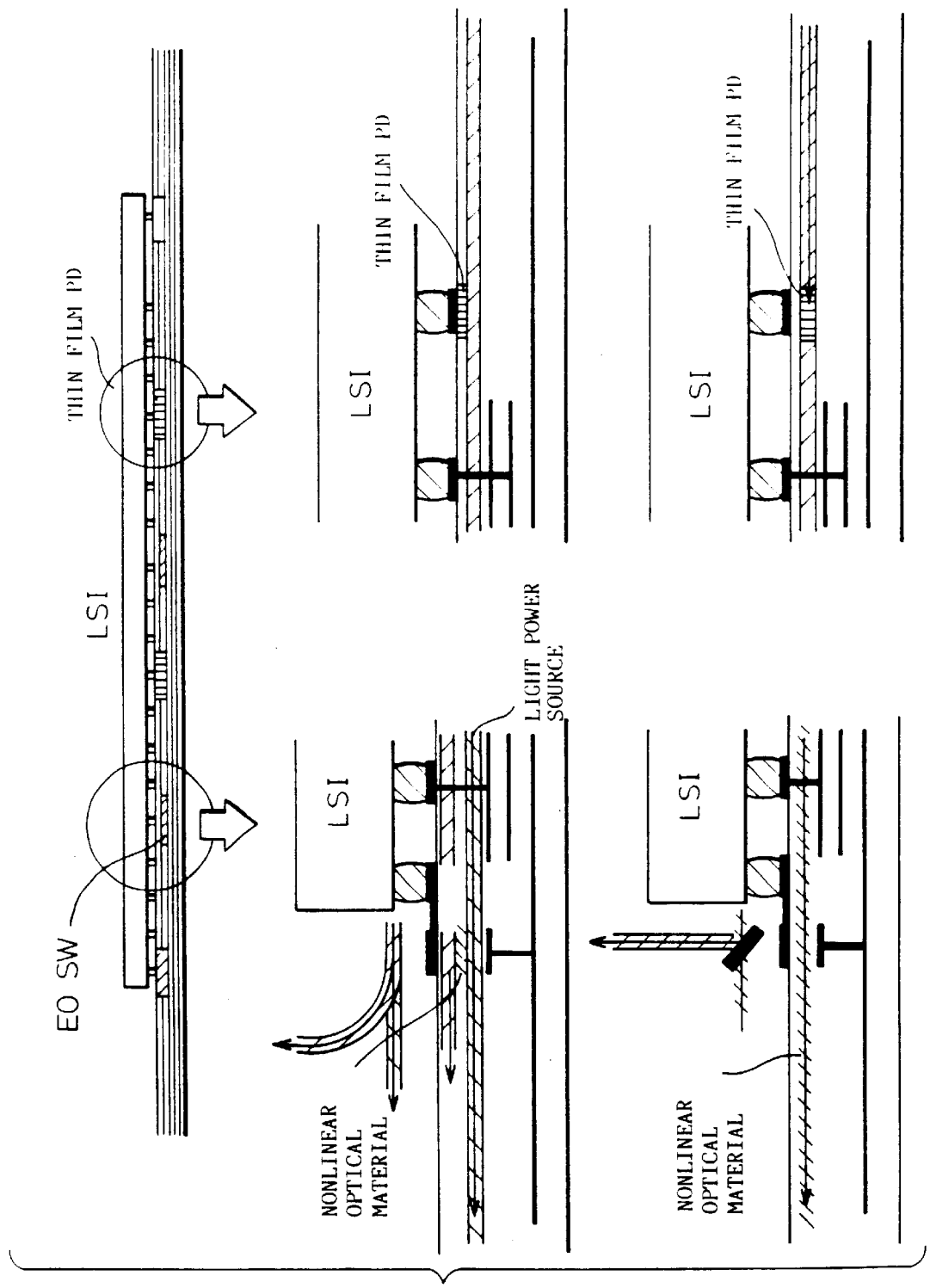
Figure 47:
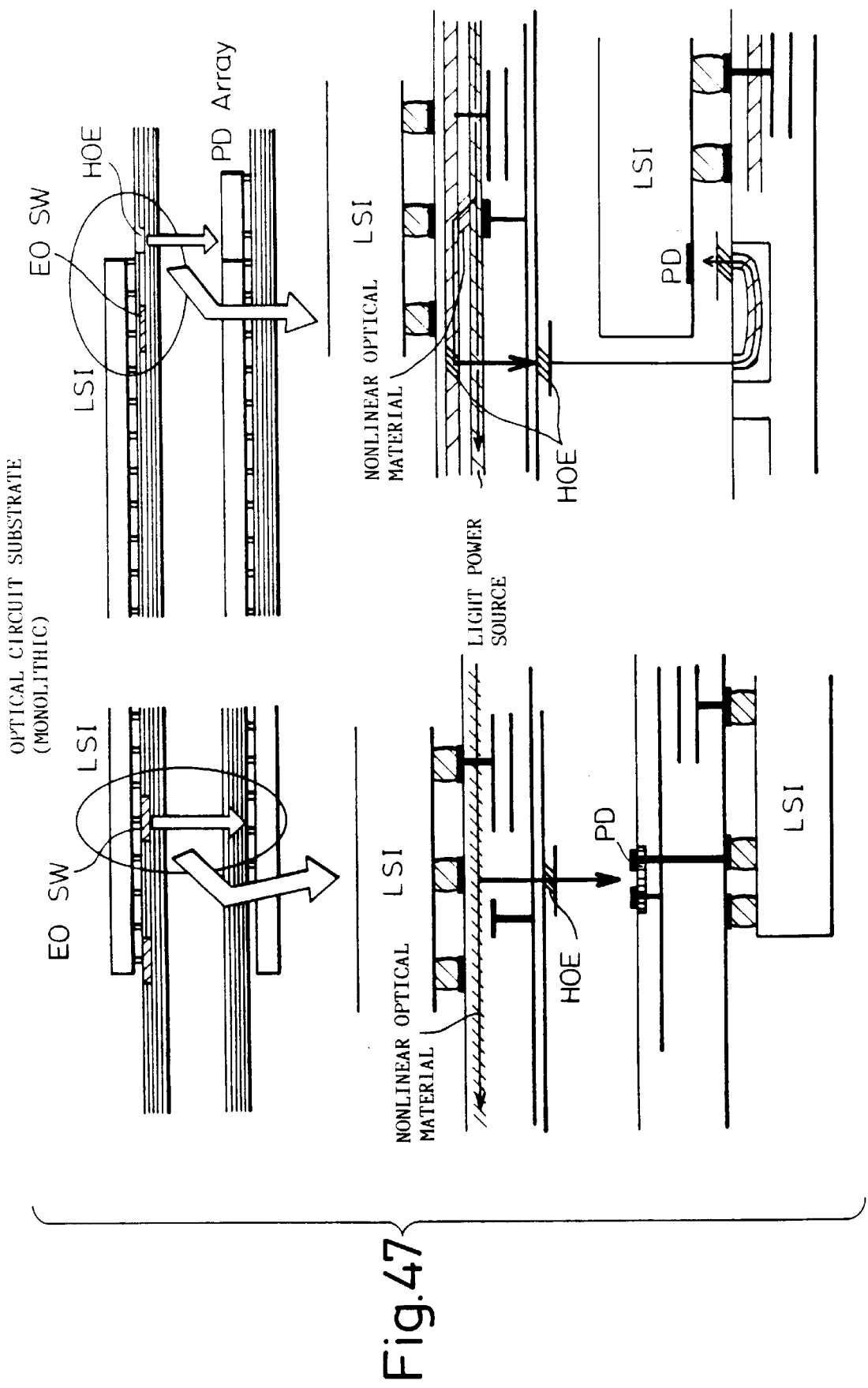
Figure 48:
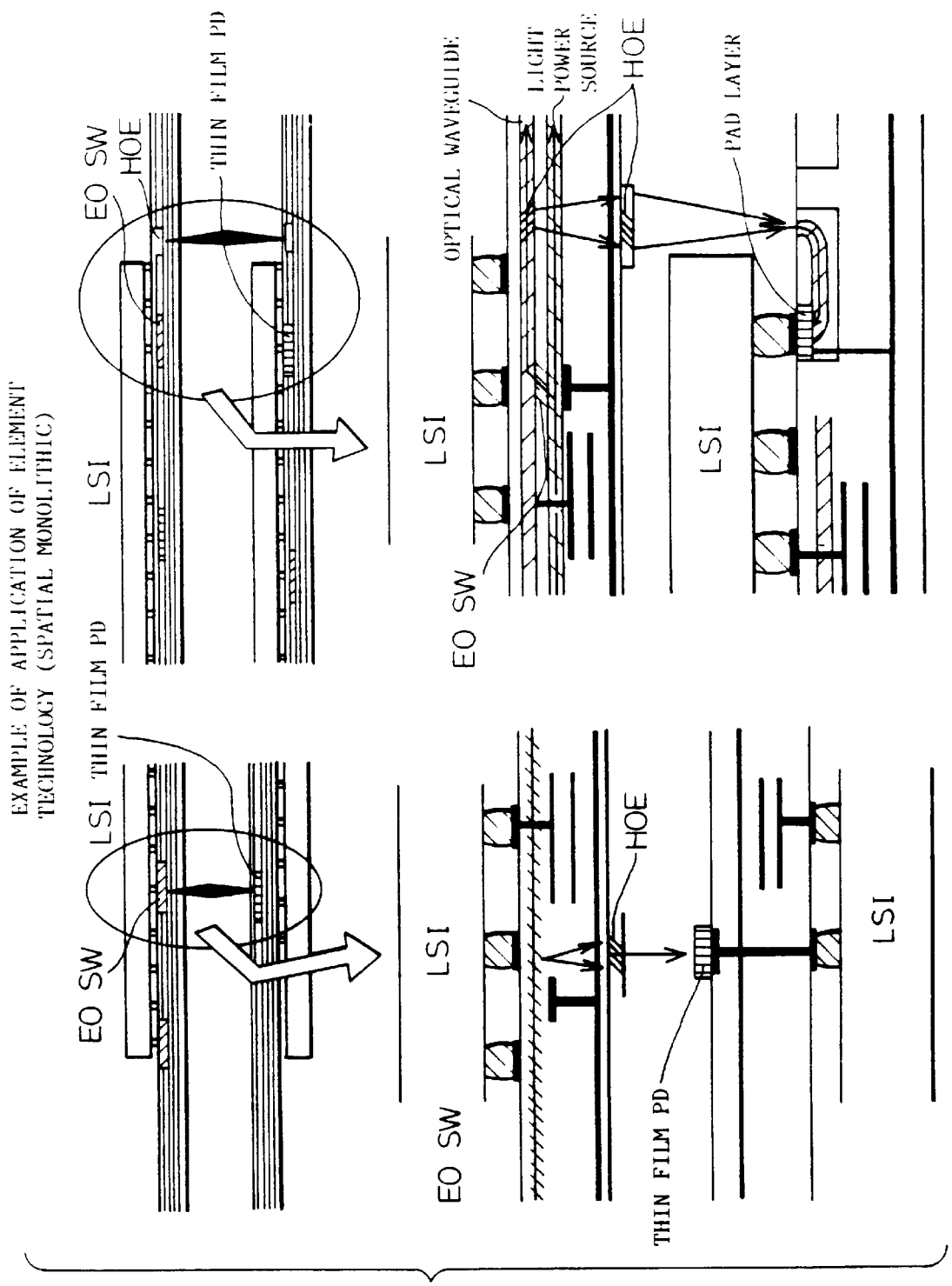

FIG. 42 shows an example of a hybrid optical circuit structure. In this case, precision optical coupling is required for the LD's, PD's, and waveguides compared with the monolithic optical circuit substrate, but a certain degree of improvement is possible by tinkering with the optical coupling method.

FIG. 43 to FIG. 48 show modes of packaging of the hybrid and monolithic optical circuit substrates. Joining of electrical wiring and optical wiring becomes possible by using solder bumps, HOE's, longitudinal (slanted direction) waveguides, etc. Further, these modes of packaging can be applied to various types of optical/electronic packaging without regard as to level or type.

Example 20

Figure 49:
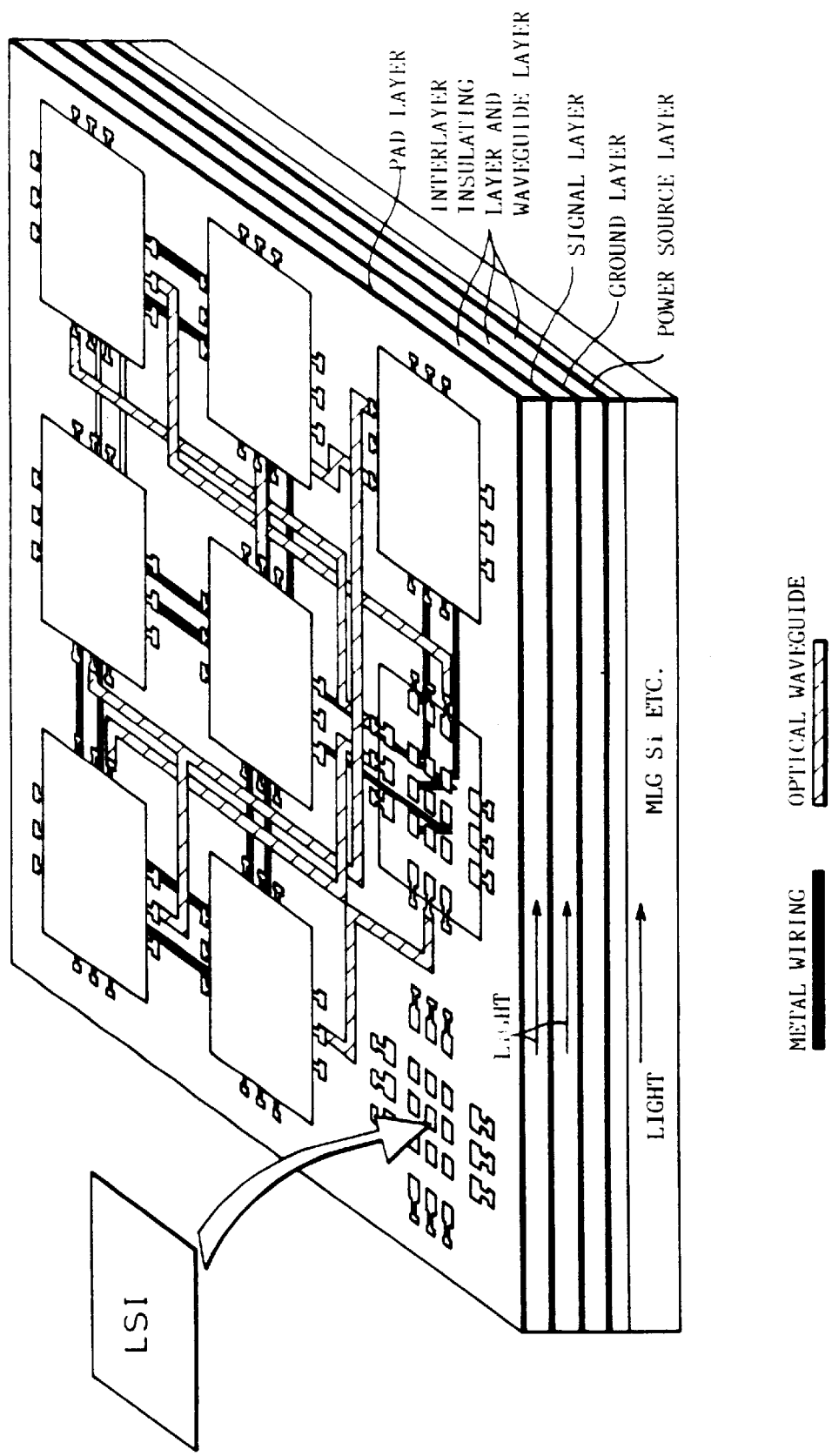
FIG. 49 is a view showing an example of the packaging mode of an optical circuit substrate.

FIG. 49 shows an example of an optical circuit substrate according to the present invention. Optical waveguides are formed in the interlayer insulating layer or protecting layer of the circuit substrate (multichip module (MCM)) and optical connection is performed by LD's (LED's, EL's) and PD's provided on the substrate. The usual electrical wiring is mixed in as well. The wiring density is improved by making multiple layers of the waveguides. The waveguides can be formed by the usual wet coating and photolithography techniques. Waveguide wiring overcoming unevenness may also be achieved by waveguides with good step coverage such as polymer waveguides using vapor deposition polymerization, organic CVD, MLD, and other vapor phase film formation and glass waveguides using CVD. For example, use may be made of the method described in the previously mentioned Japanese Patent Application No. 4-179909.

If a voltage occurs across electrodes of an LSI, for example, an optical signal changing in light intensity is produced by an LD (LED, EL). The optical signal propagates through the waveguide and reaches the PD. Here, it is opto-electrically converted and is output as voltage to the input electrode of the same or another LSI. In the former case, this is deemed as optical wiring inside the LSI. By using this technique, it is possible to form wiring in an LSI without changing the CMOS itself and possible to disperse risks in the LSI and circuit substrate, so this is effective in reducing costs as well. In particular, it is effective for long distance wiring such as clock lines and bus lines. The signal may not only be modulated in intensity, but also modulated in wavelength or modulated in phase. By arranging a matrix optical switch in the middle of the signal waveguide, it becomes possible to switch signal wiring and to increase the degree of freedom of wiring. The signal may be not only passed through the optical waveguide, but also through space, a medium space, or a fiber.

As the waveguide material, use may be made of for example fluorinated polyimides, glass, etc.

Figure 50:
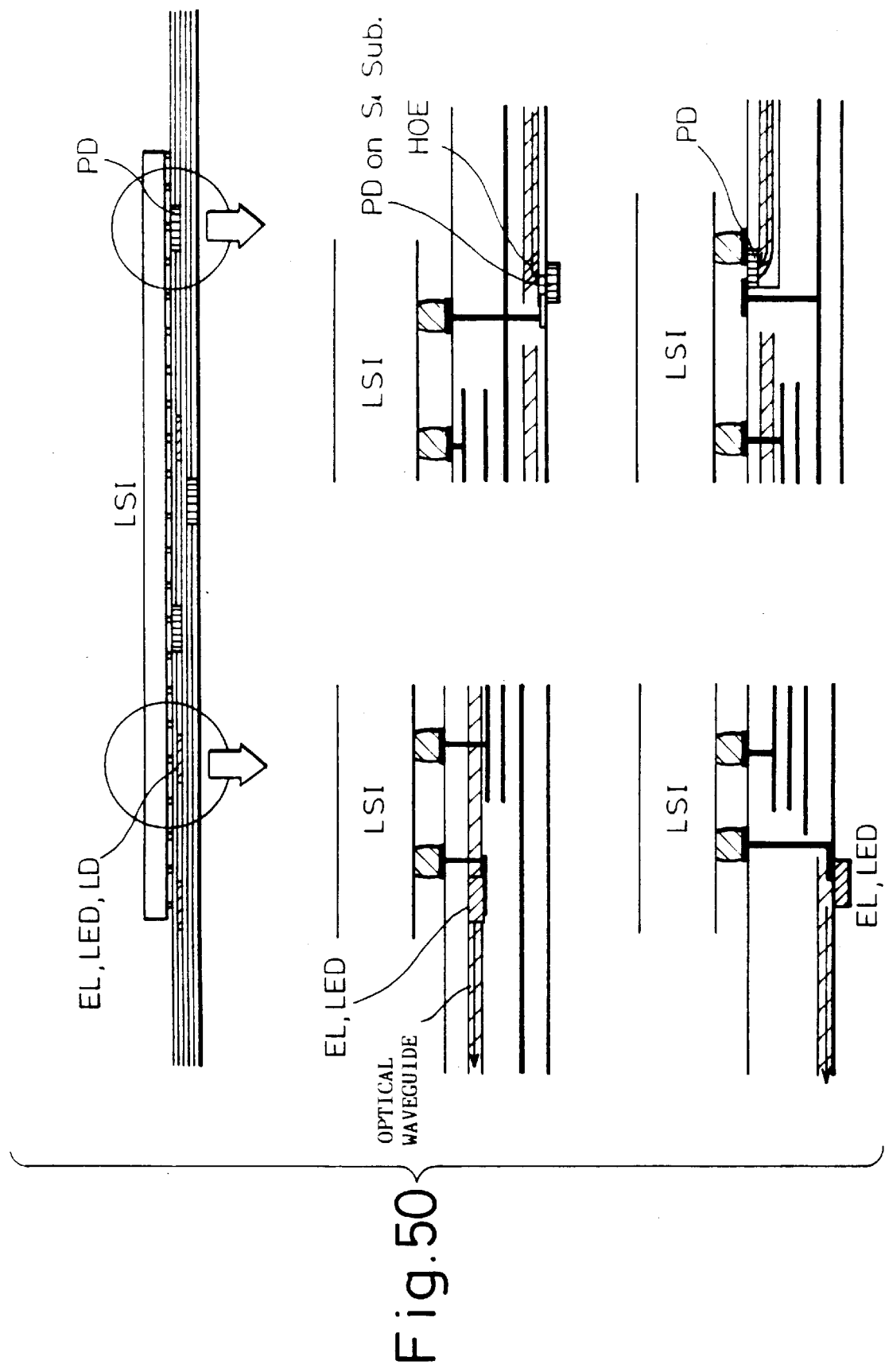
FIG. 50, FIG. 51, and FIG. 52 are views showing various packaging modes in optical circuit substrates.
Figure 51:
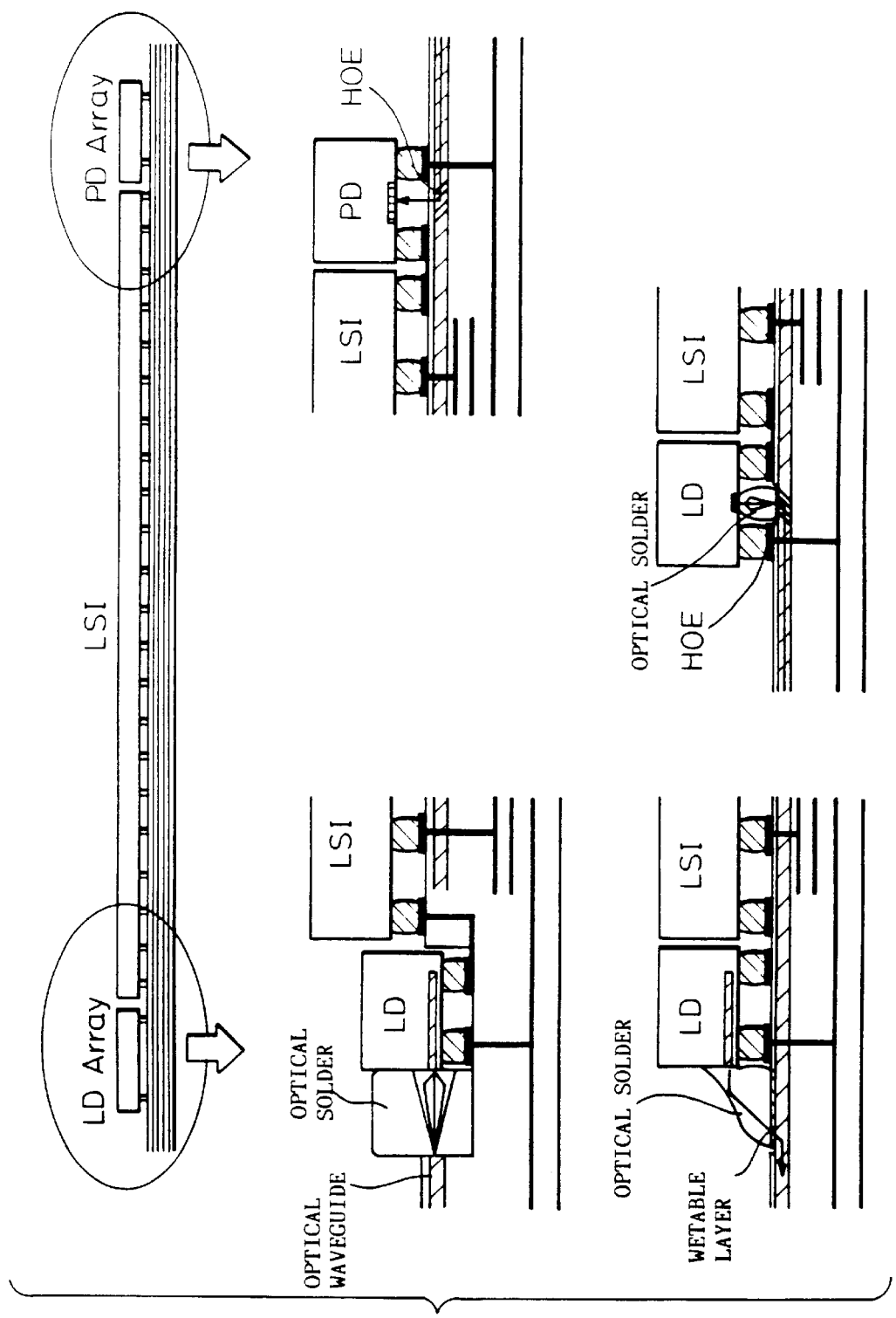
Figure 52:
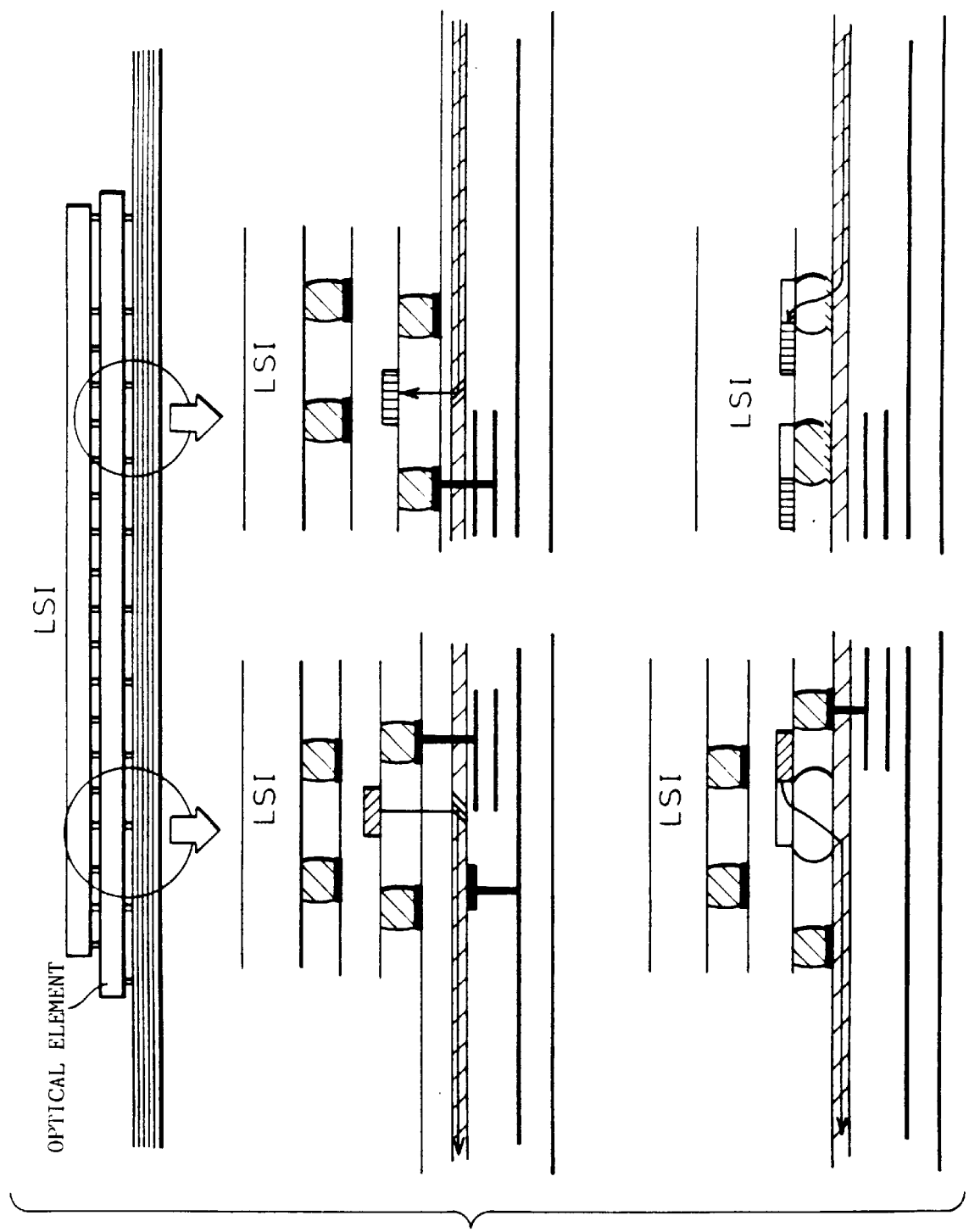

FIG. 50 and FIG. 51 show various modes of packaging in an optical circuit substrate. It is possible to join electrical wiring and optical wiring using solder bumps, optical solder, HOE's, longitudinal (slanted direction) waveguides, etc. FIG. 50 shows an example of the provision of light receiving elements and light emitting elements to a circuit substrate. As the light receiving elements, photodiodes, phototransistors, MSM detectors, etc. comprised of amorphous silicon, polycrystalline silicon, conjugated polymers, or low molecular weight crystals are suited. As light emitting elements, use may be made of LD's and also EL's, LED's, etc. As the mode for forming the light receiving and light emitting elements, it is possible to form them cutting across the waveguide or above or below the waveguide and therefore to absorb light from the waveguide or emit light to the same. Further, when using silicon or a compound semiconductor for the substrate, it is possible to make the light receiving elements in the substrate and, in the case of a compound semiconductor, to make light emitting elements in it as well. Also, as shown in FIG. 51, it is possible to mount LD's and PD's on the substrate in advance by solder bumps etc. Further, as shown in FIG. 52, it is also possible to provide a sub-substrate forming or mounting LD's or PD's. As shown at the bottom right, it is also possible to form PD's on the LSI substrate to receive light. These may also be mixed.

The backplane optical circuit substrate will not be explained in detail here, but it can be realized in the same manner as an optical circuit substrate in terms of structure and materials. The difference is that the main devices which are mounted are LSI's in the case of an optical circuit substrate and are boards (MCM) and other optical circuit substrates in the case of a backplane optical circuit substrate.

By changing the light supplying power in accordance with the fanouts of the signal, it is possible to suppress the fluctuation in the intensity of the signal light reaching the light receiving elements. For example, when there are three fanouts of signals, by introducing three times the light power source power as in the case of a single fanout, the amount of light at the light receiving portion can be made uniform. The same applies to optical circuit substrates and to backplane optical circuit substrates. Note that the three-dimensional packaging of the optical circuit substrates can be performed in the same manner as in FIG. 45.

Figure 53:
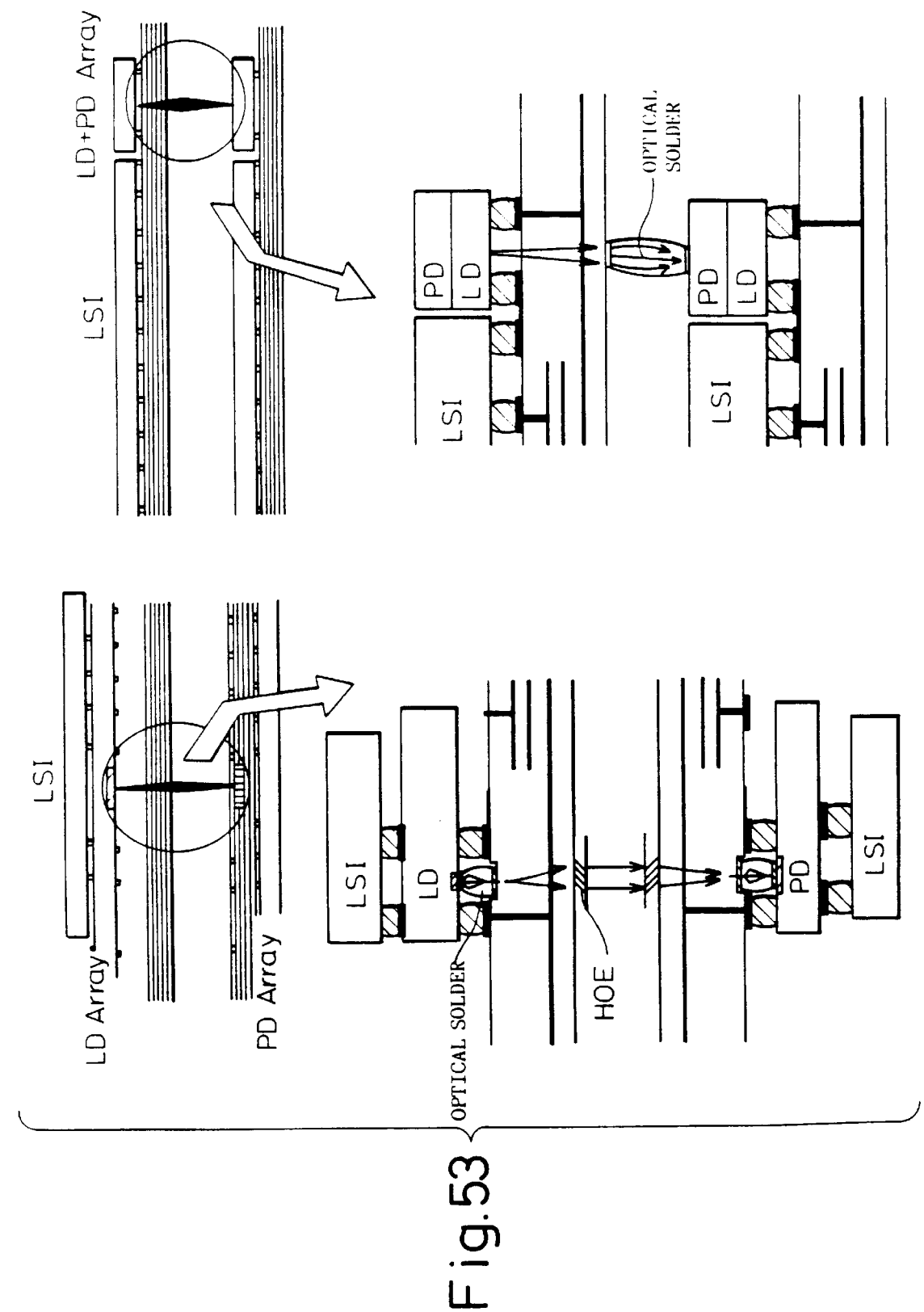
FIG. 53 and FIG. 54 are views showing examples of three-dimensional packaging modes of optical circuit substrates.
Figure 54:
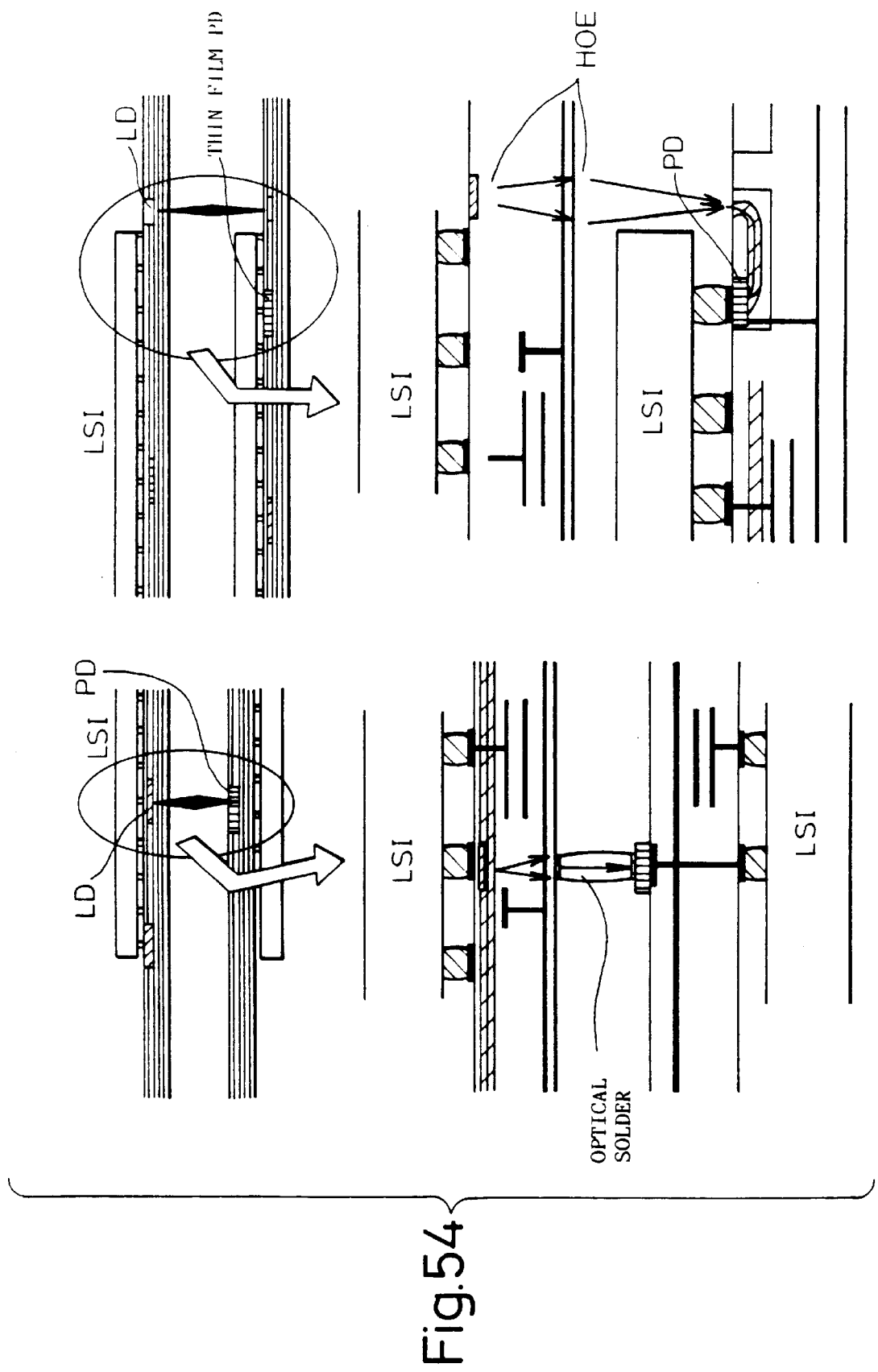

FIG. 53 and FIG. 54 are examples of modes of packaging. The electrical wiring, waveguide wiring, and spatial beam wiring are mixed. By making the spatial beams propagate through the polymer or glass layer, stable alignment becomes possible. Also, by forming a hologram, waveguide, or distribution of index of refraction in the medium, excellent beam control becomes possible.

As described in the previously mentioned Japanese Patent Application No. 4-48961, by vapor phase growing a polymer on an $SiO_2$ slanted vapor deposited film, the polymer chain orients in the slanted direction of the substrate. By using this, if for example an $SiO_2$ film is formed at a location where it is desired to form a longitudinal direction waveguide, the polymer film on the $SiO_2$ is given an orientation different from the surrounding polymer film and the index of refraction becomes higher than the polarized electromagnetic radiation in the chain direction, and therefore, a waveguide is formed. When use is made of a polyazomethine CVD film using terephthaldehyde and par-aphenylenediamine as sources, the index of refraction in the chain direction becomes about 1.9, the index of refraction in the direction perpendicular to the chain becomes about 1.6, and the index of refraction of the surrounding random film becomes in the middle of the two. Accordingly, this region becomes a waveguide with respect to polarized electromagnetic radiation in the chain direction. It is possible to provide a PD, LD, HOE, microlens, etc. at the end of the waveguide.

Note that, as shown in FIG. 36, it is possible to use vapor phase growth to form a film on the surface provided with the step difference and to use this as the waveguide layer so as to fabricate a longitudinal direction waveguide. For example, by making the gas pressure at least $10^{-4}$ Torr in organic CVD, the deposition is improved and a waveguide in the longitudinal (slanted) direction off from the surface direction can be formed along a previously provided step difference (slanted surface also possible). By etching the surface etc. after forming the longitudinal or slanted direction waveguide, it is possible to form longitudinal or slanted direction emission ends and emission of light from above the surface or below the surface or introduction of light to above the surface or below the surface become possible. Further, it is possible to use selective growth to form longitudinal or slanted direction emission ends without etching and to form waveguides of a desired shape. Also, a smooth curve can be realized by forming an underlayer (buffer layer) with a lower index of refraction before forming the waveguide layer.

Figure 55:
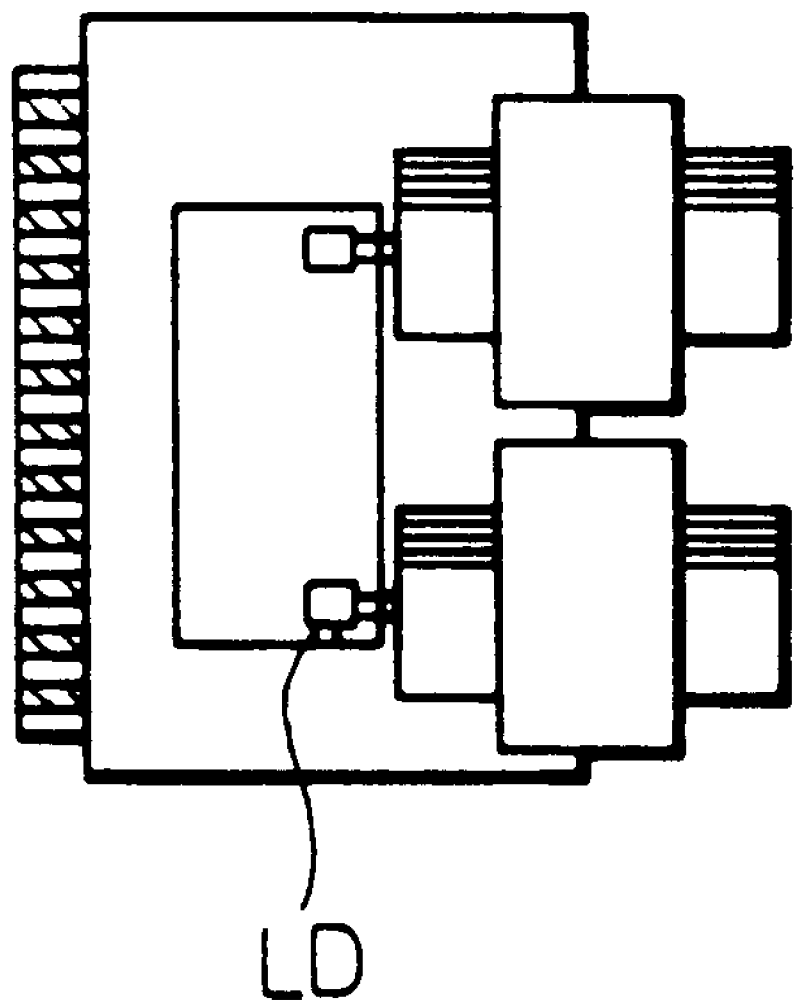
FIG. 55 is a view showing an example of parallel optical transmitters.

FIG. 55 shows an example of parallel transmitters. It is possible to mount LSI's on a circuit substrate provided with an LD array using solder bumps to reduce costs and size. The receiving module may be formed on the same substrate. This can also be used for optical connection of the signal transmission between the circuit substrate in a cooler and the outside circuit substrates. A flexible waveguide may be used for the optical connection. By making the cross-sectional area smaller, the heat conduction may be suppressed and the cooling efficiency rises compared with the case of connection by copper wiring. Further, by suitably adjusting the intervals between waveguides, it is possible to obtain an interface with the connection lines (waveguide, fiber, etc.)

Example 21

Figure 56A:
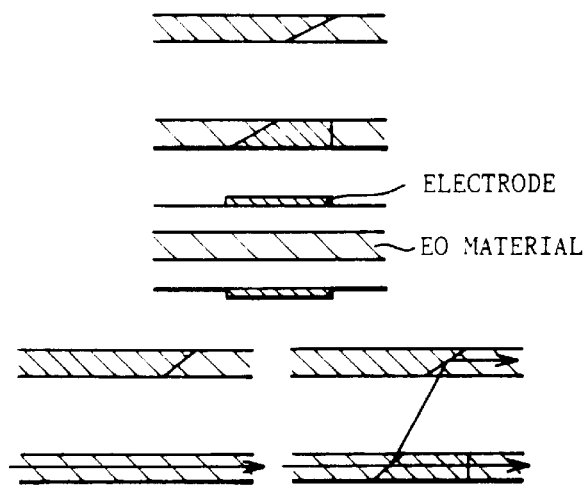
FIGS. 56(a), 56(b) and 56(c) give views showing examples of broadening the waveguide gap of waveguides by a usual directional coupler so as to reduce the interaction of waveguides.

FIG. 56(a) is an example of broadening the waveguide gap by a usual directional coupler so as to reduce the interaction between waveguides. The interaction may also be reduced without broadening the waveguide gap by increasing the difference in indexes of refraction of the waveguide/cladding or strengthening the sealing in of the light. On the waveguides are formed electrodes with end sides slanted with respect to the direction of progression of the waveguides. The waveguide width and gap may be 1 to 100 μm, but as mentioned earlier the interaction between waveguides must be reduced by sealing in the light and adjusting the intensity. For example, in the case of a waveguide width of 3 μm and a waveguide gap of 10 μm, the index of refraction of the cladding may be reduced by about 0.01 from the waveguide. When no voltage is applied, the light progresses along the original waveguide as it is. When an electric field is applied, a difference is caused in the index of refraction in the waveguide and the light is reflected outside the waveguide. If a similar difference in index of refraction is formed in the receiving side waveguide, then as shown in the figure the light will proceed along the second waveguide. Here, the light does not all have to be switched. It is also possible to switch a part of the same. In this case, the light of the original waveguide may be discarded as it is or may be reutilize. As the waveguide material, for example, use may be made of an epoxy or polyimide nonlinear optical polymer or conjugated polymer. As the voltage, usually 1 to 50V is applied. For the cladding, use may be made of a normal waveguide material such as a fluorinated polyimide or glass. As the process for formation of the waveguides, suitable use may be made of all sorts of techniques known up to now, such as etching, selective orientation, and mounting materials with different refractive-index.

Figure 56C:
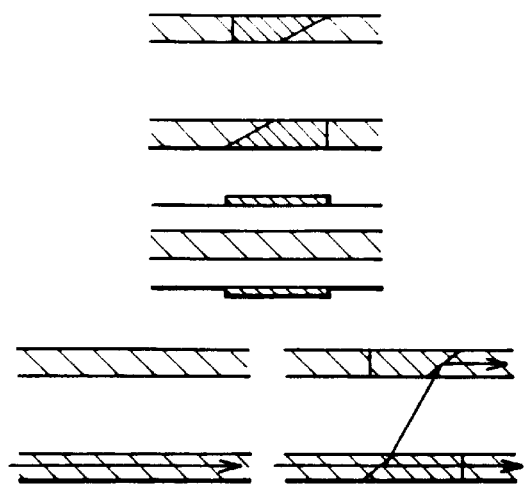
Figure 56B:
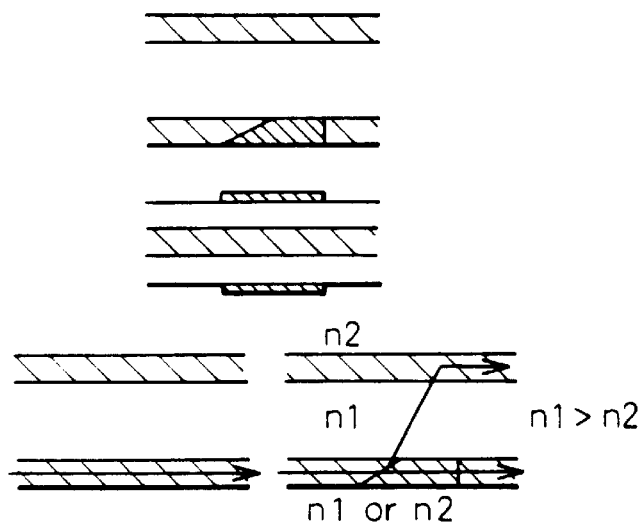

FIG. 56(b) is an example of forming electrodes at both of the waveguides and guiding the light emitted from one of the waveguides to the other waveguide by the difference in the index of refraction caused by application of voltage. When several other waveguides are formed, it is possible to select the waveguide to switch to by selectively applying voltage to the receiving side electrode.

FIG. 56(c) is an example of reduction of the index of refraction of the cladding of the waveguide to be switched to at the side opposing the original waveguide so as to be lower than the index of refraction of the intermediate cladding and insertion of light to the receiving side waveguide.

FIG. 57(a) is an example of application of voltage to the cladding. When no voltage is being applied, the light is guided to the original waveguide as it is. When the index of refraction of the cladding is increased due to the application of voltage, a window is formed there and the light travels through it. In the case of use of a typical nonlinear optical polymer, switching is possible with at least 50V if the waveguide width is made 3 μm, the waveguide gap is made 8 μm, the electrode length is made 100 μm, and the difference in indexes of refraction of the waveguide and cladding is made 0.005.

FIG. 57(b) is an example of the formation of the window at a slant. If the angle made by the window with the waveguide is made 5 to 10°, excellent optical switching is possible.

Figure 58:
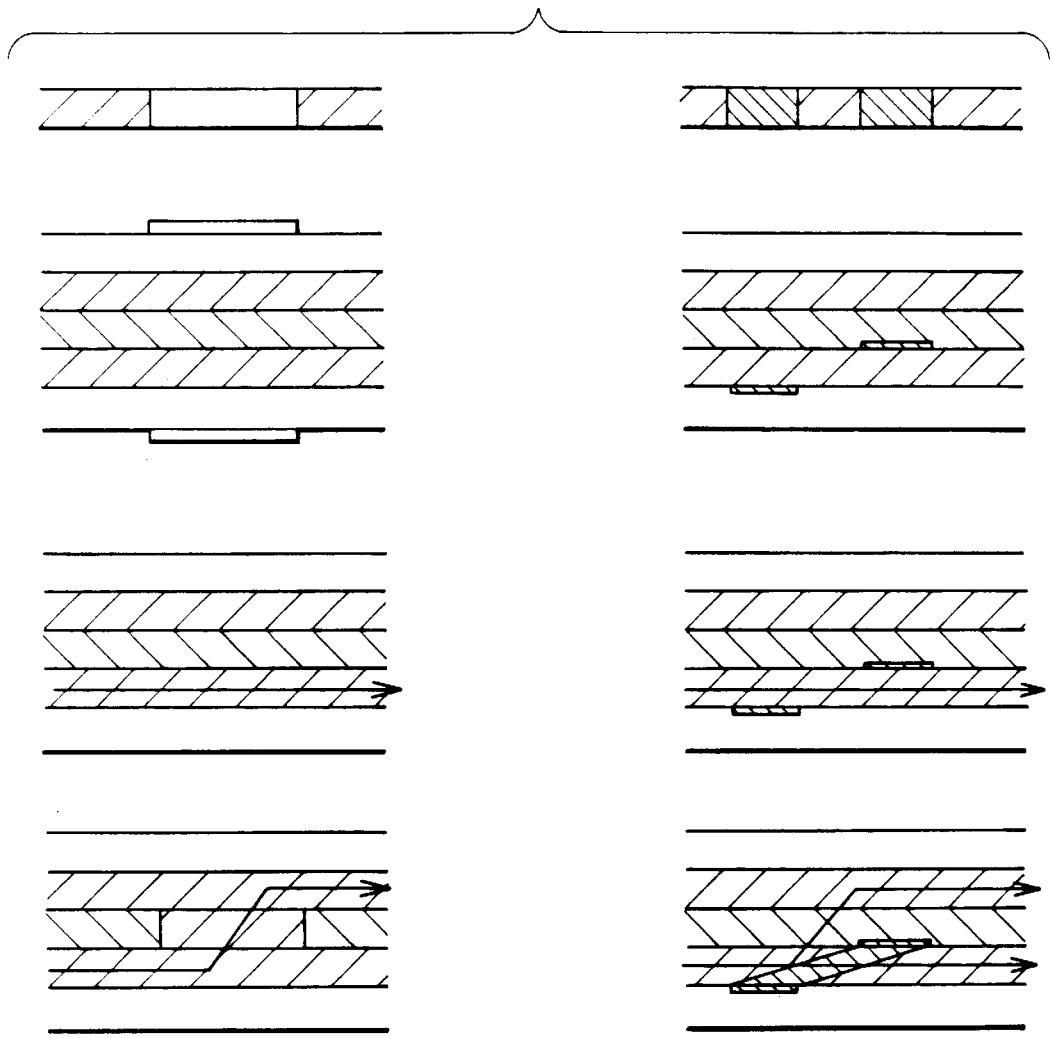
FIG. 58 is a view showing an example of longitudinal superposition of waveguides.

FIG. 58 shows the case of waveguides superposed longitudinally. The principle is similar to the examples up to here. If the positions of the electrodes are shifted as shown in the figure to sandwich the waveguides, then changes occur in the index of refraction at a slant, the light is reflected, and switching between waveguides becomes possible.

Figure 59:
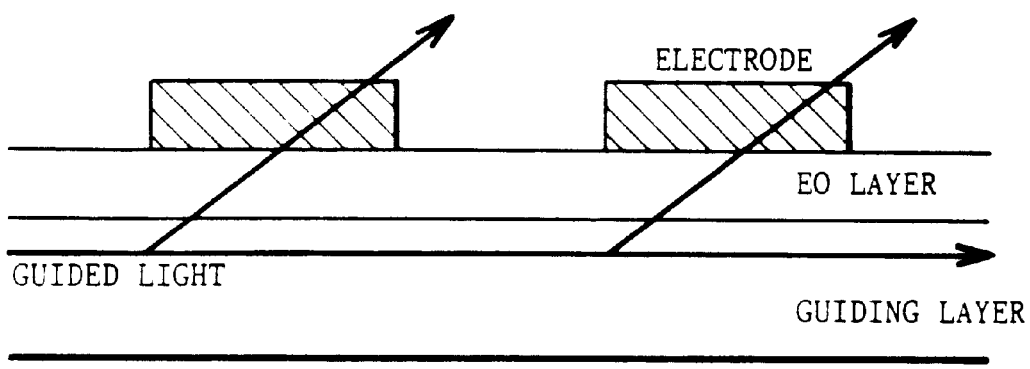
FIG. 59 is a view showing an example of an optical circuit where light is made to pass out to the space by using a nonlinear optical material for the cladding.
Figure 60:
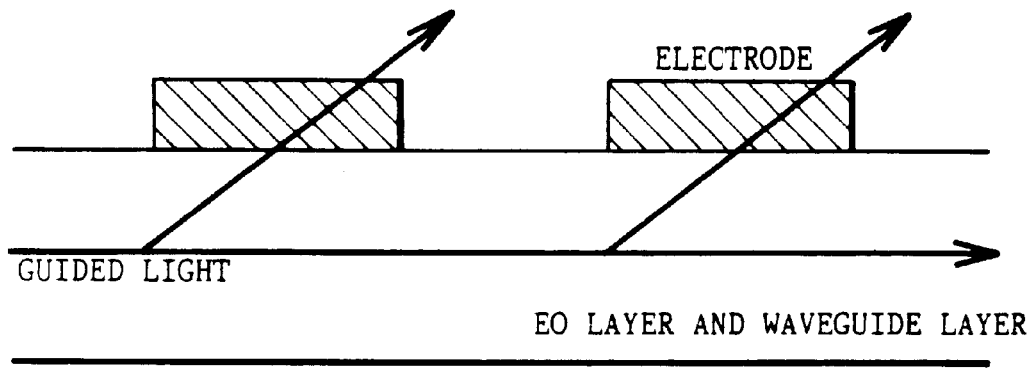
FIG. 60 is a view showing an example of an optical circuit where light is made to jump through space by using a nonlinear optical material for the waveguide itself.
Figure 61:
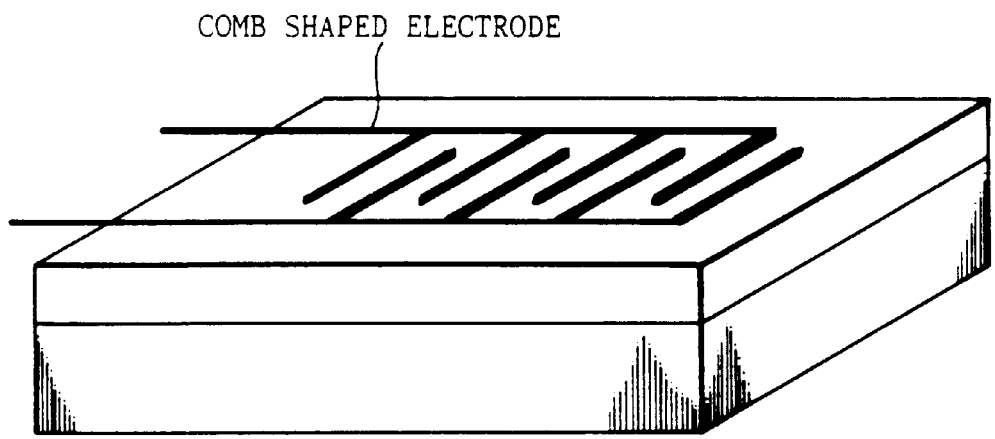
FIG. 61 is a view showing an example of formation of a grating using a comb-like electrode.
Figure 62:
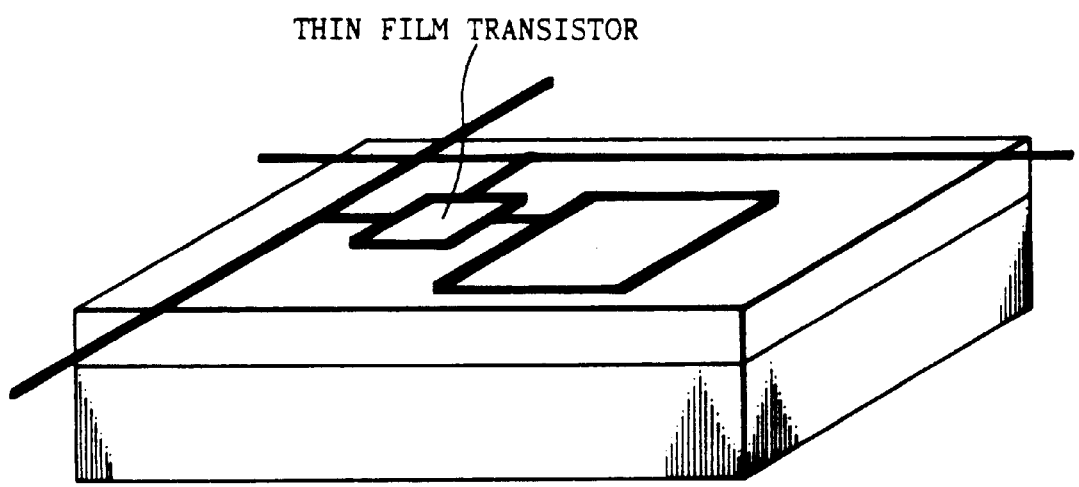
FIG. 62 is a view showing an example of driving an optical switch using a thin film transistor (TFT).
Figure 63:
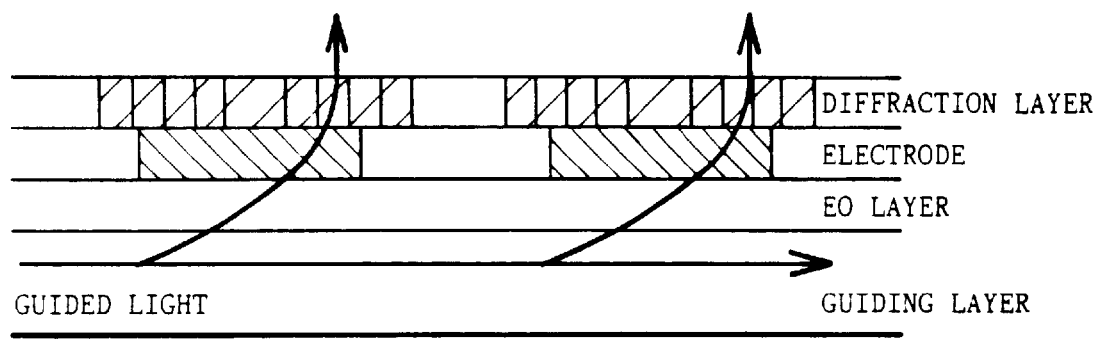
FIG. 63 and FIG. 64 are views showing examples of control of the beam collection and emission direction by provision of a layer with a nonuniform index of refraction.
Figure 64:
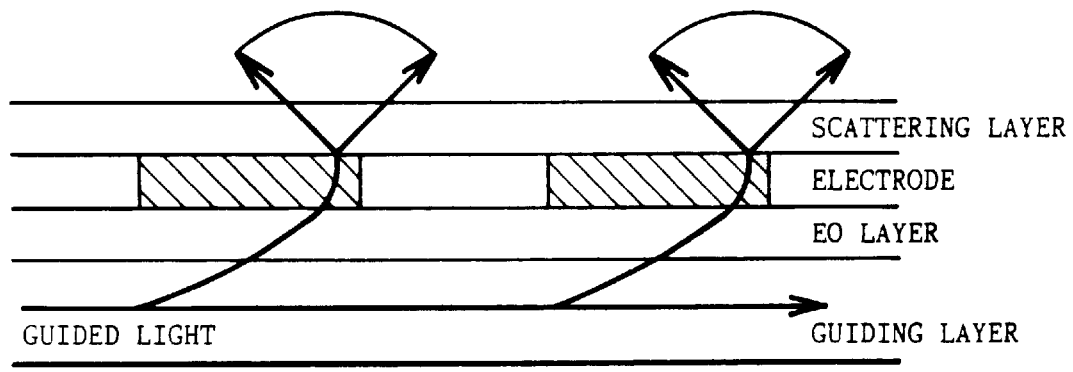

FIG. 59 is an example of using a nonlinear optical material for the cladding, providing a window by application of an electrical field, and therefore causing the light to jump to space. The principle is similar to that of FIG. 57(a). As shown in FIG. 60, it is possible to cause the light to jump to space even if giving a nonlinear optical characteristic to the waveguide itself. In this case, it is effect to form a grating by a comblike electrode as shown in FIG. 61. Further, in the same way as in FIG. 57(b), it is possible to switch to space by shifting the electrodes in position etc. and forming a distribution of the index of refraction at a slant in the waveguide layer. FIG. 62 is an example of driving such optical switches by thin film transistors (TFT's) formed monolithically. amorphous silicon TFT's are easily formed. If Poly-Si is used, the switching speed becomes faster. By providing a layer with a nonuniform index of refraction as shown in FIG. 63, it is possible to control the beam collection and emission direction. More specifically, there are holograms (HOE) and flat lenses etc. If provision is made of a scattering layer as shown in FIG. 64, the emitted light propagates at a wide angle.

Figure 65:
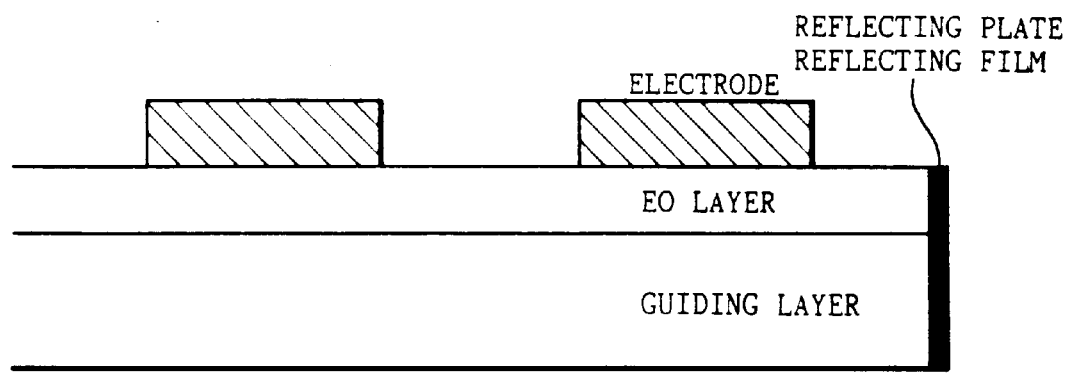
FIG. 65 and FIG. 66 are views showing an example of giving a reflection function to the end surface or its periphery.
Figure 66:
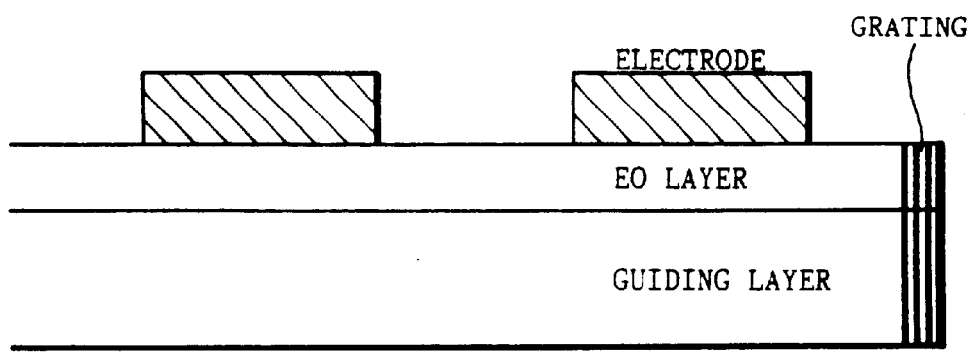

As shown in FIG. 65 and FIG. 66, by giving a reflection function to the end surfaces or the area near the end surfaces, it is possible to raise the efficiency of utilization of the light. Further, by providing thin film transistors at the electrodes, the degree of freedom of the electrical control of the switches is increased.

In the above embodiment, the case of electrical control was shown, but it is also possible to control the switching by light by using the optical Kerr effect. As materials exhibiting an optical Kerr effect, mention may be made of conjugated polymers and dye-doped polymers. Further, use may be made of semiconductor doped glass or compound semiconductor with multiple quantum wells structures.

According to the present invention, it is possible to provide an optical switch which is resistant to the effects of fluctuations in dimensions and temperature, which can operate with a multimode waveguide, which has little crosstalk, and which enables switching to space.

INDUSTRIAL APPLICABILITY

As explained above, according to the present invention, in an optical circuit comprised primarily of an optical waveguide, it is possible to directly fetch light from the light source by a plurality of electrical elements and the plurality of electrical elements can generate signal light with little variation in the intensity. Further, in an optical circuit comprised primarily of an optical waveguide, it is possible to realize an electronic optical circuit which is rich in flexibility and can handle complicated optical interconnections and it is possible to form an excellent waveguide optical amplifier or waveguide laser, which are useful for optical communications and optical interconnection.

In accordance with the present invention, further, there are provided optical connections inside an LSI and between LSI's and connection between circuit substrates not requiring a large number of light emitting elements and fine coupling between these and the transmission path by incorporation of electro-optic elements, light receiving elements, waveguides, and the like monolithically in an LSI and there is provided a system for the transmission of uniform optical signals by adjustment of the amount of the light supplied in accordance with the number of fanouts.

LIST OF REFERENCES IN DRAWINGS

1 . . . substrate
2 . . . clad layer
3, 4 . . . reflecting films
5, 6 . . . light sources
7, 8 . . . light
9 . . . optical branching filter
10 . . . clad layer
11 . . . waveguide
12, 13 . . . clad layer
14 . . . electrode
15 . . . IC
16 . . . light sensor
17 . . . IC
18 . . . high index of refraction clad portion
19 . . . electro-optic material waveguide
20 . . . light
21 . . . electrode
22 . . . electro-optic material waveguide
23 . . . low index of refraction region
24 . . . high index of refraction region
25 . . . pump light
26 . . . signal light
27 . . . cyclic structure electrode
28 . . . electro-optic material
29 . . . laser light
30 . . . light source (laser waveguide)
31 . . . light waveguide (signal transmission)
32, 33 . . . waveguides
34 . . . channel waveguide
35 . . . optical branching filter
37, 38 . . . light
39 . . . light source
40, 41 . . . light coupler
42 . . . light amplification waveguide
43 . . . diffraction grating
44, 45 . . . light
46 . . . multiplex diffraction grating
47 . . . reflection diffraction grating
48 . . . reflecting film
49 . . . waveguide
50 . . . optical amplification element
51 . . . light source
52 . . . substrate
54 . . . light power source (waveguide or waveguide laser)
56 . . . EO polymer
58 . . . signal transmission waveguide
60 . . . light reflecting portion
62 . . . light receiving element

What is claimed is:

1. An optical circuit, comprising:
    an optical waveguide producing a light I carrying signals and information and having a wavelength;
    a light source A generating a light II having a shorter wavelength than the wavelength of the light I and projecting the light II in the waveguide;
    a light source B which is provided in said waveguide and comprising two ends of said waveguide provided with opposing reflecting films, mirrors, or diffraction gratings and generating the light I by the light II; and
    at least one optical switch or optical branching filter for switching or branching to another optical waveguide the light I generated by the light source B responsive to an electrical signal, said optical switch or optical branch filter comprising a material having an electro-optic effect.

2. An optical circuit according to claim 1, wherein the light source B comprises a high index of refraction region and a low index of refraction region contacting each other, the opposing reflecting films, mirrors, or diffraction gratings at two ends of the high index of refraction region, and the light I is coupled or irradiated at the low index of refraction region.

3. An optical circuit according to claim 1, wherein the optical switch or optical branching filter comprises a material having an electro-optic energy and which undergoes a change in the index of refraction upon application of a voltage, and switches or branches part of the light I of the light source B.

4. An optical circuit according to claim 1, wherein the material having the electro-optic effect is an electro-optic polymer.

5. An optical circuit according to claim 1, wherein the optical switch or optical branching filter further comprises a material having electrodes and oscillating with a cyclic pattern and having an electro-optic effect and forming a cyclic pattern of modulation of the index of refraction responsive to application of a voltage to the electrodes and the optical switch or optical branching filter switches or branches part of the light I of the light source B.

6. An optical circuit according to claim 1, wherein the light source A is disposed on a same substrate as the light source B and the light II provided by the light source A is coupled to or irradiated at the light source B using as a medium an optical waveguide, optical fiber, or space.

7. An optical circuit according to claim 1, wherein the light source A is disposed on a different substrate than the light source B and the light II provided by the light source A is coupled to or irradiated at the light source B using as a medium an optical waveguide, optical fiber, or space.

8. Parallel optical transmitters, which parallel optical transmitters transmit optical signals by connecting the output electrodes of the transmitted electrical signals to electro-optic optical switch and modulator arrays, driving the electro-optic optical switches or optical modulators by the voltage of the electrodes, and pick up at least part of the light of a light power source, said electro-optic optical switch or optical modulator comprising a material having an electro-optic effect.

9. An optical circuit, comprising:
    a light source producing excitation light;
    a light generating waveguide excited by the excitation light from said light source to produce waveguide light; and an optical element refracting the waveguide light from said light generating waveguide responsive to an electrical information signal to produce information carrying light, wherein one of the light source, the light generating waveguide and the optical element comprises a material having an electro-optic effect.

10. An optical circuit, comprising:

a light source producing excitation light;

a light generating waveguide excited by the excitation light from said light source to produce waveguide light;

an optical element refracting the waveguide light from said light generating waveguide responsive to an electrical information signal to produce an information carrying light;

a transmission waveguide transmitting the information carrying light; and an optical sensor converting the information carrying light into a destination electrical signal including the information of the information signal, wherein one of the light source, the light generating waveguide, the optical element, the transmission waveguide and the optical sensor comprises a material having an electro-optic effect.

11. An optical circuit, comprising:

a source of light excited by excitation light;

an optical element refracting the light generated by said generating means and responsive to an electrical signal, thus producing information carrying light; and an optical switch or modulator formed in the optical circuit and refractively releasing at least part of the information carrying light, wherein one of the source of light, the optical element and the optical switch or modulator comprises a material having an electro-optic effect.

12. An apparatus comprising:

a light generating waveguide excited by excitation light from a light source to produce waveguide light; and a first optical element refracting the waveguide light from said light generating waveguide responsive to an electrical information signal to produce information carrying light such that a second optical element converts the information carrying light to a destination electrical signal, wherein one of said light generating waveguide, said light source, said first optical element, and said second optical element comprises a material having an electro-optic effect.

13. An apparatus comprising:

a first optical element refracting light generated by a light source and responsive to an electrical signal to produce information carrying light; and a second optical element converting the information carrying light to a destination electrical signal, wherein one of said first optical element, second optical element, and said light source comprises a material having an electro-optic effect.

14. An apparatus comprising:

a first optical means refracting light generated by a generating means and responsive to an electrical signal to produce information carrying light; and a second optical means converting the information carrying light to a destination electrical signal, wherein one of said first optical means, second optical means, and said generating means comprises a material having an electro-optic effect.

* * * * *